(12) United States Patent
Komura et al.

(10) Patent No.: US 7,901,967 B2
(45) Date of Patent: Mar. 8, 2011

(54) DICING METHOD FOR SEMICONDUCTOR SUBSTRATE

(75) Inventors: Atsushi Komura, Kariya (JP); Muneo Tamura, Nagoya (JP); Kazuhiko Sugiura, Nagoya (JP); Hirotsugu Funato, Nagoya (JP); Yumi Maruyama, Kariya (JP); Tetsuo Fujii, Toyohashi (JP); Kenji Kohno, Gifu (JP)

(73) Assignee: DENSO CORPORATION, Kariya (JP)

( * ) Notice: Subject to any disclaimer, the term of this patent is extended or adjusted under 35 U.S.C. 154(b) by 940 days.

(21) Appl. No.: 11/600,136

(22) Filed: Nov. 16, 2006

(65) Prior Publication Data
US 2007/0111478 A1 May 17, 2007

(30) Foreign Application Priority Data

| | | |
|---|---|---|
| Nov. 16, 2005 | (JP) | 2005-331206 |
| Nov. 16, 2005 | (JP) | 2005-331219 |
| Nov. 16, 2005 | (JP) | 2005-331221 |
| Aug. 22, 2006 | (JP) | 2006-225394 |
| Aug. 22, 2006 | (JP) | 2006-225395 |
| Oct. 3, 2006 | (JP) | 2006-271748 |

(51) Int. Cl.
*H01L 21/00* (2006.01)
(52) U.S. Cl. ............ 438/33; 438/68; 438/113; 438/114; 438/458
(58) Field of Classification Search .................. 438/33, 438/68, 113, 114, 458, 460, FOR. 386
See application file for complete search history.

(56) References Cited

U.S. PATENT DOCUMENTS

| 6,805,808 B2 * | 10/2004 | Fujii et al. ................ 216/52 |
|---|---|---|
| 6,992,026 B2 | 1/2006 | Fukuyo et al. |
| 7,211,526 B2 * | 5/2007 | Iri et al. ................ 438/797 |
| 7,250,354 B2 * | 7/2007 | Uchida ................ 438/460 |
| 7,566,635 B2 * | 7/2009 | Fujii et al. ................ 438/462 |
| 2003/0162367 A1 * | 8/2003 | Roche ................ 438/460 |
| 2004/0002199 A1 * | 1/2004 | Fukuyo et al. ........... 438/460 |
| 2005/0173387 A1 | 8/2005 | Fukuyo et al. |
| 2005/0181581 A1 | 8/2005 | Fukuyo et al. |
| 2005/0184037 A1 | 8/2005 | Fukuyo et al. |
| 2005/0189330 A1 | 9/2005 | Fukuyo et al. |
| 2005/0194364 A1 | 9/2005 | Fukuyo et al. |

(Continued)

FOREIGN PATENT DOCUMENTS

CN 1655327 8/2005

(Continued)

OTHER PUBLICATIONS

Notice of Preliminary Rejection and a citation issued Sep. 17, 2007 in corresponding Korean patent application No. 10-2006-0111317 (and English translation).

(Continued)

*Primary Examiner* — Matthew C Landau
*Assistant Examiner* — James M Mitchell
(74) *Attorney, Agent, or Firm* — Posz Law Group, PLC

(57) ABSTRACT

A method for dicing a semiconductor substrate includes: forming a reforming layer in the substrate by irradiating a laser beam on the substrate; forming a groove on the substrate along with a cutting line; and applying a force to the substrate in order to cutting the substrate at the reforming layer as a starting point of cutting. The groove has a predetermined depth so that the groove is disposed near the reforming layer, and the force provides a stress at the groove.

21 Claims, 33 Drawing Sheets

U.S. PATENT DOCUMENTS

| | | |
|---|---|---|
| 2005/0199592 A1 | 9/2005 | Iri et al. |
| 2005/0202596 A1 | 9/2005 | Fukuyo et al. |
| 2006/0011593 A1 | 1/2006 | Fukuyo et al. |
| 2006/0040472 A1* | 2/2006 | Tamura et al. ............ 438/460 |
| 2006/0040473 A1 | 2/2006 | Fukuyo et al. |
| 2006/0160331 A1 | 7/2006 | Fukuyo et al. |

FOREIGN PATENT DOCUMENTS

| | | |
|---|---|---|
| EP | 1 742 253 A1 | 1/2007 |
| JP | A-4-118190 | 4/1992 |
| JP | A-H08-276398 | 10/1996 |
| JP | A-2001-127008 | 5/2001 |
| JP | A-2004-039931 | 2/2004 |
| JP | A-2004-351477 | 12/2004 |
| JP | A-2005-109432 | 4/2005 |

OTHER PUBLICATIONS

Office Action dated Feb. 13, 2008 in corresponding German Patent Application No. 10 2006 053 597.9-43 (and English translation).

Office Action Jun. 2, 2008 in corresponding Korean Patent Application No. 10-2006-0111317 (and English Translation).

Office Action dated Jul. 4, 2008, in corresponding Chinese patent application No. 200610160324.7 (and English Translation).

Office Action dated Sep. 23, 2008 in corresponding Korean patent application No. 10-2008-0063094 (and English translation).

Office Action dated Sep. 23, 2008 in corresponding Korean patent application No. 10-2008-0063082 (and English translation).

Office action dated Feb. 27, 2009 in corresponding Chinese patent application No. 200610160324.7 (and English translation).

Office Action dated April 23, 2009 from Korean Patent Office in corresponding KR Patent Application No. 10-2008-0063094 (and English Translation).

Office Action dated Jun. 22, 2010 from German Patent Office in corresponding DE Patent Application No. 102006053597.9 (and English Translation).

Office Action dated Dec. 21, 2010 from Japan Patent Office in corresponding JP Patent Application No. 2006-225394 (and English Translation).

\* cited by examiner

TENSILE FORCE

TENSILE FORCE

FIG. 19A
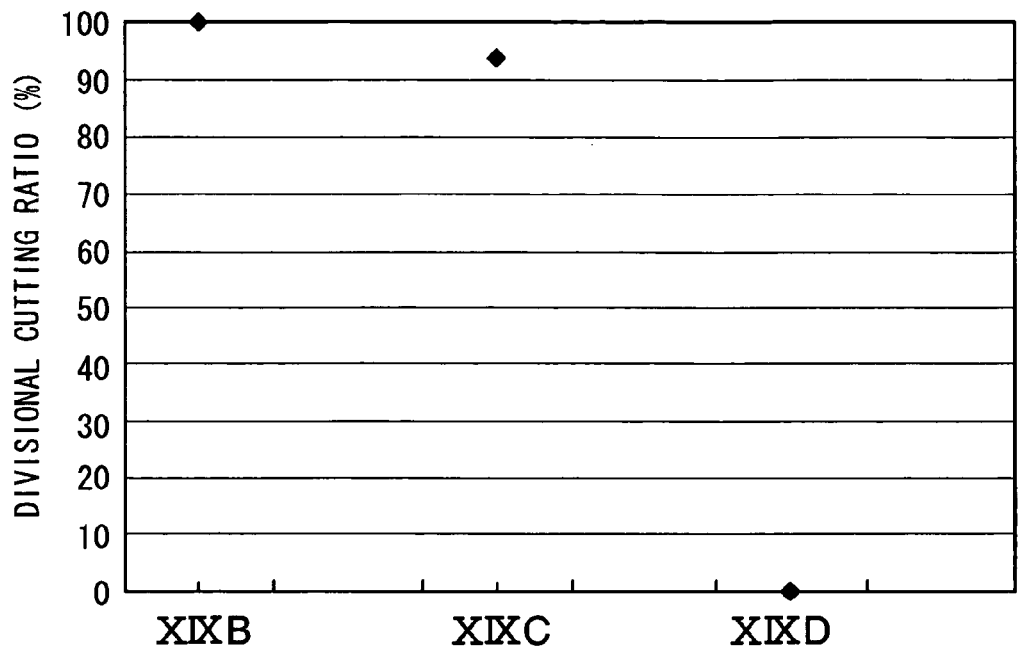
FIG. 19B     FIG. 19C     FIG. 19D
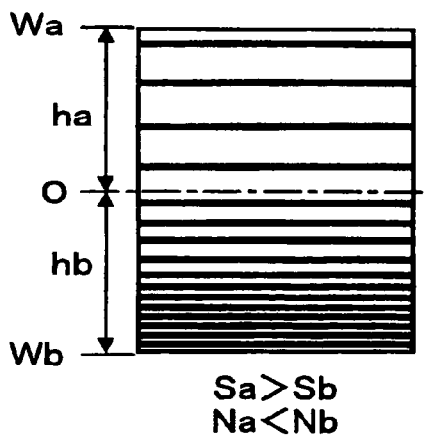
Sa>Sb
Na<Nb
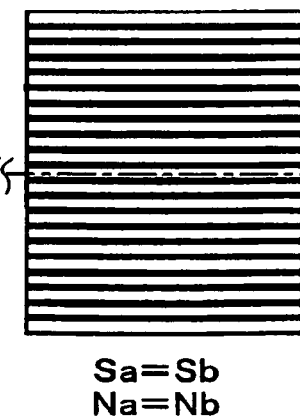
Sa=Sb
Na=Nb
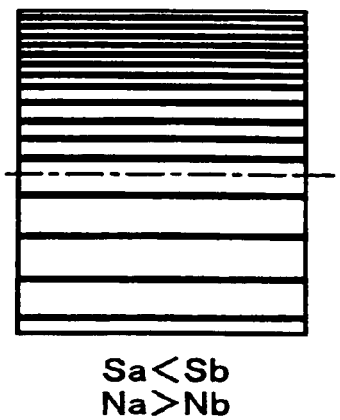
Sa<Sb
Na>Nb

FIG. 20A
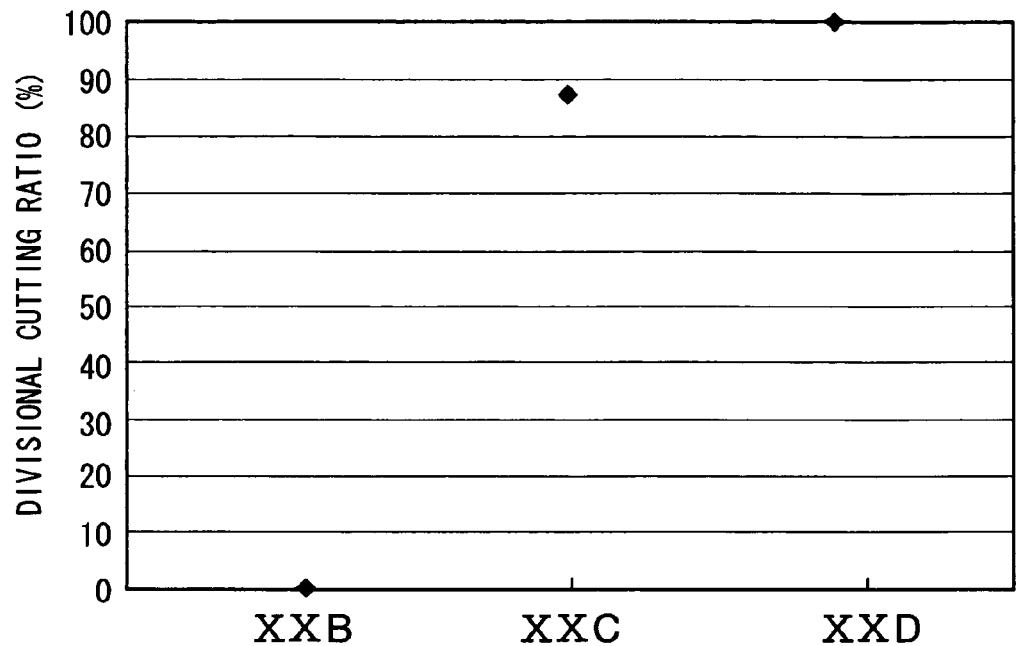
FIG. 20B    FIG. 20C    FIG. 20D
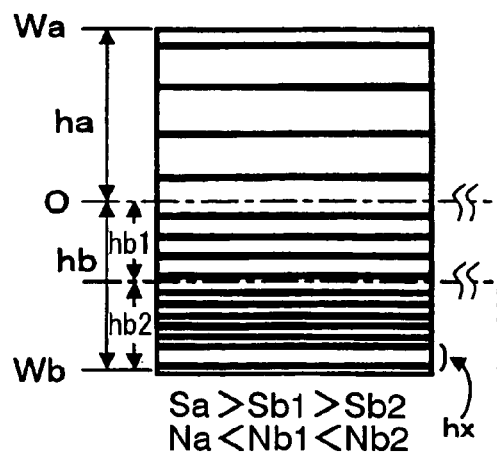
Sa>Sb1>Sb2
Na<Nb1<Nb2
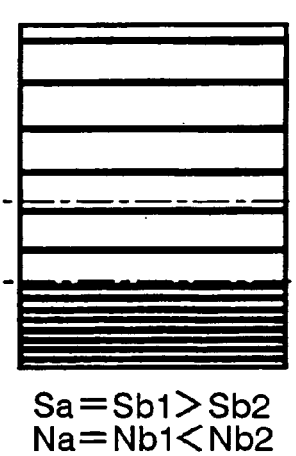
Sa=Sb1>Sb2
Na=Nb1<Nb2
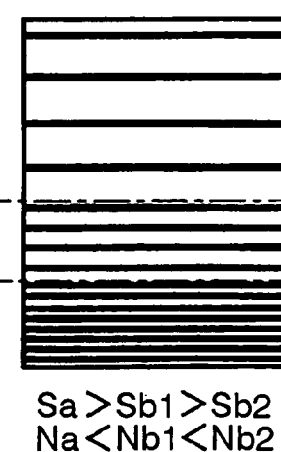
Sa>Sb1>Sb2
Na<Nb1<Nb2

PRESSURE

FLEXING FORCE

TENSILE FORCE          TENSILE FORCE

DICING METHOD FOR SEMICONDUCTOR SUBSTRATE

CROSS REFERENCE TO RELATED APPLICATIONS

This application is based on Japanese Patent Applications No. 2005-331206 filed on Nov. 16, 2005, No. 2005-331219 filed on Nov. 16, 2005, No. 2005-331221 filed on Nov. 16, 2005, No. 2006-225394 filed on Aug. 22, 2006, No. 2006-225395 filed on Aug. 22, 2006, and No. 2006-271748 filed on Oct. 3, 2006, the disclosures of which are incorporated herein by reference.

FIELD OF THE INVENTION

The present invention relates to a semiconductor device and a dicing method for a semiconductor substrate.

BACKGROUND OF THE INVENTION

In a dicing process for cutting a processing object such as a silicon wafer, etc. forming a semiconductor integrated circuit and MEMS (Micro Electro Mechanical Systems), a dicing method using a dicing blade burying diamond grinding grains is formerly adopted.

However, in the dicing method using such a blade, the following problems, etc. are caused. (1) When the processing object is cut by the blade, its cutting margin is required so that the processing object is correspondingly reduced and cost is increased. (2) Since it is necessary to prevent that water, etc. used to prevent burning, etc. due to frictional heat in the cutting are attached to the processing object, a protecting device of capping, etc. is required and a maintenance process number is correspondingly increased.

Therefore, in recent years, consideration and research of a dicing method using a laser are advanced. For example, as shown in FIGS. 16A to 16C, a technique for processing a semiconductor wafer (silicon wafer) (hereinafter called "wafer" W as the processing object by the laser is known.

Here, a summary of the laser dicing method shown in FIGS. 16A to 16C will be briefly explained. As shown in FIG. 16A, in the dicing method using the laser, a laser beam L (laser pulse of femto second) emitted from an unillustrated laser light source is first converged by a condenser lens CV, and is irradiated to a part (e.g., divisional cutting schedule line or dicing line) DL to be divisionally cut in the wafer W as the processing object. Thus, the laser beam L incident from a surface Wa of the divisional cutting part DL is refracted at an interface of the air and the wafer W and forms a convergent point (i.e., focus point) P within the wafer W. Accordingly, a photon concentrated at this convergent point P simultaneously has an interaction with respect to an electron within the wafer W, and is absorbed so that a phenomenon called "multiphoton absorption" is caused. Thus, optical damage is generated at this convergent point P and its vicinity. Therefore, thermal distortion is induced and a crack is caused in its portion. Such a crack due to thermal distortion is not limited to multiphoton absorption, but might be also caused by normal photon absorption (one photon absorption) generating optical damage by absorbing one photon. Thus, since a gathering range of cracks can be formed around the convergent point P, this range is generally called "a reforming area", or "a reforming layer". In this specification, the gathering of "reforming layers" is called "a reforming area".

A reforming layer K extending in a line stripe is formed by irradiating such a laser beam L along the divisional cutting part DL (reforming process). Accordingly, as shown in FIG. 16B, plural reforming layers K can be formed in an overlapping layer shape by changing the distance of the convergent point P of the laser beam L. The gathering of the reforming layers K formed in this way becomes a reforming area KK as a gathering range of cracks. Accordingly, as shown in FIG. 16c, divisional cutting can be performed with this reforming area KK as a boundary by pulling the wafer W on both sides with the reforming area KK as a center. Thus, the wafer W can be divided into two wafer pieces, i.e., semiconductor chips (hereinafter, simply called "chips") CP.

An expand tape T called "a di-attach film (DAF)" is stuck to a rear face Wb of the wafer W. Accordingly, even when the wafer W is divided into chips CP, each chip CP is stuck and held in the expand tape T. Thus, it is prevented that the divided chip CP is separated and scattered. For example, the laser dicing method shown in FIGS. 16A to 16C is also disclosed as "a laser dicing method" in JP-A-2005-1001.

However, in accordance with such a laser dicing method, as shown in FIGS. 16A and 16B, the reforming layer K is formed within the wafer W, but no reforming layer K is formed in a layer (the ranges of cross hatching between arrows shown in FIGS. 16B and 16C and called "surface layers") Ws of a surface (rear face) including the surface Wa (or rear face Wb) of the wafer W. Therefore, no stable divisional cutting can be always expected as long as the divisional cutting is performed with the reforming layer K as a starting point as shown in FIGS. 16B and 16C. Therefore, a crack might be caused in the surface layer Ws forming no reforming layer K therein in an unscheduled direction. In particular, when the thickness of the wafer is 500 μm or more, it is difficult to focus the convergent point P from characteristics of the condenser lens CV, etc. in the vicinity (surface layer Ws of the rear face Wb) of the rear face Wb in which the laser beam L incident from the surface Wa of the wafer W is deeply advanced and reaches this vicinity. Therefore, a range for forming no reforming layer K is easily formed in the surface layer Ws of the rear face Wb.

Further, when the wafer thickness is thickened, cases for laminating and forming semiconductor materials of different material qualities are increased as in SOI (Silicon On Insulator). Therefore, in the case of such a multi-layered wafer W, refractive indexes with respect to the laser beam L are different in accordance with the thickness and the material quality every layer from the differences of optical characteristics of semiconductors. Therefore, reflection and scattering of the laser beam are easily generated on the boundary faces, etc. of semiconductor layers of different refractive indexes. Accordingly, it is difficult to conform a focal point to scheduled depth and position by complicated refraction of the laser beam passing these semiconductor layers. In particular, influences of reflection and scattering are easily exerted as it is distant from the surface Wa onto which the laser beam L is incident. Therefore, in the multi-layered wafer W, the range for forming no reforming layer K is easily formed in the surface layer Ws of the rear face Wb.

Thus, there is a possibility that growth of a crack is developed in an unscheduled direction in the range for forming no reforming layer K in comparison with a range for forming the reforming layer K. Therefore, when the range for forming no reforming layer K exists in the divisional cutting part DL, a problem exists in that a quality reduction of the chip CP divided by such an unscheduled crack is caused.

Further, in accordance with such a laser dicing method, as shown in FIGS. 25A to 25C, a reforming layer K formed within a wafer W is approximately set at an equal interval in the thickness direction of a divisional cutting part Dev corresponding to the chip Cp. Therefore, when a sufficient number of reforming layers K are not formed with respect to the thickness of the divisional cutting part Dev, crack density within a reforming area KK becomes low. Accordingly, no proper divisional cutting can be performed, and a quality reduction of a divided wafer piece Cp (semiconductor chip) might be caused.

Further, in "a laser processing method" disclosed in JP-A-2005-1001, when plural cutting starting point areas (reforming layers) are formed, a forming position of a substrate (wafer), etc. with respect to its thickness are prescribed. However, in accordance with this prescribing example, the width of the formed cutting starting point area is half the substrate thickness or less. Therefore, it is difficult to be able to perform proper divisional cutting in comparison with a case in which the reforming layers are approximately formed at the equal interval in the thickness direction of the divisional cutting part Dev. In particular, when the wafer thickness is 500 μm or more, the inventors of this application have experimentally confirmed that it is difficult to obtain stable divisional cutting quality even when such a prescribing example is applied.

In contrast to this, the proper divisional cutting can be performed if the laser beam L is irradiated so as to widely secure the reforming area KK as much as possible by forming the reforming layer K in the thickness direction of the divisional cutting part Dev as much as possible. However, time and electric power required to irradiate the laser beam L are excessively supplied. Therefore, an increase in manufacture cost is caused, and load with respect to laser equipment is increased. Therefore, it tends to become causes of shortening of an exchanging period of consumed parts and breakdown generation.

Further, a manufacturing method of the semiconductor chip for dividing the semiconductor substrate processed on a divisional schedule line and adhered to a sheet into semiconductor chips by extending and enlarging this sheet, and loading stress in a planar direction of the semiconductor substrate is formerly used in manufacture of the semiconductor chip.

As a processing method of the divisional schedule line, consideration and research of a processing method (laser dicing) using a laser beam are advanced in recent years. For example, a processing technique of the semiconductor substrate using a laser is disclosed in JP-A-2002-205180. FIGS. 35A and 35B are explanatory views showing a dicing process using the laser beam. FIG. 35A is an explanatory view of a reforming area forming process using irradiation of the laser beam. FIG. 35B is an explanatory view of a dividing process of the semiconductor substrate.

A semiconductor substrate W constructed by a semiconductor of silicon, etc. and forming a semiconductor element D on a substrate face is prepared as shown in FIG. 35A. The rear face of the substrate face is then adhered to the sheet T manufactured by resin and having an extending property. An adhering layer TB coated with an ultraviolet ray hardening type adhesive, etc. is formed on an entire face of the sheet T for adhering the semiconductor substrate W. The semiconductor substrate W is adhered to the adhering layer TB on its entire rear face.

A laser head H for irradiating the laser beam L has a condenser lens CV for converging the laser beam L, and converges the laser beam L at a predetermined focal distance. In the reforming area forming process, the laser head H is moved (in the direction of this side in FIG. 35A) along the divisional schedule line DL for dividing the semiconductor substrate W in a laser beam irradiating condition set such that a convergent point P of the laser beam L is formed in a position of depth d from the surface of the semiconductor substrate W. The laser beam L is then irradiated from the surface of the semiconductor substrate W. Thus, a reforming area K using multiphoton absorption is formed in a path of depth d in which the convergent point P of the laser beam L is scanned.

The reforming area K is formed in plural positions of a predetermined depth within a range of the thickness of the semiconductor substrate W by adjusting the depth d of the convergent point P along the divisional schedule line DL, and moving the convergent point P in the thickness direction of the semiconductor substrate W.

Here, the multiphoton absorption is that a substance absorbs plural photons of the same kind or different kinds. The phenomenon of optical damage is generated by this multiphoton absorption at the convergent point P of the semiconductor substrate W and its vicinity. Thus, thermal distortion is induced, and a crack is generated in its portion. Thus, a layer formed by gathering this crack, i.e., the reforming area K is formed.

Subsequently, as shown in FIG. 35B, the crack is developed in the substrate thickness direction with the reforming area K as a starting point by loading stress in an in-plane direction of the semiconductor substrate W (directions shown by arrows F1, F2 in this figure). The semiconductor substrate W is then divided along the divisional schedule line DL, and a semiconductor chip Cp is obtained.

However, the following problems are caused in the former method when a thick semiconductor substrate is divided.

Namely, as the depth d of the convergent point P becomes large, intensity of the laser beam converged at the convergent point P is attenuated. Therefore, a spread from the convergent point P of the formed reforming area K becomes small. In other words, the size of an area for forming the reforming area K becomes small. The reforming area K formed near the rear face of the semiconductor substrate W becomes a starting point of the division. Therefore, when no reforming area K of a sufficient size is formed in this position, large force is required to perform the division. Therefore, there is a case in which no crack can be developed from the reforming area K. Accordingly, a problem exists in that it becomes a cause of divisional leaving of the semiconductor substrate W, and yield of the semiconductor chip is reduced.

SUMMARY OF THE INVENTION

In view of the above-described problem, it is an object of the present disclosure to provide a fuel injection nozzle.

According to a first aspect of the present disclosure, a method for dicing a semiconductor substrate includes: forming a reforming layer in the substrate by irradiating a laser beam on the substrate; forming a groove on the substrate along with a cutting line and applying a force to the substrate in order to cutting the substrate at the reforming layer as a starting point of cutting. The groove has a predetermined depth so that the groove is disposed near the reforming layer, and the force provides a stress at the groove.

The above method includes a process for forming a groove able to concentrate stress due to external force in a part to be divisionally cut until the groove is disposed near a reforming layer. On the other hand, when external force is applied in the divisional cutting, stress concentrated on the groove is directly applied to the reforming layer near the groove. Accordingly, growth of a crack with the reforming layer as a starting point can be promoted. Therefore, stable divisional cutting can be performed, and the quality reduction of a divided wafer piece can be prevented.

According to a second aspect of the present disclosure, a semiconductor device includes: a semiconductor substrate capable of being cut into a plurality of chips; a reforming layer disposed in the substrate, wherein the reforming layer is a starting point of cutting; and a groove disposed on the substrate along with a cutting line. The groove is disposed near the reforming layer so that a stress is concentrated at the groove when the substrate is cut.

In the above device, a groove near the reforming layer and able to concentrate stress due to external force applied in the divisional cutting is arranged in a part to be separated by the divisional cutting. On the other hand, when external force is applied to the semiconductor wafer in the divisional cutting, stress concentrated on the groove is directly applied to the reforming layer near the groove. Accordingly, growth of a crack with the reforming layer as a starting point can be promoted. Therefore, stable divisional cutting can be performed, and the quality reduction of a separated semiconductor device can be prevented.

According to a third aspect of the present disclosure, a method for cutting an object includes: irradiating a laser beam on the object in order to form a plurality of reforming layers in the object along with a cutting line by multi-photon absorption effect, wherein the reforming layers are formed in a multi-layered structure manner in a thickness direction of the object; and applying a force on a first side of the object in order to cut the object from the reforming layers as a starting point of cutting. The reforming layers are disposed in a first reforming region and a second reforming region. The first reforming region is disposed in the first side of the object, and the second reforming region is disposed in a second side of the object. The reforming layers in the first reforming region have a first distance between two neighboring reforming layers, and the reforming layers in the second reforming region have a second distance between two neighboring reforming layers. The first distance of the first reforming region is smaller than the second distance of the second reforming region.

In the above method, with respect to the interval of a reforming layer formed in the thickness direction of a part scheduled to be divisionally cut, the interval of a pressurizing side reforming layer located in the range of a pressurized side is set to be narrower than the interval of a non-pressurizing side reforming layer located in a range of the side opposed to this pressurized side. Thus, with respect to the part scheduled to be divisionally cut, the reforming layer is concentratedly formed in the range of a side close to a pressurized surface. Accordingly, it is possible to raise the density of a crack formed by reformation in a portion most easily influenced by pressurizing force. In contrast to this, the reforming layer [ka, etc.] is formed in the range of the side opposed to the pressurized side, i.e., the side distant on the pressurized surface even in the part scheduled to be divisionally cut. However, divisional cutting can be performed without excessively raising the density of the crack by a chain of divisional breaking in which the range of the side close to the pressurized surface is set to a starting point. Accordingly, in comparison with a case for forming the reforming layer in the thickness direction of the part scheduled to be divisionally cut as much as possible, proper divisional cutting can be performed while the number of reforming layers is reduced (a forming range of the reforming layer is reduced).

According to a fourth aspect of the present disclosure, a method for cutting an object includes: irradiating a laser beam on the object in order to form a plurality of reforming layers in the object along with a cutting line by multi-photon absorption effect, wherein the reforming layers are formed in a multi-layered structure manner in a thickness direction of the object; and applying a force on a first side of the object in order to cut the object from the reforming layers as a starting point of cutting. The reforming layers are disposed in a first reforming region and a second reforming region. The first reforming region is disposed in the first side of the object, and the second reforming region is disposed in a second side of the object. The first reforming region includes a first number of the reforming layers, and the second reforming region includes a second number of the reforming layers, and the first number is larger than the second number.

In the above method, with respect to the number of reforming layers formed in the thickness direction of the part, the number of pressurizing side reforming layers located on the pressurized side is set to be larger than the number of non-pressurizing side reforming layers located on the side opposed to this pressurized side. Thus, with respect to the part scheduled to be divisionally cut, the reforming layer is concentratedly formed in the range of a side close to a pressurized surface. Accordingly, it is possible to raise the density of a crack formed by reformation in a portion most easily influenced by pressurizing force. In contrast to this, the reforming layer [ka, etc.] is formed in the range of the side opposed to the pressurized side, i.e., the side distant on the pressurized surface even in the part scheduled to be divisionally cut. However, divisional cutting can be performed without excessively raising the density of the crack by a chain of divisional breaking in which the range of the side close to the pressurized surface is set to a starting point. Accordingly, in comparison with a case for forming the reforming layer in the thickness direction of the part scheduled to be divisionally cut as much as possible, proper divisional cutting can be performed while the number of reforming layers is reduced (a forming range of the reforming layer is reduced).

According to a fifth aspect of the present disclosure, a method for cutting an object includes: irradiating a laser beam on the object in order to form a plurality of reforming layers in the object along with a cutting line by multi-photon absorption effect, wherein the reforming layers are formed in a multi-layered structure manner in a thickness direction of the object; and applying a force on a first side of the object in order to cut the object from the reforming layers as a starting point of cutting. The reforming layers are disposed in a surface side reforming region and an inner side reforming region. The surface side reforming region is disposed in a surface side the object, and the inner side reforming region is disposed in an inner side of the object. The reforming layers in the surface side reforming region have a surface side distance between two neighboring reforming layers, and the reforming layers in the inner side reforming region have an inner side distance between two neighboring reforming layers, and the surface side distance of the surface side reforming region is smaller than the inner side distance (of the inner side reforming region.

In the above method, with respect to the intervals of reforming layers formed in the thickness direction of the part, the interval of a central side reforming layer located in a predetermined range from about the center in this thickness direction is set to be wider than the interval of a center exterior pressurizing side reforming layer located on the pressurized side from the predetermined range, and the interval of a center exterior non-pressurizing side reforming layer located on the side opposed to the pressurized side from the predetermined range. Thus, in comparison with the central side reforming layer located in the predetermined range of about the center in the thickness direction and lying in a low range of possibility applied by pressurizing force, it is possible to concentrate the center exterior pressurizing side reforming layer and the center exterior non-pressurizing side reforming layer located in predetermined ranges except for the predetermined range and lying in a high range (both faces of the part scheduled to be divisionally cut of possibility applied by pressurizing force. Accordingly, in comparison with a case for forming the reforming layer in the thickness direction of the part scheduled to be divisionally cut as much as possible, proper divisional cutting can be performed while the number of reforming layers is reduced (a forming range of the reforming layer is reduced). Further, the proper divisional cutting can be also performed when pressurizing force is applied in different timing from both faces (the surface and the rear face) of the part scheduled to be divisionally cut and it is impossible to set that pressurizing force is applied from any one of the faces (the surface and the rear face) of the part in the divisional cutting, etc.

According to sixth aspect of the present disclosure, a method for cutting an object includes: irradiating a laser beam on the object in order to form a plurality of reforming layers in the object along with a cutting line by multi-photon absorption effect, wherein the reforming layers are formed in a multi-layered structure manner in a thickness direction of the object; and applying a force on a first side of the object in order to cut the object from the reforming layers as a starting point of cutting. The reforming layers are disposed in a surface side reforming region and an inner side reforming region. The surface side reforming region is disposed in a surface side the object, and the inner side reforming region is disposed in an inner side of the object. The surface side reforming region has a surface side density of the reforming layers, and the inner side reforming region has an inner side density of the reforming layers, and the surface side density is larger than the inner side density.

In the above method, with respect to the number of reforming layers formed in the thickness direction of the part, the number of central side reforming layers located in the predetermined range from about the center in this thickness direction is set to be smaller than the number of center exterior pressurizing side reforming layers located on the pressurized side from the predetermined range, and the number of center exterior non-pressurizing side reforming layers located on the side opposed to the pressurized side from the predetermined range. Thus, in comparison with the central side reforming layer located in the predetermined range of about the center in the thickness direction and lying in a low range of possibility applied by pressurizing force, it is possible to concentrate the center exterior pressurizing side reforming layer and the center exterior non-pressurizing side reforming layer located in predetermined ranges except for the predetermined range and lying in a high range (both faces of the part scheduled to be divisionally cut of possibility applied by pressurizing force. Accordingly, in comparison with a case for forming the reforming layer in the thickness direction of the part scheduled to be divisionally cut as much as possible, proper divisional cutting can be performed while the number of reforming layers is reduced (a forming range of the reforming layer is reduced). Further, the proper divisional cutting can be also performed when pressurizing force is applied in different timing from both faces (the surface and the rear face) of the part scheduled to be divisionally cut and it is impossible to set that pressurizing force is applied from any one of the faces (the surface and the rear face) of the part in the divisional cutting, etc.

According to a seventh aspect of the present disclosure, a method for dicing a semiconductor substrate includes: irradiating a laser beam on the semiconductor substrate along with a cutting line in order to form a reforming area in the substrate by multi-photon absorption effect, wherein the reforming area is formed at a focus point of the laser beam in the substrate; bonding a first side of the substrate on a sheet; expanding the sheet with the substrate in order to cutting the substrate from the reforming area as a starting point of cutting; and controlling a strength of the laser beam in accordance with dimensions of the reforming area at the focus point and a depth of the focus point from a surface of the substrate.

In accordance with the above method, the intensity of a laser beam for forming a reforming area is controlled in accordance with the a spread from a convergent point of the reforming area and the position of a thickness direction for forming the reforming area of a semiconductor substrate. Therefore, the reforming area having a predetermined desirable spread suitable to reliably divide the semiconductor substrate can be formed at a predetermined depth in the thickness direction. Namely, the reforming area able to reliably develop a crack by small force can be formed. Therefore, it is possible to realize a manufacturing method of a semiconductor chip in which the semiconductor substrate can be reliably divided and yield of the semiconductor chip can be improved.

According to an eighth aspect of the present disclosure, a semiconductor chip separated from the substrate by the above method.

In the above device, when the reforming area appearing on a divisional face of the semiconductor chip is formed in a mode of the reforming area described in the above method, for example, it is possible to presume that this semiconductor chip is a semiconductor chip manufactured by the manufacturing method of the semiconductor chip when the spread from the convergent point of the reforming area is formed so as to become large as it is close to one substrate face.

BRIEF DESCRIPTION OF THE DRAWINGS

The above and other objects, features and advantages of the present invention will become more apparent from the following detailed description made with reference to the accompanying drawings. In the drawings:

FIG. 19A is a graph showing a divisional cutting ratio in different conditions, and FIGS. 19B to 19D are cross sectional views of the wafer explaining different conditions;

FIG. 20A is a graph showing a divisional cutting ratio in different conditions, and FIGS. 20B to 20D are cross sectional views of the wafer explaining different conditions;

DETAILED DESCRIPTION OF THE PREFERRED EMBODIMENTS

First Embodiment Mode

Embodiment modes for applying a laser dicing method and a semiconductor wafer to a dicing process of the semiconductor wafer will next be explained on the basis of the respective drawings.

Figure 1A:
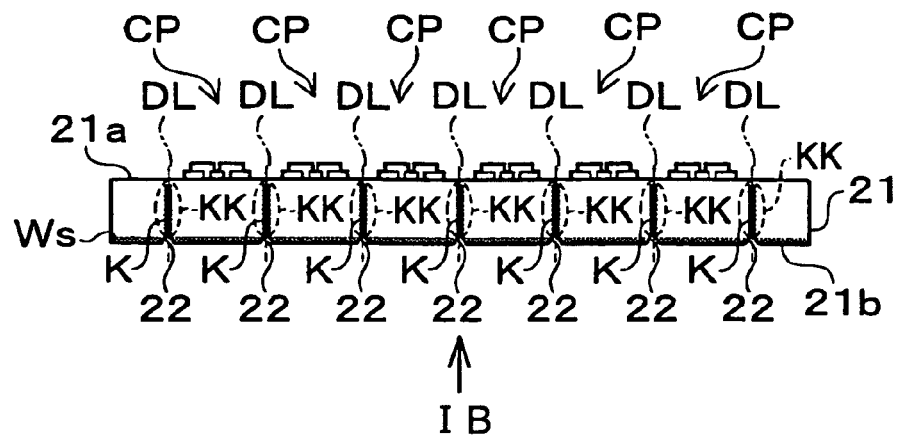
FIG. 1A is a cross sectional view showing a semiconductor wafer taken along line IA-IA in FIG. 1B.
Figure 1B:
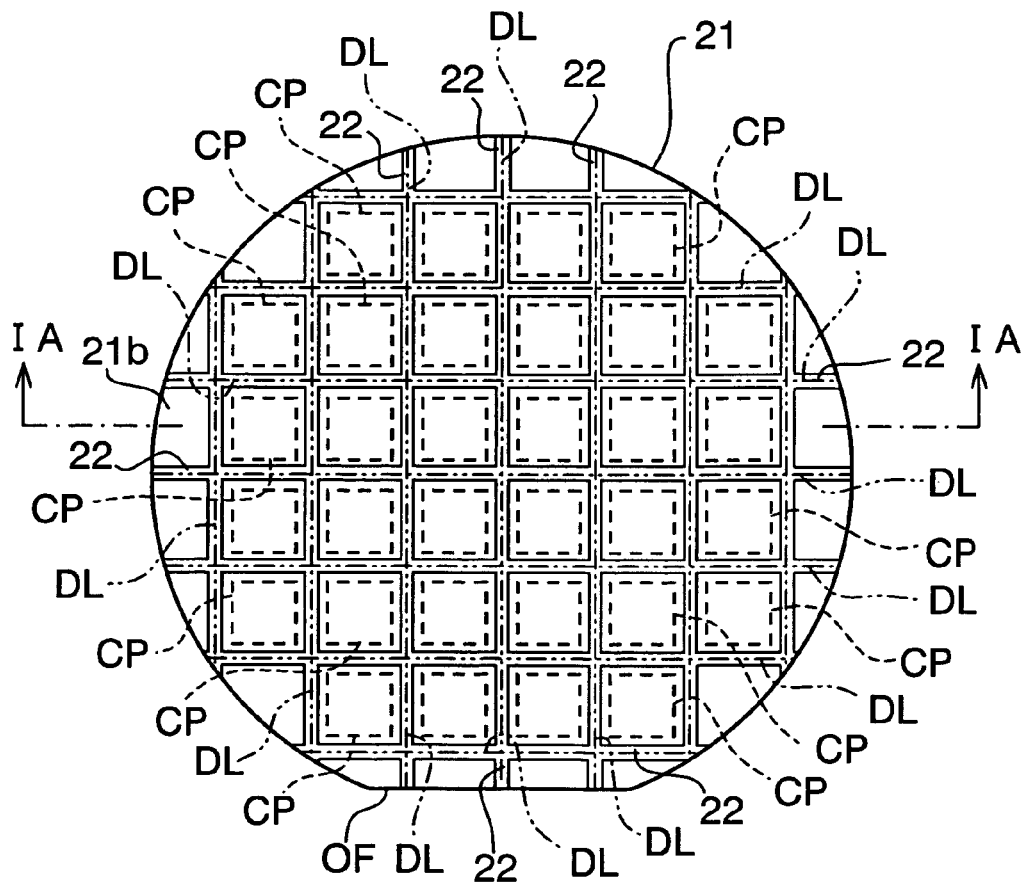
FIG. 1B is a plan view showing the wafer.
Figure 2A:
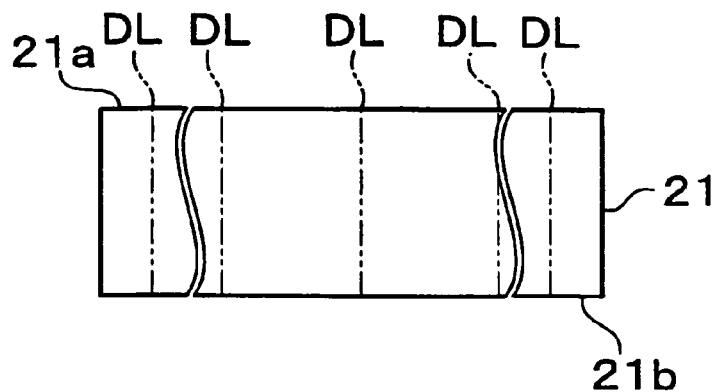
FIGS. 2A to 2C are cross sectional views explaining a dicing process of the wafer.
Figure 2B:
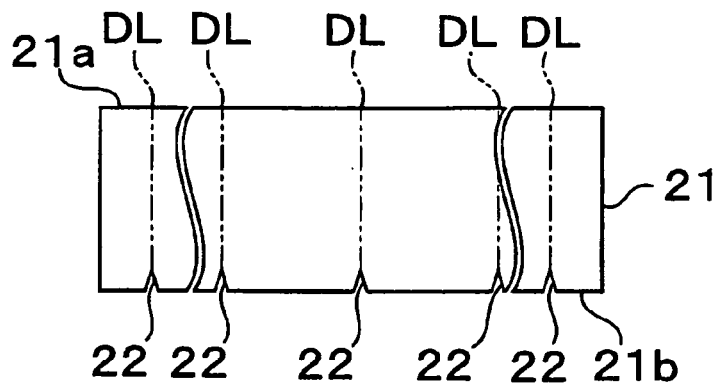
Figure 2C:
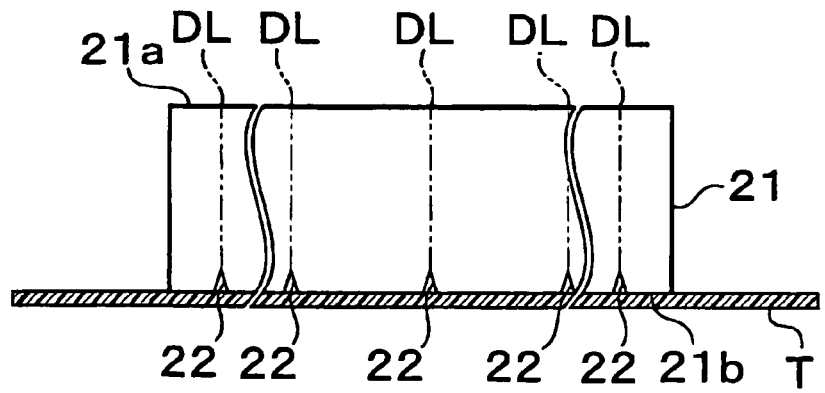
Figure 3A:
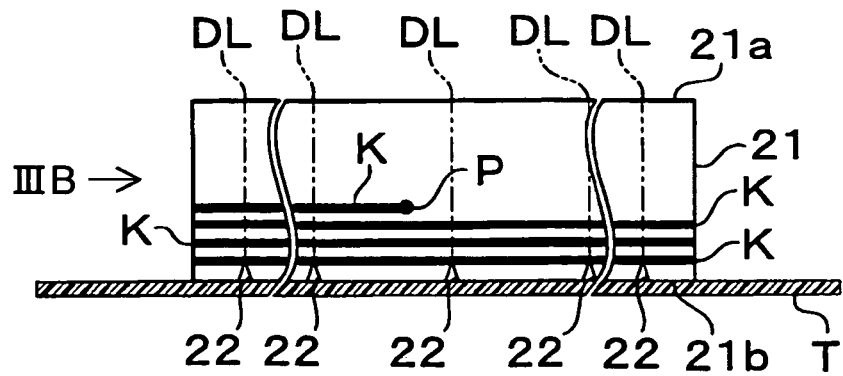
FIGS. 3A to 3C are cross sectional views explaining the dicing process of the wafer.
Figure 3B:
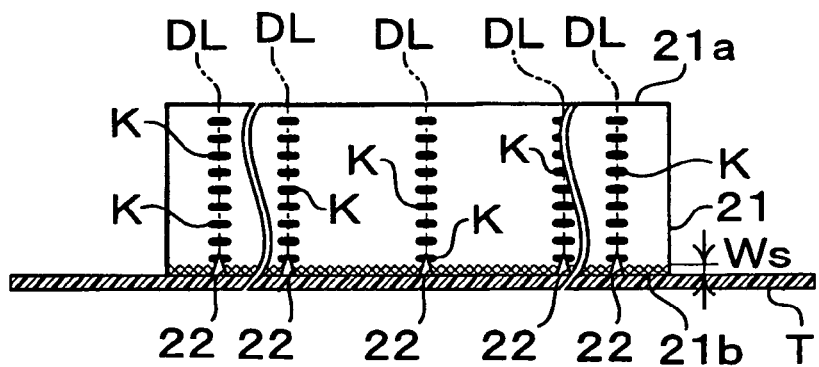
Figure 3C:
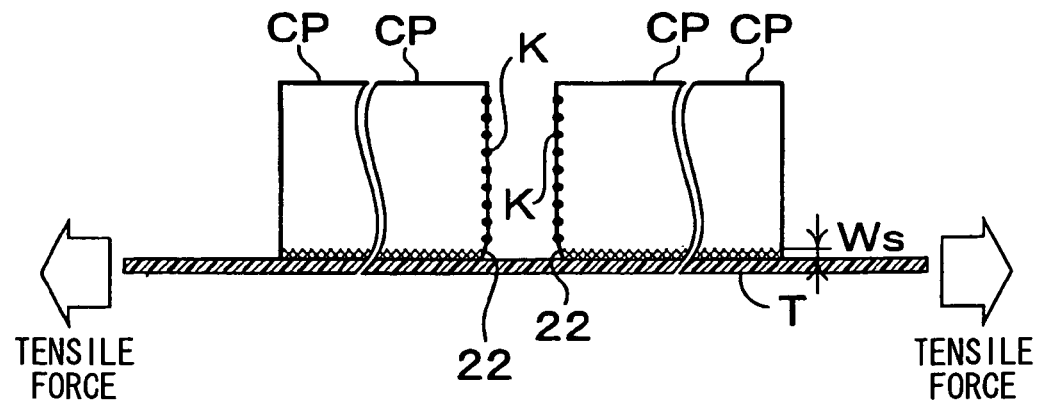

A laser dicing method and a semiconductor wafer in accordance with a first embodiment mode will be explained on the basis of FIGS. 1A to 3C. FIG. 1A illustrates a cross-sectional view (a section of line IA-IA shown in FIG. 1B) showing the construction of the semiconductor wafer in accordance with this first embodiment mode. FIG. 1B shows a bottom (rear) view seen from a line arrow IB shown in FIG. 1A. Further, FIGS. 2A to 3C illustrate cross-sectional views showing the construction of the semiconductor wafer in each step constituting a dicing process in accordance with this first embodiment mode. FIG. 2A shows the semiconductor wafer before a groove portion forming step. FIG. 2B shows the semiconductor wafer after the groove portion forming step. FIG. 2C shows the semiconductor wafer after an expand tape sticking step. FIG. 3A shows the semiconductor wafer during a reforming layer forming step. FIG. 3B shows the semiconductor wafer seen from a line arrow IIIB shown in FIG. 3A. FIG. 3C shows the semiconductor wafer after an expand step.

First, the construction of a semiconductor wafer 21 of this first embodiment mode will be explained with reference to FIGS. 1A and 1B. As shown in FIGS. 1A and 1B, the semiconductor wafer 21 is a silicon substrate of a thin disk shape constructed by silicon, and an orientation flat OF showing a crystal orientation is formed in one portion of the outer circumference of the semiconductor wafer 21. Plural chips CP formed via a diffusion process, etc. are lined up and arranged as in checkers on a surface 21a of this semiconductor wafer 21. The range of cross hatching shown in FIG. 1A shows a surface layer Ws (the layer of a rear face including the rear face 21b of the semiconductor wafer 21).

These chips CP are respectively separated along a divisional cutting schedule line DL by the dicing process shown in FIGS. 2A to 3C. However, in this embodiment mode, as shown in FIG. 1B, groove portions 22 arranged in a grating shape along this divisional cutting schedule line DL are formed on the rear face 21b of the semiconductor wafer 21. Namely, the groove portion 22 of a V-shape (wedge shape) in a sectional shape of a depth direction is formed on the divisional cutting schedule line DL so as to surround the circumference of each chip CP lined up and arranged as in checkers. As shown in FIG. 1A, in this groove portion 22, a tip portion (which is an acute angle portion corresponding to a top portion of the V-shape) in its depth direction is formed until a depth reaching a reforming layer K formed within the semiconductor wafer 21. Namely, a bottom portion of the groove portion 22 is connected to the reforming layer K.

Thus, a surface layer Ws is removed from the rear face 21b of the divisional cutting schedule line DL forming the groove portion 22 thereon by forming the groove portion 22. Therefore, no range for forming no reforming layer K exists on the rear face 21b of the divisional cutting schedule line DL. On the other hand, the groove portion 22 is formed at a depth reaching the reforming layer K. Accordingly, as described later, when tensile force pulled on the diametrical outside is applied on the rear face 21b of the semiconductor wafer 21, stress concentrated onto the groove portion 22 can be directly applied to the reforming layer K connected to this groove portion 22.

In this first embodiment mode, a groove portion forming step for forming such a groove portion 22 on the rear face 21b of the semiconductor wafer 21 is arranged before a reforming layer forming step for forming the reforming layer K in the semiconductor wafer 21. Namely, as shown in FIG. 2A, with respect to the semiconductor wafer 21 in which the groove portion 22 and the reforming layer K are not formed, the groove portion 22 is formed on the divisional cutting schedule line DL on the rear face 21b of the semiconductor wafer 21 by the groove portion forming step shown in FIG. 2B. In this groove portion forming step, for example, the groove portion 22 is mechanically formed by cutting using a dicing blade, etc., and the irradiation of a laser beam. The groove portion 22 is also chemically formed by wet etching utilizing KOH, etc. using a mask for covering the exterior of a forming range of the groove portion 22, and dry etching.

When the groove portion 22 is formed on the rear face 21b by the groove portion forming step, an expand tape T is stuck to the rear face 21b by the expand tape sticking step shown in FIG. 2C. For example, this expand tape T is a sheet of a film shape manufactured by resin and having a property of expansion and contraction and constructed by vinyl chloride, etc. One face of this expand tape T is coated with a pressure sensitive adhesive able to stick the semiconductor wafer 21 and the chip CP. The semiconductor wafer 21 can be pulled in a diametrical direction in the expand step described later by approximately sticking this expand tape T onto the entire rear face 21b of the semiconductor wafer 21.

Figure 16A:
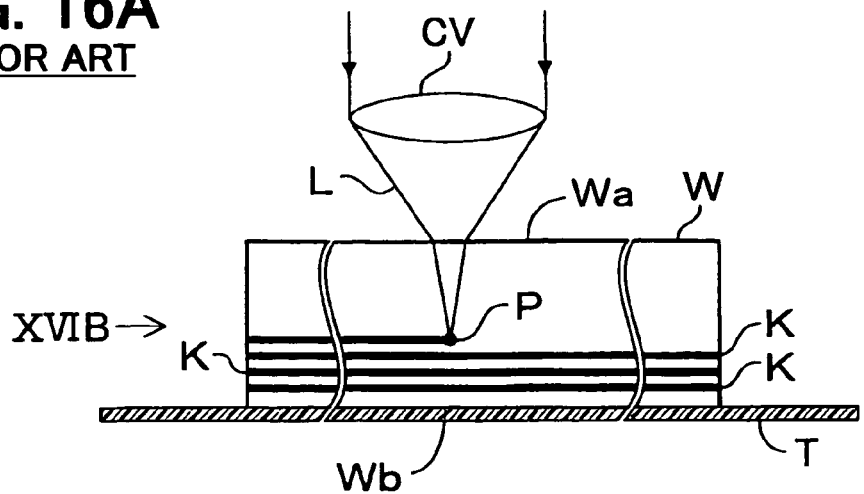
FIG. 16A to 16C are cross sectional views explaining a dicing process of a semiconductor wafer according to a prior art.
Figure 16B:
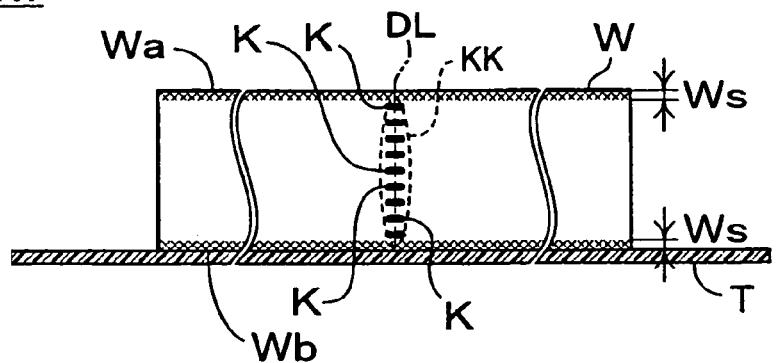
Figure 16C:
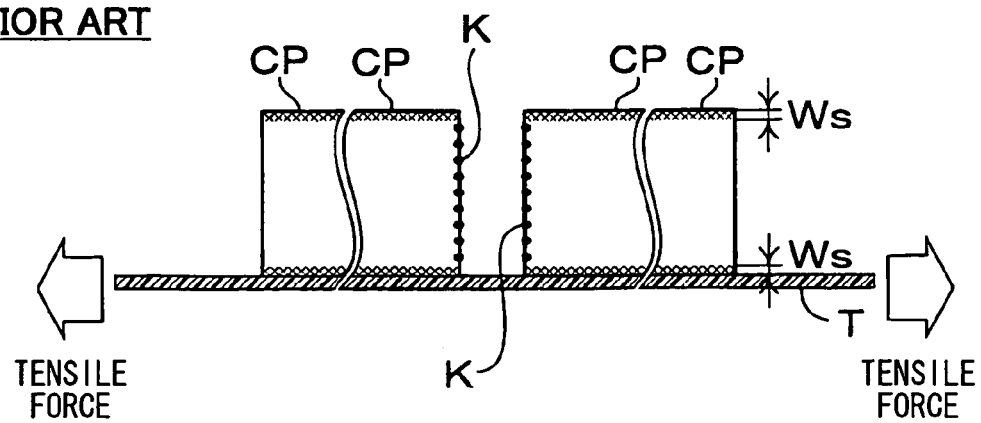

When the expand tape T is stuck to the rear face 21b by the expand tape sticking step, a reforming layer K is next formed within the semiconductor wafer 21 by irradiating the laser beam to the surface 21a of the semiconductor wafer 21 by the reforming layer forming step shown in FIGS. 3A and 3B. The reforming layer K formed in this reforming layer forming step is formed such that a tip of the groove portion 22 formed by the groove portion forming step shown in FIG. 2B reaches this reforming layer K. Since this reforming layer forming step is similar to the reforming process explained with reference to FIGS. 16A and 16B, its explanation is omitted here.

When the reforming layer K is formed within the semiconductor wafer 21 by the reforming layer forming step, tensile force for pulling the semiconductor wafer 21 toward the diametrical outside is applied from the rear face 21b of the semiconductor wafer 21 by the expand step shown in FIG. 3C. For example, the semiconductor wafer 21 is pushed up from the rear face 21b side to the surface 21a side in a state in which the circumference of the expand tape T stuck to the rear face 21b of the semiconductor wafer 21 is fixed. Thus, the expand tape T fixed in the circumference is extended and enlarged toward the surface 21a side of the semiconductor wafer 21 so that tension intended to extend this expand tape T in its circumferential direction is generated. This tension is utilized as force (tensile force) for pulling the semiconductor wafer 21 toward the diametrical outside. Pressurizing force for pushing-up the semiconductor wafer 21 is generated by an unillustrated pressurizing device. This pulling force (tensile force) can correspond to "external force" described in claims.

The semiconductor wafer 21 is pulled on its diametrical outside by such tensile force. However, in this embodiment mode, as mentioned above, the groove portion 22 is formed in advance on the divisional cutting schedule line DL of the rear face 21b of the semiconductor wafer 21. Therefore, stress due to the tensile force is concentrated on the groove portion 22, and this stress is directly applied to the reforming layer K connected to the groove portion 22. Accordingly, growth of a crack with the reforming layer K as a starting point can be promoted. Thus, it is possible to extremely reduce the possibility that the growth of the crack is developed in an unscheduled direction in comparison with a case in which a range for forming no reforming layer K in the surface layer Ws of the rear face 21b side of the divisional cutting schedule line DL exists. Accordingly, stable divisional cutting can be performed, and a quality reduction of the divided chip CP can be prevented.

The chips CP divisionally cut and separated in this way are respectively separated along the divisional cutting schedule line DL by the dicing process, and are then completed as packaged IC and LSI via respective processes such as a mount process, a bonding process, an enclosing process, etc.

As explained above, the dicing process in accordance with this first embodiment mode includes the groove portion forming step in which the groove portion 22 able to concentrate stress due to tensile force thereon is formed on the rear face 21b of the divisional cutting schedule line DL until a depth able to reach the reforming layer K. Accordingly, no range for forming no reforming layer K exists in the surface layer Ws of the rear face 21b of the divisional cutting schedule line DL forming the groove portion 22 thereon. On the other hand, when tensile force is applied in the divisional cutting, stress concentrated on the groove portion 22 is directly applied to the reforming layer K connected to the groove portion 22. Therefore, the growth of a crack with this reforming layer K as a starting point can be promoted. Accordingly, the possibility that the growth of the crack is developed in an unscheduled direction is extremely lowered in comparison with a case in which the range for forming no reforming layer K in the surface layer Ws of the divisional cutting schedule line DL exists. Therefore, stable divisional cutting can be performed, and the quality reduction of the divided chip CP can be prevented.

Further, in the dicing process in accordance with this first embodiment mode, the groove portion 22 is formed on the rear face 21b when tensile force is applied to the rear face 21b of the semiconductor wafer 21. Accordingly, in comparison with the surface 21a difficult to be applied this tensile force, it is possible to promote the growth of the crack in which the reforming layer K of the rear face 21b side easily applied by this tensile force is set to a starting point. Thus, it particularly effectively acts when the range for forming no reforming layer K is gathered on the rear face 21b side. Accordingly, stable divisional cutting can be performed and the quality reduction of the separated chip CP can be prevented even in the semiconductor wafer 21 in which the range for forming no reforming layer K is gathered in the surface layer Ws of the rear face 21b applied by tensile force.

Further, in the dicing process in accordance with this first embodiment mode, the groove portion forming step for forming the groove portion 22 is arranged before the reforming layer forming step for forming the reforming layer K within the semiconductor wafer 21. Accordingly, no reforming layer K is yet formed in the semiconductor wafer 21 in the groove portion forming step for forming such a groove portion 22. Therefore, for example, when the groove portion 22 is formed by physical processing such as cutting, etc. using a dicing blade, etc., mechanical processing, etc., the reforming layer K tending to become a cause of a crack by a mechanical vibration is not formed yet. Hence, the crack generation at a processing time can be restrained. Accordingly, it is possible to prevent the quality reduction of the chip CP with the generation of such an unscheduled crack as a cause.

Further, the divisional cutting schedule line DL can correspond to "a part to be divisionally cut" and "a part to be separated". Further, the rear face 21b can correspond to "a surface of the part to be divisionally cut" and "one face". Further, the surface 21a can correspond to "the other face". Further, the groove portion 22 can correspond to "a groove". The chip CP can correspond to "a wafer piece" and "a semiconductor device".

Further, the groove portion forming step can correspond to "a process for forming the groove". The reforming layer forming step can correspond to "a process for forming a reforming layer".

Second Embodiment Mode

Figure 4A:
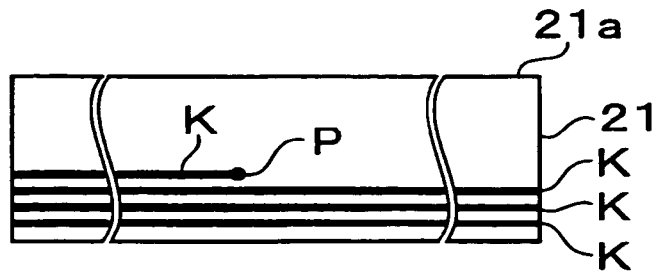
FIGS. 4A to 4C are cross sectional views explaining another dicing process of the wafer.
Figure 4B:
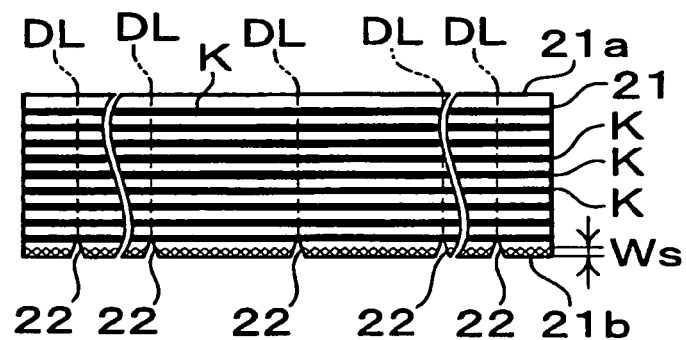
Figure 4C:
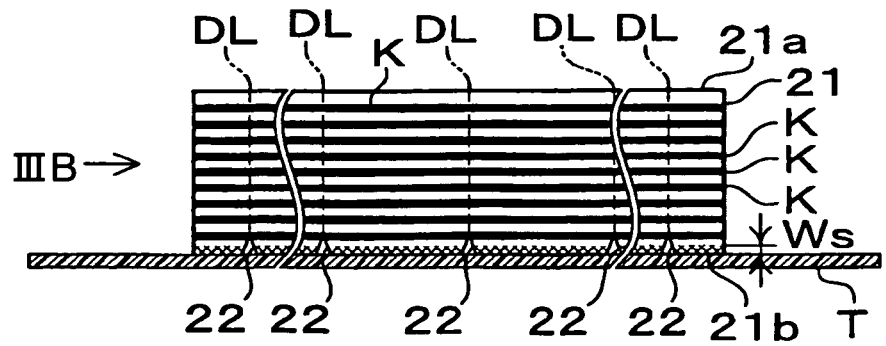

Next, a laser dicing method in accordance with a second embodiment mode will be explained on the basis of FIGS. 4A to 4C. FIGS. 4A to 4C illustrate cross-sectional views showing the construction of a semiconductor wafer in each step constituting a dicing process in accordance with this second embodiment mode. FIG. 4A shows the semiconductor wafer during the reforming layer forming step. FIG. 4B shows the semiconductor wafer after the groove portion forming step. FIG. 4C shows the semiconductor wafer after the expand tape sticking step.

This second embodiment mode differs from the first embodiment mode in that the groove portion forming step arranged before the reforming layer forming step in the first embodiment mode is arranged after the reforming layer forming step.

As shown in FIG. 4A, in this second embodiment mode, with respect to the semiconductor wafer 21 forming no groove portion 22 therein, a laser beam is first irradiated to the surface 21a of the semiconductor wafer 21 by the reforming layer forming step. Thus, a reforming layer K is formed within the semiconductor wafer 21. However, no groove portion 22 formed in this subsequent process exists in an irradiating range of the laser beam L. Accordingly, ablation due to the existence of this groove portion 22 can be prevented.

Namely, when the surface of a semiconductor material exposed in a space exists as in a wall portion forming the groove portion 22 within the irradiating range of the laser beam L, a particle due to ablation can be generated by focusing the laser beam L on this surface. However, in this second embodiment mode, since such a groove portion 22 does not exist in the reforming layer forming step, ablation is prevented and generation of a particle due to this ablation can be prevented.

When the reforming layer K is formed within the semiconductor wafer 21 by the reforming layer forming step, the groove portion 22 is next formed on a divisional cutting schedule line DL on the rear face 21b of the semiconductor wafer 21 by the groove portion forming step shown in FIG. 4B. In this groove portion forming step, similar to the first embodiment mode, the groove portion 22 is formed mechanically or chemically. The groove portion 22 is formed in this groove portion forming step such that a tip of this groove portion 22 reaches the reforming layer K formed by the reforming layer forming step shown in FIG. 4A.

When the groove portion 22 is formed on the rear face 21b of the semiconductor wafer 21 by the groove portion forming step, similar to the first embodiment mode, an expand tape T is stuck to the rear face 21b of the semiconductor wafer 21 by an expand tape sticking step shown in FIG. 4C. This expand tape T is similar to that of the first embodiment mode.

When the expand tape T is stuck by the expand tape sticking step, tensile force is applied from the rear face 21b of the semiconductor wafer 21 by an expand step. This expand step is similar to that shown in FIG. 3C explained in the first embodiment mode, and its illustration and explanation are therefore omitted here. The cross-sectional view showing the construction of the semiconductor wafer 21 seen from the direction of an arrow IIIB shown in FIG. 4C is substantially similar to that shown in FIG. 3B.

Thus, in the second embodiment mode, the groove portion forming step (FIG. 4B) exists after the reforming layer forming step (FIG. 4A). Accordingly, in the reforming layer forming step, such a groove portion 22 is not formed yet in the semiconductor wafer 21. Therefore, for example, when the reforming layer K is formed by irradiating the laser beam L, no wall face of such a groove portion 22 tending to become a cause of ablation is formed yet. Hence, generation of ablation can be restrained at an irradiating time of the laser beam L. Accordingly, it is possible to prevent the quality reduction of a chip CP in which attachment of a particle due to such ablation is set to a cause.

Third Embodiment Mode

Figure 5A:
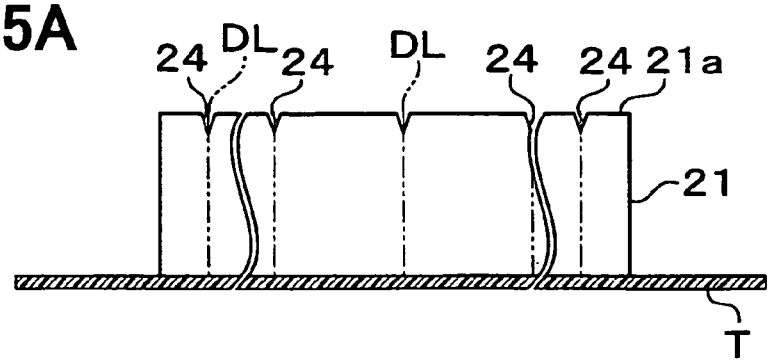
FIGS. 5A to 5D are cross sectional views explaining further another dicing process of the wafer.
Figure 5B:
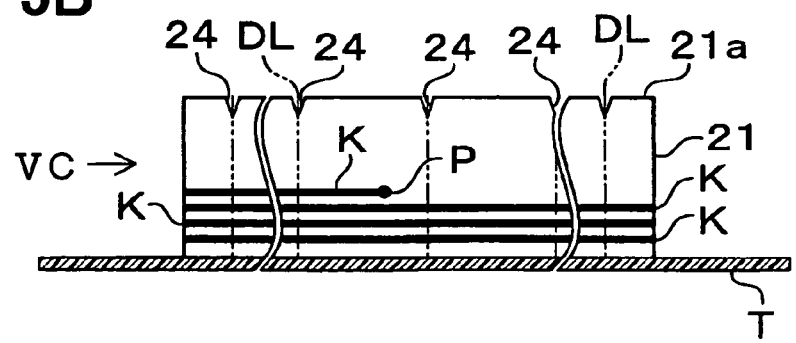
Figure 5C:
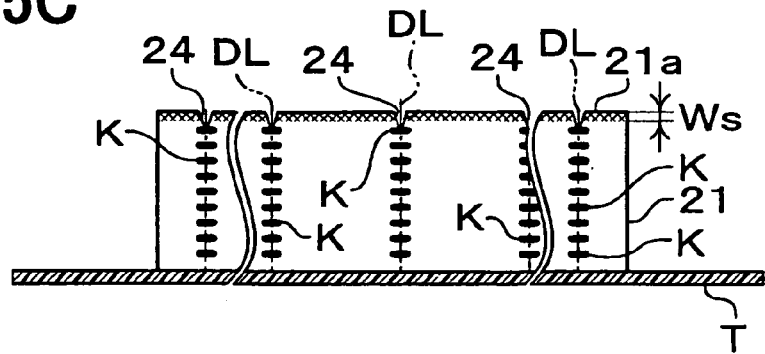
Figure 5D:
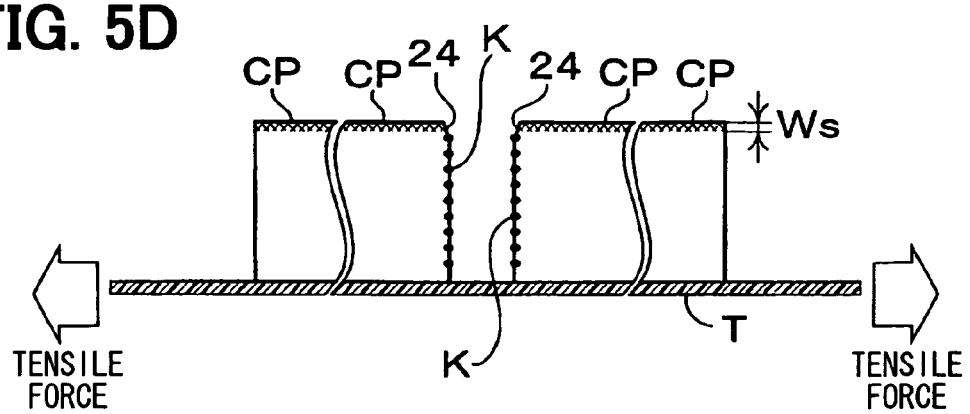

Next, a laser dicing method in accordance with a third embodiment mode will be explained on the basis of FIGS. 5A to 5D. FIGS. 5A to 5D illustrate cross-sectional views showing the construction of a semiconductor wafer in each step constituting a dicing process in accordance with this third embodiment mode. FIG. 5A shows the semiconductor wafer after the groove portion forming step. FIG. 5B shows the semiconductor wafer during the reforming layer forming step. FIG. 5C shows the semiconductor wafer seen from a line arrow VC shown in FIG. 5B. FIG. 5D shows the semiconductor wafer after the expand step.

This third embodiment mode differs from the first embodiment mode in that the groove portion 22 formed on the rear face 21b of the semiconductor wafer 21 in the first embodiment mode is formed as a groove portion 24 on the surface 21a of the semiconductor wafer 21. The groove portion 24 formed in this third embodiment mode differs from the groove portion 22 formed in the first and second embodiment modes in only reference numeral, and both these groove portions are substantially similar.

As shown in FIG. 5A, in this third embodiment mode, the groove portion 24 is first formed on the divisional cutting schedule line DL on the surface 21a of the semiconductor wafer 21 by the groove portion forming step. In this groove portion forming step, similar to the first and second embodiment modes, the groove portion 24 is formed mechanically or chemically. An expand tape T is stuck to the rear face 21b of the semiconductor wafer 21 carried in this groove portion forming step by a previous process.

When the groove portion 24 is formed on the surface 21a by the groove portion forming step, a reforming layer K is next formed within the semiconductor wafer 21 by irradiating a laser beam onto the surface 21a of the semiconductor wafer 21 by a reforming layer forming step shown in FIGS. 5B and 5C. The reforming layer K is formed in this reforming layer forming step such that a tip of the groove portion 24 formed by the groove portion forming step shown in FIG. 5A reaches the reforming layer K.

When the reforming layer K is formed within the semiconductor wafer 21 by the reforming layer forming step, tensile force is applied from the rear face 21b of the semiconductor wafer 21 by an expand step shown in FIG. 5D. This expand step is similar to that shown in FIG. 3C explained in the first embodiment mode.

Thus, in the third embodiment mode, when tensile force is applied to the rear face 21b of the semiconductor wafer 21 toward the diametrical outside, the groove portion 24 is formed on the surface 21a of the semiconductor wafer 21. Thus, the growth of a crack in which the reforming layer K of the rear face 21b side difficult to be applied by the tensile force is set to a starting point is promoted in comparison with the rear face 21b easily applied by the tensile force. Hence, it particularly effectively acts when a range for forming no reforming layer K is gathered on the surface 21a side. Accordingly, stable divisional cutting can be performed and the quality reduction of a separated chip CP can be prevented even in the semiconductor wafer 21 in which the range for forming no reforming layer K is gathered in a surface layer Ws of the surface 21a on the side opposed to the rear face 21b applied by the tensile force.

The groove portion 24 can correspond to "a groove", and the tensile force can correspond to "external force".

Fourth Embodiment Mode

Figure 6A:
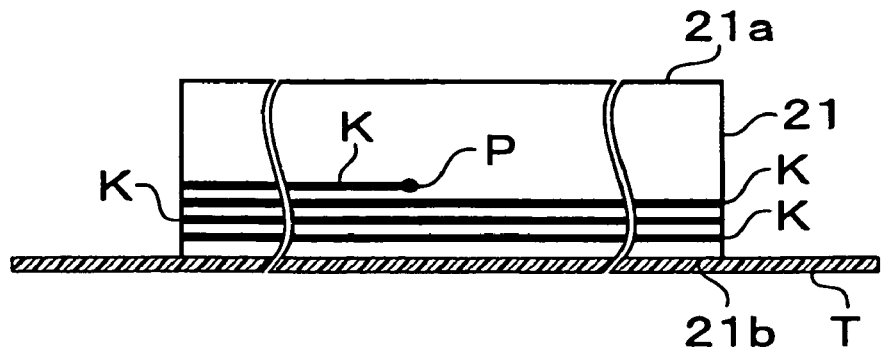
FIGS. 6A to 6C are cross sectional views explaining another dicing process of the wafer.
Figure 6B:
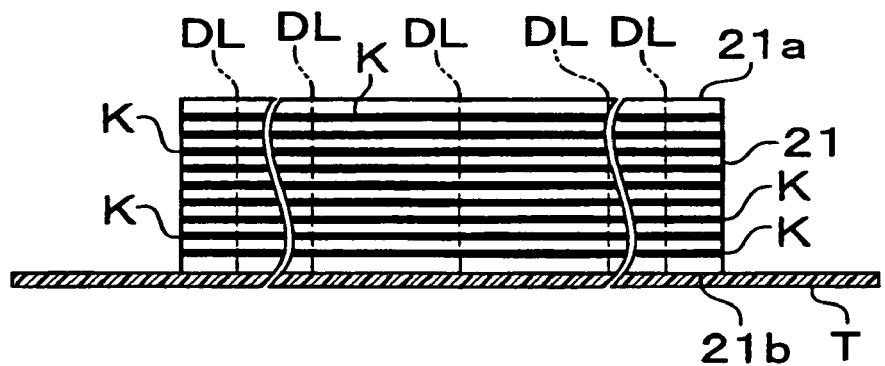
Figure 6C:
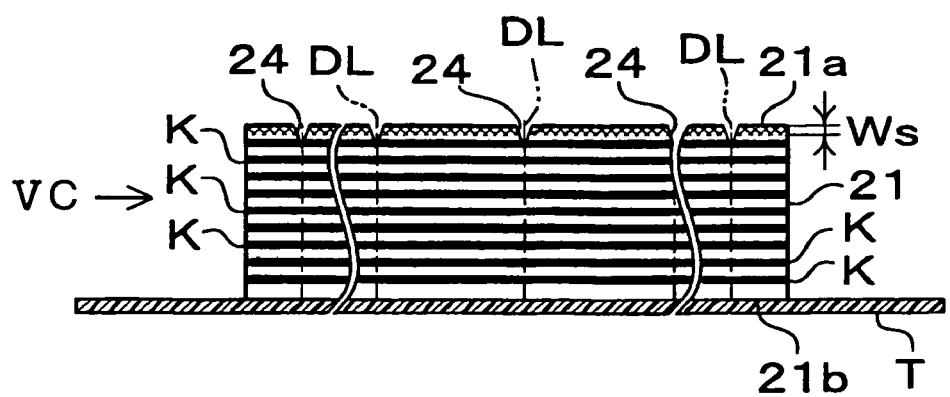

Next, a laser dicing method in accordance with a fourth embodiment mode will be explained on the basis of FIGS. 6A to 6C. FIGS. 6A to 6C illustrate cross-sectional views showing the construction of a semiconductor wafer in each step constituting a dicing process in accordance with this fourth embodiment mode. FIG. 6A shows the semiconductor wafer during a reforming layer forming step. FIG. 6B shows the semiconductor wafer after an expand tape sticking step. FIG. 6C shows the semiconductor wafer after a groove portion forming step.

This fourth embodiment mode differs from the third embodiment mode in that the groove portion forming step arranged before the reforming layer forming step in the third embodiment mode is arranged after the reforming layer forming step.

As shown in FIG. 6A, in this fourth embodiment mode, with respect to the semiconductor wafer 21 forming no groove portion 24 therein, a laser beam is first irradiated to the surface 21a of the semiconductor wafer 21 by the reforming layer forming step. Thus, similar to the reforming layer forming step (FIG. 4A) of the dicing process explained in the second embodiment mode, no groove portion 24 formed in this subsequent process exists in an irradiating range of the laser beam L. Accordingly, ablation due to the existence of this groove portion 24 can be prevented.

When a reforming layer K is formed within the semiconductor wafer 21 by the reforming layer forming step, similar to the first embodiment mode, an expand tape T is next stuck to the rear face 21b of the semiconductor wafer 21 by an expand tape sticking step shown in FIG. 6B. This expand tape T is similar to that of the first embodiment mode.

When the expand tape T is stuck by the expand tape sticking step, the groove portion 24 is formed on a divisional cutting schedule line DL on the surface 21a of the semiconductor wafer 21 by a groove portion forming step shown in FIG. 6C. In this groove portion forming step, similar to the first to third embodiment modes, the groove portion 24 is formed mechanically or chemically. The groove portion 24 is formed in this groove portion forming step such that a tip of this groove portion 24 reaches the reforming layer K formed by the reforming layer forming step shown in FIG. 6A.

When the groove portion 24 is formed on the surface 21a of the semiconductor wafer 21 by the groove portion forming step, tensile force is applied from the rear face 21b of the semiconductor wafer 21 by an expand step. This expand step is similar to that shown in FIG. 5D explained in the third embodiment mode, and its illustration and explanation are therefore omitted here. The cross-sectional view showing the construction of the semiconductor wafer 21 seen from a direction arrow 5C shown in FIG. 6C is substantially similar to that shown in FIG. 5C.

Thus, in this fourth embodiment mode, the groove portion forming step (FIG. 6C) exists after the reforming layer forming step (FIG. 6A). Accordingly, in the reforming layer forming step, such a groove portion 24 is not formed yet in the semiconductor wafer 21. Therefore, for example, when the reforming layer K is formed by irradiating the laser beam L, no wall face of such a groove portion 24 tending to become a cause of ablation is formed yet. Hence, generation of ablation can be restrained at an irradiating time of the laser beam L. Accordingly, it is possible to prevent the quality reduction of a chip CP in which attachment of a particle due to such ablation is set to a cause.

Fifth Embodiment Mode

Subsequently, a laser dicing method and a semiconductor wafer in accordance with a fifth embodiment mode will be explained on the basis of FIGS. 9A to 11C. The laser dicing method and the semiconductor wafer in accordance with the fifth embodiment mode are approximately similar to those already explained in the first embodiment mode. However, this fifth embodiment mode differs from the above first embodiment mode in that "a groove formed in a part to be divisionally cut is formed until a depth at which the separating distance between a reforming layer closest to this groove and a bottom portion of this groove becomes 30 µm or less". Therefore, the laser dicing method and the semiconductor wafer in accordance with the fifth embodiment mode will next be explained with reference to FIGS. 9A to 11C. However, these FIGS. 9A to 11C correspond to FIGS. 1A to 3C relative to the semiconductor wafer 21 and the dicing process in accordance with the above first embodiment mode.

Figure 9A:
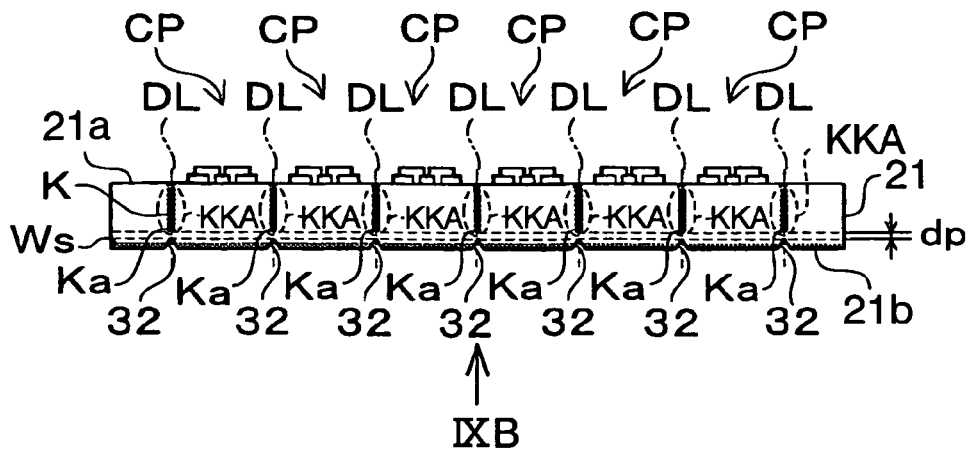
FIG. 9A is a cross sectional view showing another semiconductor wafer taken along line IXA-IXA in FIG. 9B.
Figure 9B:
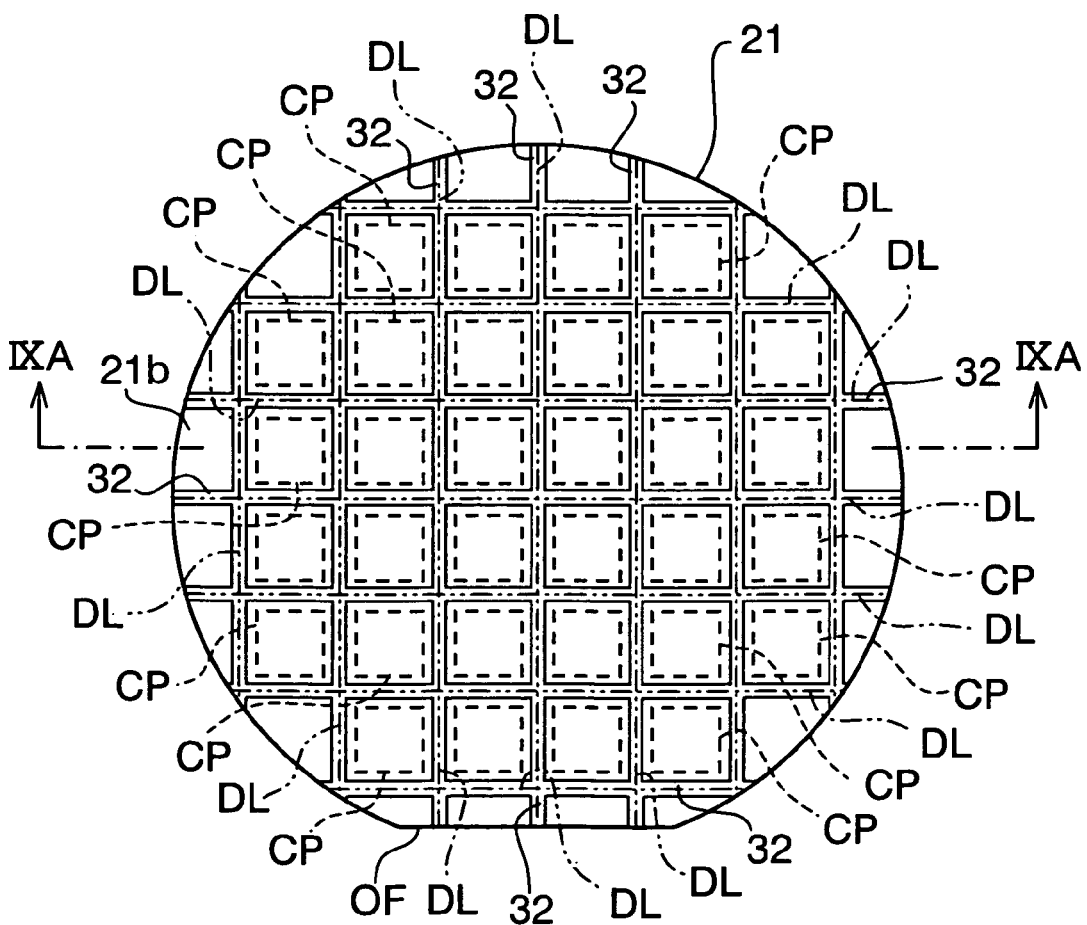
FIG. 9B is a plan view showing the wafer.
Figure 10A:
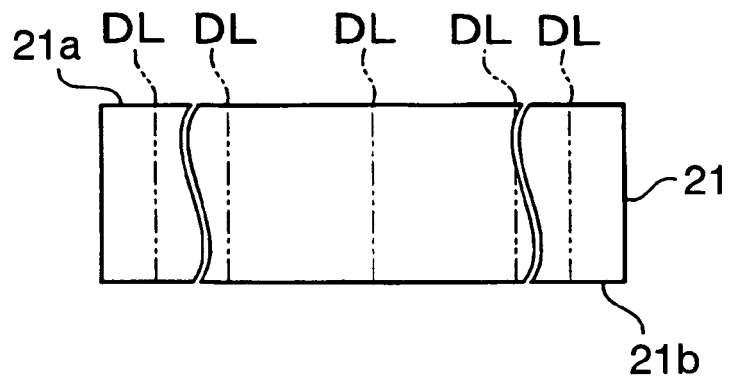
FIGS. 10A to 10C are cross sectional views explaining a dicing process of the wafer.
Figure 10B:
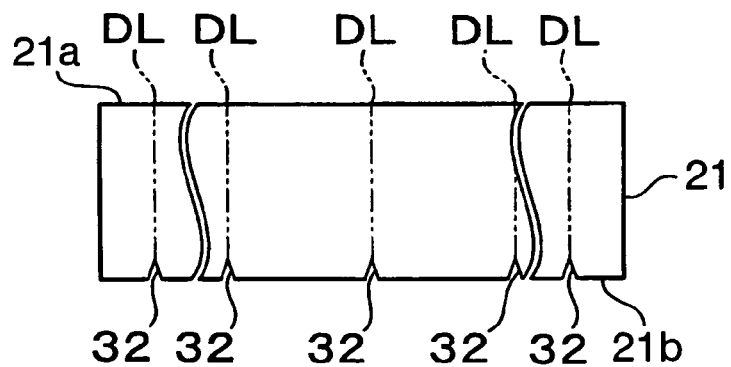
Figure 10C:
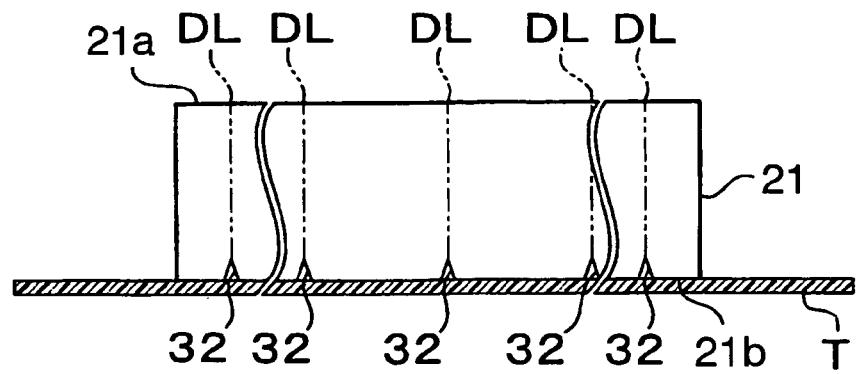
Figure 11A:
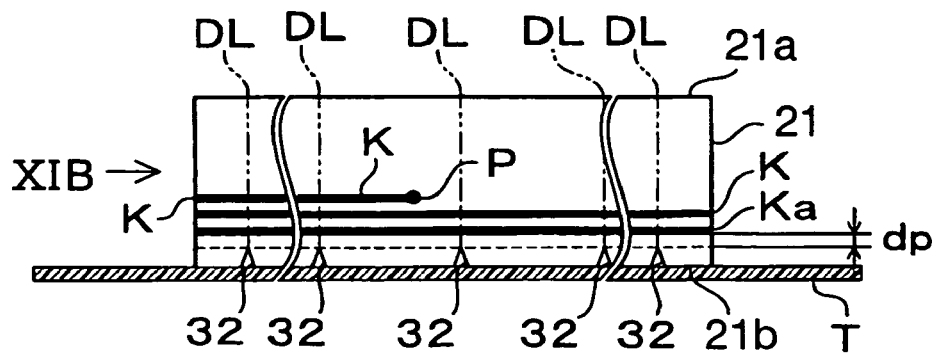
FIGS. 11A to 11C are cross sectional views explaining the dicing process of the wafer.
Figure 11B:
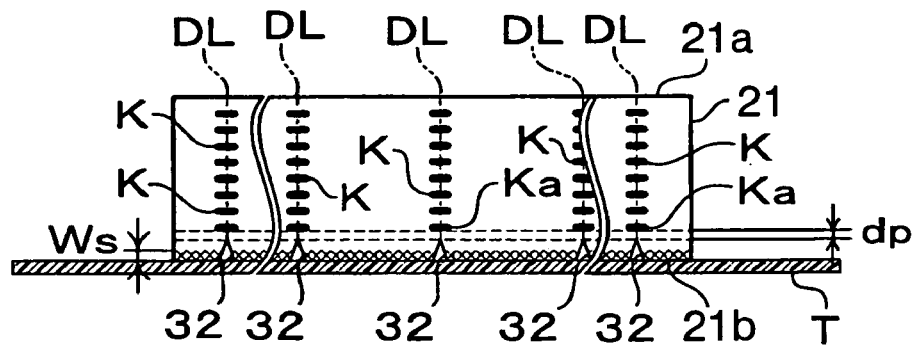
Figure 11C:
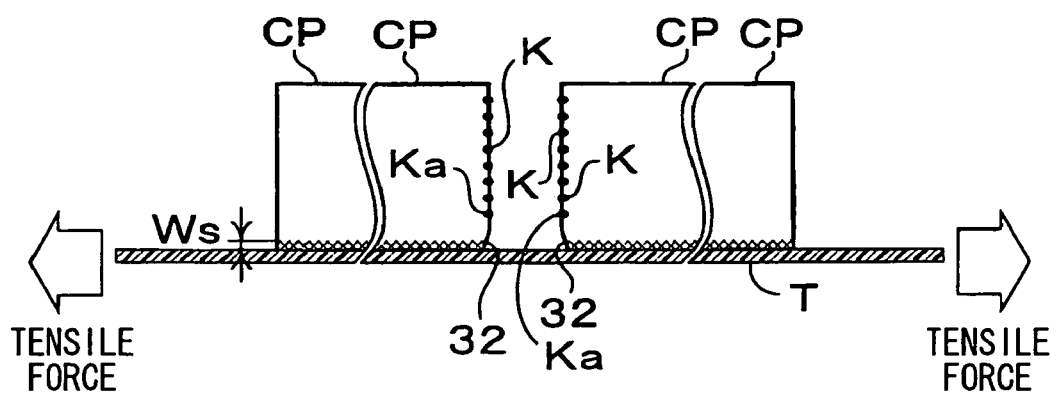

FIG. 9A illustrates a cross-sectional view (a section of line IXA-IXA shown in FIG. 9B) showing the construction of a semiconductor wafer in accordance with this fifth embodiment mode. FIG. 9B shows a bottom (rear) view seen from a line arrow IXB shown in FIG. 9A. Further, FIGS. 10A to 11C illustrate cross-sectional views showing the construction of the semiconductor wafer in each step constituting a dicing process in accordance with this fifth embodiment mode. FIG. 10A shows the semiconductor wafer before a groove portion forming step. FIG. 10B shows the semiconductor wafer after the groove portion forming step. FIG. 10C shows the semiconductor wafer after an expand tape sticking step. FIG. 11A shows the semiconductor wafer during a reforming layer forming step. FIG. 11B shows the semiconductor wafer seen from a line arrow XIB shown in FIG. 11A. FIG. 11C shows the semiconductor wafer after an expand step.

First, the construction of the semiconductor wafer 21 of this fifth embodiment mode will be explained with reference to FIGS. 9A and 9B. As shown in FIGS. 9A and 9B, similar to the above semiconductor wafer 21, the semiconductor wafer 21 is a silicon substrate forming an orientation flat OF therein, and plural chips CP formed via a diffusion process, etc. are lined up and arranged as in checkers on the surface 21a of this semiconductor wafer 21. A range of cross hatching shown in FIG. 9A shows a surface layer Ws (a layer of a rear face including the rear face 21b of the semiconductor wafer 21) explained with reference to FIGS. 16A and 16B.

These chips CP are respectively separated along a divisional cutting schedule line DL by the dicing process shown in FIGS. 10A to 11C. In this fifth embodiment mode, similar to the first embodiment mode, groove portions 32 arranged in a grating shape along the divisional cutting schedule line DL are formed on the rear face 21b of the semiconductor wafer 21. This groove portion 32 is similar to the groove portion 22 of the first embodiment mode in that the sectional shape of a depth direction is a V-shape (wedge shape). However, as shown in FIG. 9A, the groove portion 32 differs from the groove portion 22 of the first embodiment mode in that a tip portion of the groove portion 32 in this depth direction (which is an acute angle portion corresponding to a top portion of the V-shape), i.e., a bottom portion X of the groove portion 32 is stopped near a reforming layer Ka closest to this groove portion 32 without reaching a reforming layer K formed within the semiconductor wafer 21. Therefore, the bottom portion X of the groove portion 32 and the reforming layer Ka located near this bottom portion X are separated at a distance dp.

Figure 15:
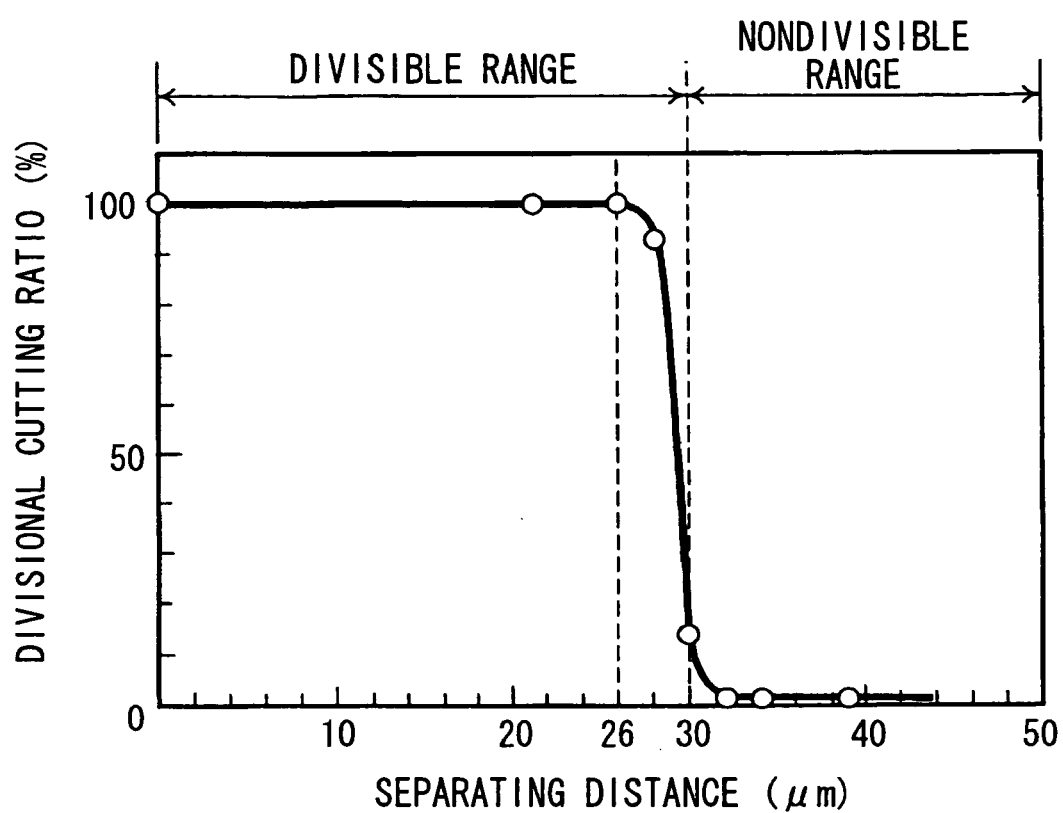
FIG. 15 is a graph showing a relationship between a separating distance and a divisional cutting ratio.

As shown in FIG. 15, it has been found by an experiment of the inventors that it is necessary to set such a separating distance dp to 30 μm or less irrespective of the thickness of the semiconductor wafer 21. Concretely, the following results have been cleared. Namely, when the semiconductor wafer 21 is a silicon substrate and the separating distance dp between the reforming layer Ka closest to the groove portion 32 and the bottom portion X of the groove portion 32 exceeds 0 μm and is 26 μm (0 μm<dp≦30 μm), a divisional cutting ratio is 100%. When the separating distance dp is 28 μm (dp=28 μm), the divisional cutting ratio is 92%. When the separating distance dp is 30 μm (dp=30 μm), the divisional cutting ratio is 15%. When the separating distance dp exceeds 30 μm (dp>30 μm), the divisional cutting ratio is about 0%. The "divisional cutting ratio" said here is a ratio of chips CP able to be divisionally cut to a total chip number scheduled to be divisionally cut when the semiconductor wafer 21 having a size of the chip CP set to 5 mm in square is divisionally cut.

In this embodiment mode, as shown in FIG. 15, if the divisional cutting ratio is 15% or more, it is judged as "can be divisionally cut" ("a range to be divisionally cut" shown in FIG. 15). When a divisional cutting ratio of 100% is required, it is necessary to set the separating distance dp to exceed 0 μm and be 26 μm or less (0 μm<dp≦26 μm).

Thus, the surface layer Ws is removed from the rear face 21b of the divisional cutting schedule line DL forming the groove portion 32 thereon by forming this groove portion 32. Therefore, no range for forming no reforming layer K therein exists on the rear face 21b of the divisional cutting schedule line DL. On the other hand, if the separating distance dp between the reforming layer Ka closest to this groove portion 32 and the bottom portion X of the groove portion 32 is 30 μm or less even when no reforming layer K is directly connected to this groove portion 32, a crack generated with the bottom portion X as a starting point can be connected to the reforming layer Ka having a separating distance of 30 μm or less by stress concentrated on the bottom portion X of the groove portion 32 when tensile force pulled on the diametrical outside is applied to the rear face 21b of the semiconductor wafer 21 as described later.

In this fifth embodiment mode, the groove portion forming step for forming such a groove portion 32 on the rear face 21b of the semiconductor wafer 21 is arranged before the reforming layer forming step for forming the reforming layer K in the semiconductor wafer 21. Namely, as shown in FIG. 10A, with respect to the semiconductor wafer 21 in which the groove portion 32 and the reforming layer K are not formed, the groove portion 32 is formed on the divisional cutting schedule line DL on the rear face 21b of the semiconductor wafer 21 by the groove portion forming step shown in FIG. 10B. This groove portion forming step is formed mechanically or chemically similarly to the groove portion forming step of the first embodiment mode explained with reference to FIG. 2B.

When the groove portion 32 is formed on the rear face 21b by the groove portion forming step, an expand tape T is stuck to the rear face 21b by an expand tape sticking step shown in FIG. 10C. This expand tape sticking step is also similar to the expand tape sticking step of the first embodiment mode explained with reference to FIG. 2C. The expand tape T as a sheet of a film shape manufactured by resin and having a property of expansion and contraction is approximately stuck to the entire rear face 21b of the semiconductor wafer 21.

When the expand tape T is stuck to the rear face 21b by the expand tape sticking step, a reforming layer K is next formed within the semiconductor wafer 21 by irradiating a laser beam to the surface 21a of the semiconductor wafer 21 by a reforming layer forming step shown in FIGS. 11A and 11B. The reforming layer K is formed in this reforming layer forming step so as to be located near the bottom portion X of the groove portion 22 formed by a groove portion forming step shown in FIG. 11B.

Namely, as mentioned above, the reforming layers Ka, K are formed by this reforming layer forming step such that the separating distance dp between the reforming layer Ka closest to the groove portion 32 and the bottom portion X of the groove portion 32 becomes 30 μm or less (the range of a reforming area KKA shown in FIG. 9A). This reforming layer forming step is similar to the reforming process explained with reference to FIGS. 16A and 16B, and its explanation is therefore omitted here.

When the reforming layer K is formed within the semiconductor wafer 21 by the reforming layer forming step, tensile force for pulling the semiconductor wafer 21 toward the diametrical outside is applied from the rear face 21b of the semiconductor wafer 21 by an expand step shown in FIG. 11C. Thus, similar to the expand tape sticking step of the first embodiment mode explained with reference to FIG. 3C, tensile force generated by extending and enlarging the expand tape T toward the surface 21a side of the semiconductor wafer 21 is utilized as force for pulling the semiconductor wafer 21 toward the diametrical outside. Thus, a crack is generated with the bottom portion X as a starting point by stress concentrated on the bottom portion X of the groove portion 32. The crack generated with the bottom portion X of the groove portion 32 as a starting point in this way is connected (communicated) to the reforming layer Ka located near the bottom portion X by further tensile force. Therefore, growth of the crack due to the reforming layer K continuously located in the reforming layer Ka can be promoted. Accordingly, the possibility that the growth of the crack is developed in an unscheduled direction is extremely reduced in comparison with a case in which a range for forming no reforming layer K exists in the surface layer Ws of the rear face 21b side of the divisional cutting schedule line DL. Accordingly, stable divisional cutting can be performed, and the quality reduction of a divided chip CP can be prevented.

The chips CP divisionally cut and separated in this way are respectively separated along the divisional cutting schedule line DL by the dicing process, and are then completed as IC and LSI packaged via respective processes such as a mount process, a bonding process, an enclosing process, etc.

As explained above, the dicing process in accordance with this fifth embodiment mode includes the groove portion forming step in which the groove portion 32 able to concentrate stress due to tensile force thereon is formed on the rear face 21b of the divisional cutting schedule line DL until a depth at which the separating distance dp between the reforming layer Ka closest to this groove portion 32 and the bottom portion X of the groove portion 32 becomes 30 μm or less. Accordingly, no range for forming no reforming layer K exists in the surface layer Ws of the rear face 21b of the divisional cutting schedule line DL forming the groove portion 32 thereon. On the other hand, when tensile force is applied in the divisional cutting, a crack generated with the bottom portion X as a starting point can be communicated with the reforming layer Ka of a separating distance of 30 μm or less by stress concentrated on the bottom portion X of the groove portion 32 if the separating distance between the reforming layer Ka closest to this groove portion 32 and the bottom portion X of the groove portion 32 is 30 μm or less even when no reforming layer Ka is directly connected to this groove portion 32. Therefore, growth of the crack with the bottom portion X as a starting point can be promoted. Accordingly, the possibility that the growth of the crack is developed in an unscheduled direction becomes extremely low in comparison with a case in which the range for forming no reforming layers Ka, K in the surface layer Ws of the divisional cutting schedule line DL exists. Therefore, stable divisional cutting can be performed, and the quality reduction of a separated chip CP can be prevented.

Further, in the dicing process in accordance with this fifth embodiment mode, the groove portion 32 is formed on the rear face 21b of the semiconductor wafer 21 when tensile force is applied to this rear face 21b. Accordingly, in comparison with the surface 21a difficult to be applied by this tensile force, it is possible to promote the crack generation and its growth in which the bottom portion X of the groove portion 32 on the rear face 21b side easily applied by the tensile force is set to a starting point. Thus, it particularly effectively acts when the range for forming no reforming layers Ka, K is gathered on the rear face 21b side. Accordingly, stable divisional cutting can be performed, and the quality reduction of a separated chip CP can be prevented even in the semiconductor wafer 21 in which the range for forming no reforming layers Ka, K is gathered in the surface layer Ws of the rear face 21b applied by tensile force.

Further, in the dicing process in accordance with this fifth embodiment mode, the groove portion forming step for forming the groove portion 32 is arranged before the reforming layer forming step for forming the reforming layer K within the semiconductor wafer 21. Accordingly, no reforming layer K is formed yet in the semiconductor wafer 21 in such a groove portion forming step for forming the groove portion 32. Therefore, for example, when the groove portion 32 is formed by physical processing such as cutting using a dicing blade, etc., mechanical processing, etc., the reforming layers Ka, K tending to become a cause of a crack by a mechanical vibration are not formed yet. Hence, crack generation at a processing time can be restrained. Accordingly, it is possible to prevent the quality reduction of a chip CP in which the generation of such an unscheduled crack is set to a cause.

Further, the divisional cutting schedule line DL can correspond to "a part to be divisionally cut" and "a part to be separated". Further, the rear face 21b can correspond to "a surface of the part to be divisionally cut" and "one face". Further, the surface 21a can correspond to "the other face". The groove portion 32 can correspond to "a groove". The chip CP can correspond to "a wafer piece" and "a semiconductor device" ims.

Further, the groove portion forming step can correspond to "a process for forming the groove", and the reforming layer forming step can correspond to "a process for forming a reforming layer".

Sixth Embodiment Mode

Figure 12A:
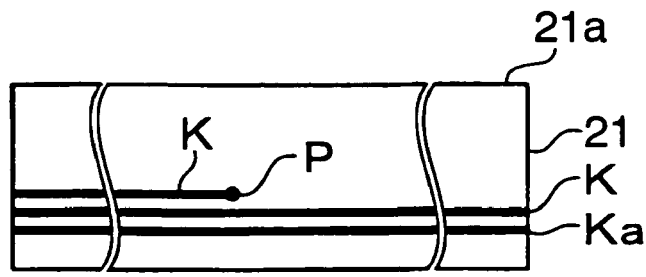
FIGS. 12A to 12C are cross sectional views explaining another dicing process of the wafer.
Figure 12B:
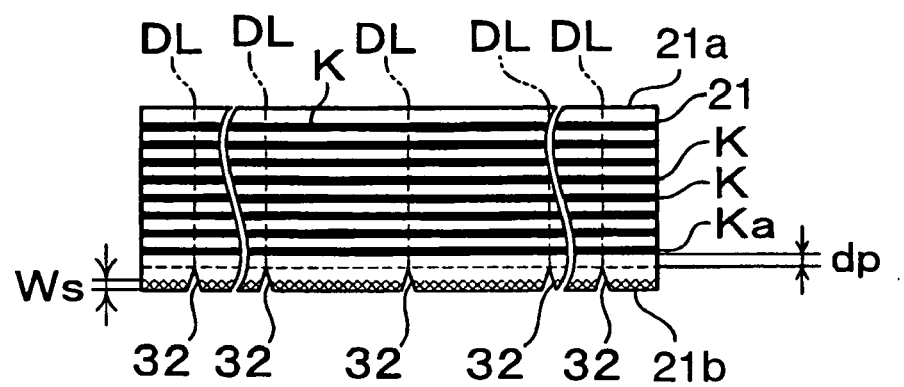
Figure 12C:
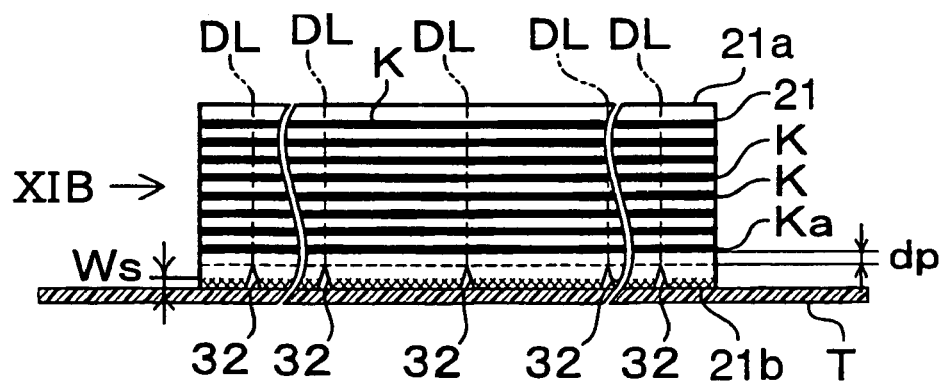

Next, a laser dicing method in accordance with a sixth embodiment mode will be explained on the basis of FIGS. 12A to 12C. FIGS. 12A to 12C illustrate cross-sectional views showing the construction of a semiconductor wafer in each step constituting a dicing process in accordance with this sixth embodiment mode. FIG. 12A shows the semiconductor wafer during a reforming layer forming step. FIG. 12B shows the semiconductor wafer after a groove portion forming step. FIG. 12C shows the semiconductor wafer after an expand tape sticking step.

This sixth embodiment mode differs from the fifth embodiment mode in that the groove portion forming step arranged before the reforming layer forming step in the fifth embodiment mode is arranged after the reforming layer forming step.

As shown in FIG. 12A, in this sixth embodiment mode, with respect to the semiconductor wafer 21 forming no groove portion 32 therein, a laser beam is first irradiated to the surface 21a of the semiconductor wafer 21 by the reforming layer forming step. Thus, reforming layers Ka, K are formed within the semiconductor wafer 21. However, no groove portion 32 formed in this subsequent process exists in an irradiating range of the laser beam L. Accordingly, ablation due to the existence of the groove portion 32 can be prevented.

Namely, when the surface of a semiconductor material exposed in a space exists within the irradiating range of the laser beam L as in a wall portion forming the groove portion 32, a particle due to ablation can be generated by focusing the laser beam L on this surface. However, in this sixth embodiment mode, such a groove portion 32 does not exist in the reforming layer forming step. Accordingly, ablation is prevented and the generation of the particle due to this ablation can be prevented.

When the reforming layers Ka, K are formed within the semiconductor wafer 21 by the reforming layer forming step, a groove portion 32 is next formed on a divisional cutting schedule line DL on the rear face 21b of the semiconductor wafer 21 by a groove portion forming step shown in FIG. 12B. In this groove portion forming step, similar to the above fifth embodiment mode, the groove portion 32 is formed mechanically or chemically. The groove portion 32 is formed in this groove portion forming step such that its tip, i.e., a bottom portion X of the groove portion 32 is located in a position separated by a separating distance dp from the reforming layer Ka.

When the groove portion 32 is formed on the rear face 21b of the semiconductor wafer 21 by the groove portion forming step, similar to the fifth embodiment mode, an expand tape T is stuck to the rear face 21b of the semiconductor wafer 21 by an expand tape sticking step shown in FIG. 12C. This expand tape T is similar to that of each of the first and fifth embodiment modes.

When the expand tape T is stuck by the expand tape sticking step, tensile force is applied from the rear face 21b of the semiconductor wafer 21 by an expand step. This expand step is similar to that explained in the first embodiment mode (FIG. 3C) and the fifth embodiment mode (FIG. 11C), and its illustration and explanation are therefore omitted here. The cross-sectional view showing the construction of the semiconductor wafer 21 seen from a direction arrow XIB shown in FIG. 12C is substantially similar to that shown in FIG. 11B.

Thus, in the sixth embodiment mode, the groove portion forming step (FIG. 12B) exists after the reforming layer forming step (FIG. 12A). Accordingly, in the reforming layer forming step, such a groove portion 32 is not formed yet in the semiconductor wafer 21. Therefore, for example, when the reforming layers Ka, K are formed by irradiating the laser beam L, a wall face of such a groove portion 32 tending to become a cause of ablation is not formed yet. Hence, generation of ablation can be restrained at an irradiating time of the laser beam L. Accordingly, it is possible to prevent the quality reduction of a chip CP in which attachment of a particle due to such ablation is set to a cause.

Seventh Embodiment Mode

Next, a laser dicing method in accordance with a seventh embodiment mode will be explained on the basis of FIGS.

Figure 13A:
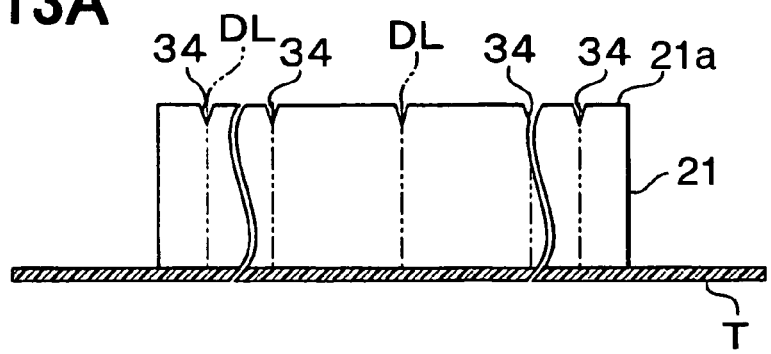
FIGS. 13A to 13D are cross sectional views explaining further another dicing process of the wafer.
Figure 13B:
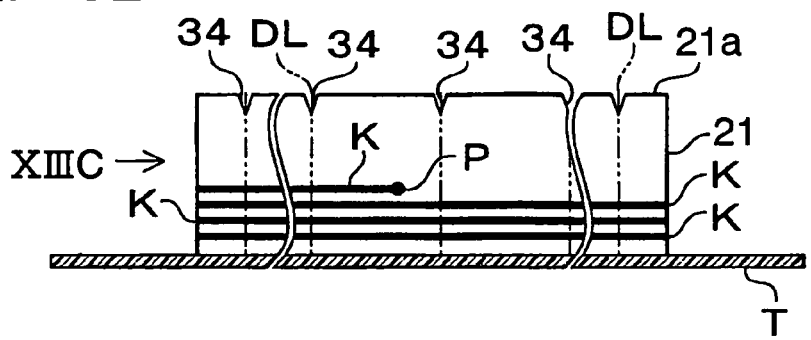
Figure 13C:
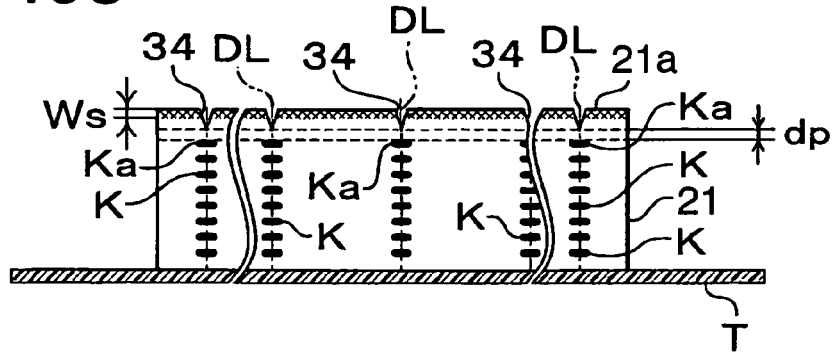
Figure 13D:
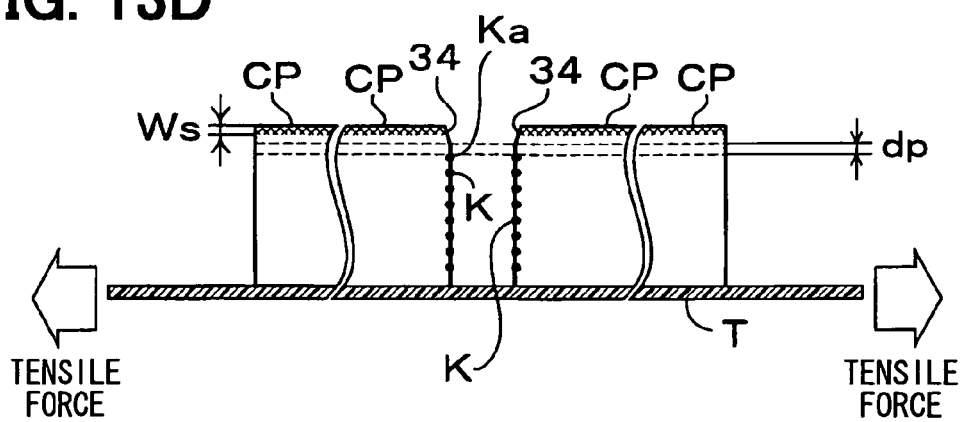

13A to 13D. FIGS. 13A to 13D illustrate cross-sectional views showing the construction of a semiconductor wafer in each step constituting a dicing process in accordance with this seventh embodiment mode. FIG. 13A shows the semiconductor wafer after a groove portion forming step. FIG. 13B shows the semiconductor wafer during a reforming layer forming step. FIG. 13C shows the semiconductor wafer seen from a line arrow XIIIC shown in FIG. 13B. FIG. 13D shows the semiconductor wafer after an expand step.

This seventh embodiment mode differs from the fifth embodiment mode in that the groove portion 32 formed on the rear face 21b of the semiconductor wafer 21 in the fifth embodiment mode is formed as a groove portion 34 on the surface 21a of the semiconductor wafer 21. Therefore, constructional portions substantially similar to those of the fifth embodiment mode are designated by the same reference numerals, and their explanations are omitted. The groove portion 34 formed in this seventh embodiment mode differs from the groove portion 32 formed in each of the fifth and sixth embodiment modes in only reference numeral, and both these groove portions are therefore substantially similar.

As shown in FIG. 13A, in this seventh embodiment mode, a groove portion 34 is first formed on a divisional cutting schedule line DL on the surface 21a of the semiconductor wafer 21 by a groove portion forming step. In this groove portion forming step, similar to the fifth and sixth embodiment modes, the groove portion 34 is formed mechanically or chemically. An expand tape T is stuck to the rear face 21b of the semiconductor wafer 21 carried in this groove portion forming step by a previous process.

When the groove portion 34 is formed on the surface 21a by the groove portion forming step, a reforming layer K is next formed within the semiconductor wafer 21 by irradiating a laser beam to the surface 21a of the semiconductor wafer 21 by a reforming layer forming step shown in FIGS. 13B and 13C. The reforming layer K is formed in this reforming layer forming step so as to be located in a position separated by a separating distance dp from a tip of the groove portion 34 formed by the groove portion forming step shown in FIG. 13A, i.e., from a bottom portion X of the groove portion 32.

When the reforming layer K is formed within the semiconductor wafer 21 by the reforming layer forming step, tensile force is applied from the rear face 21b of the semiconductor wafer 21 by an expand step shown in FIG. 13D. The expand step is similar to that explained in the first embodiment mode (FIG. 3C) and the fifth embodiment mode (FIG. 11C), and its illustration and explanation are therefore omitted here.

Thus, in the seventh embodiment mode, the groove portion 34 is formed on the surface 21a of the semiconductor wafer 21 when tensile force is applied to the rear face 21b of the semiconductor wafer 21 toward the diametrical outside. Thus, crack generation and its growth are promoted by setting a bottom portion X of the groove portion 32 of the rear face 21b side difficult to be applied by the tensile force to a starting point in comparison with the rear face 21b easily applied by the tensile force. Hence, it particularly effectively acts when a range for forming no reforming layers Ka, K is gathered on the surface 21a side. Accordingly, stable divisional cutting can be performed and the quality reduction of a separated chip CP can be prevented even in the semiconductor wafer 21 in which the range for forming no reforming layers Ka, K is gathered in a surface layer Ws of the surface 21a on the side opposed to the rear face 21b applied by tensile force.

The groove portion 34 can correspond to "a groove", and the tensile force can correspond to "external force".

Eighth Embodiment Mode

Figure 14A:
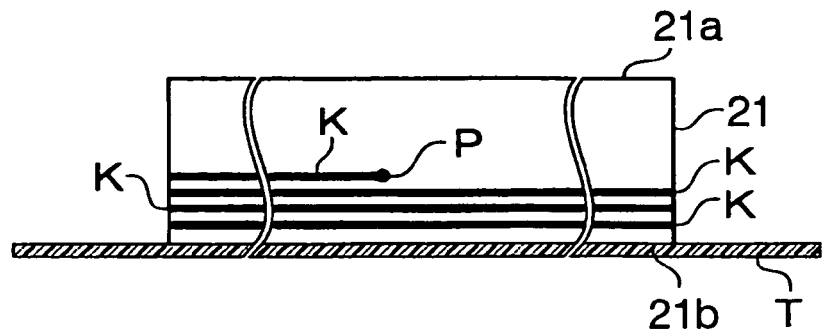
FIGS. 14A to 14C are cross sectional views explaining another dicing process of the wafer.
Figure 14B:
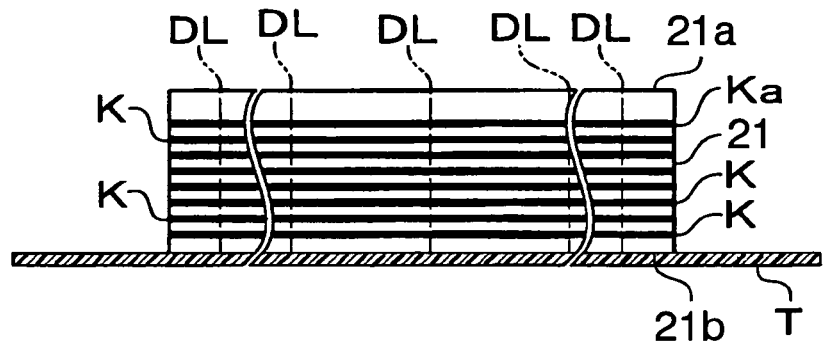
Figure 14C:
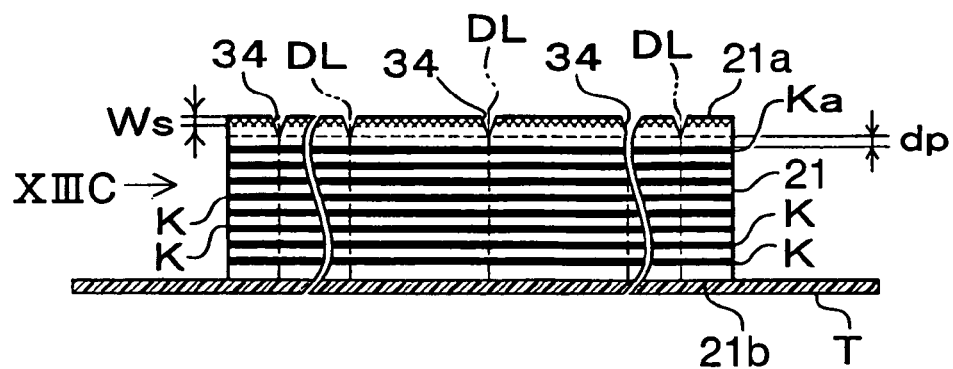

Next, a laser dicing method in accordance with an eighth embodiment mode will be explained on the basis of FIGS. 14A to 14C. FIGS. 14A to 14C illustrate cross-sectional views showing the construction of a semiconductor wafer in each step constituting a dicing process in accordance with this eighth embodiment mode. FIG. 14A shows the semiconductor wafer during a reforming layer forming step. FIG. 14B shows the semiconductor wafer after an expand tape sticking step. FIG. 14C shows the semiconductor wafer after a groove portion forming step.

This eighth embodiment mode differs from the seventh embodiment mode in that the groove portion forming step arranged before the reforming layer forming step in the seventh embodiment mode is arranged after the reforming layer forming step.

As shown in FIG. 14A, in this eighth embodiment mode, with respect to the semiconductor wafer 21 forming no groove portion 34 therein, a laser beam is first irradiated to the surface 21a of the semiconductor wafer 21 by the reforming layer forming step. Thus, similar to the reforming layer forming step (FIG. 12A) of the dicing process explained in the sixth embodiment mode, no groove portion 34 formed in this subsequent process exists in an irradiating range of the laser beam L. Accordingly, ablation due to the existence of this groove portion 34 can be prevented.

When a reforming layer K is formed within the semiconductor wafer 21 by the reforming layer forming step, similar to the fifth embodiment mode, an expand tape T is next stuck to the rear face 21b of the semiconductor wafer 21 by an expand tape sticking step shown in FIG. 14B. This expand tape T is similar to that in each of the first and fifth embodiment modes.

When the expand tape T is stuck by the expand tape sticking step, a groove portion 34 is formed on a divisional cutting schedule line DL on the surface 21a of the semiconductor wafer 21 by the groove portion forming step shown in FIG. 14C. In this groove portion forming step, similar to the fifth to seventh embodiment modes, the groove portion 34 is formed mechanically or chemically. The groove portion 34 is formed in this groove portion forming step such that its tip, i.e., a bottom portion X of the groove portion 32 is located in a position separated by a separating distance dp from a reforming layer Ka.

When the groove portion 34 is formed on the surface 21a of the semiconductor wafer 21 by the groove portion forming step, tensile force is applied from the rear face 21b of the semiconductor wafer 21 by an expand step. This expand step is similar to that shown in FIG. 13D explained in the seventh embodiment mode, and its illustration and explanation are therefore omitted here. The cross-sectional view showing the construction of the semiconductor wafer 21 seen from a direction arrow XIIIC shown in FIG. 14C is substantially similar to that shown in FIG. 13C.

Thus, in the eighth embodiment mode, the groove portion forming step (FIG. 14C) exists after the reforming layer forming step (FIG. 14A). Accordingly, in the reforming layer forming step, such a groove portion 34 is not formed yet in the semiconductor wafer 21. Therefore, for example, when the reforming layers Ka, K are formed by irradiating the laser beam L, a wall face of such a groove portion 34 tending to become a cause of ablation is not formed yet. Accordingly, generation of ablation can be restrained at an irradiating time of the laser beam L. Accordingly, it is possible to prevent the quality reduction of a chip CP in which attachment of a particle due to such ablation is set to a cause.

In each embodiment mode explained above, the sectional shape of the depth direction is illustrated as an example and explained in the V-shape (wedge shape) as groove portions 22, 24, 32, 34 formed on the divisional cutting schedule line DL. Alternatively, but the groove portion may be set to "a groove able to concentrate stress due to external force". For example, variation examples shown in FIGS. 7A to 7D may be also used.

Figure 7A:
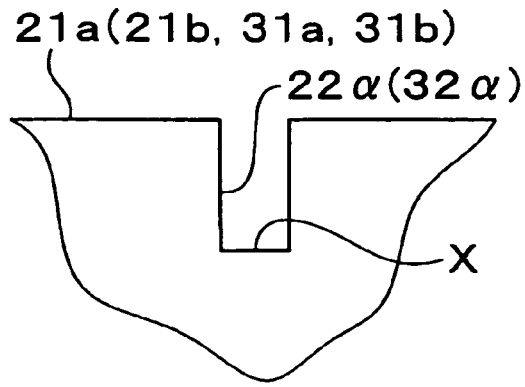
FIGS. 7A to 7D are cross sectional views showing various grooves in the wafer.
Figure 7B:
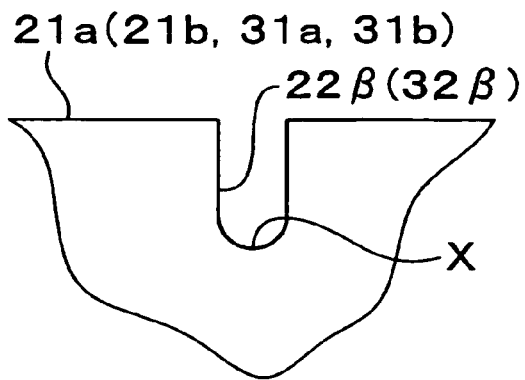
Figure 7C:
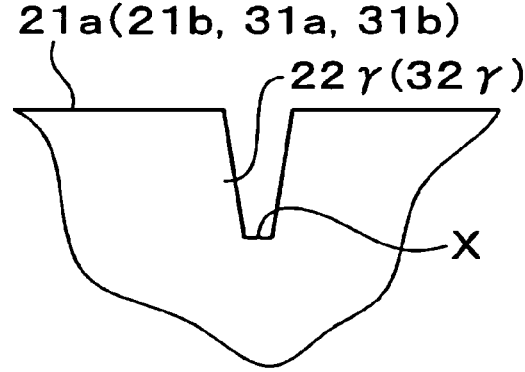
Figure 7D:
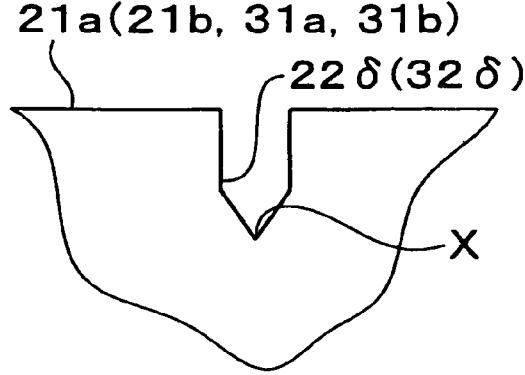

Namely, a groove portion 22α (32α) of a rectangular shape in the sectional shape of the depth direction as shown in FIG. 7A, a groove portion 22β (32β) of a rectangular shape in the sectional shape of the depth direction and a semi-circular shape in the sectional shape of its bottom portion as shown in FIG. 7B, a groove portion 22γ (32γ) of a tapering-off trapezoidal shape in the sectional shape of the depth direction as shown in FIG. 7C, and a groove portion 22δ (32δ) of a rectangular shape in the sectional shape of the depth direction and a triangular shape in the sectional shape of its bottom portion as shown in FIG. 7D may be also set to the "groove" in the present invention. Reference numeral X shown in FIGS. 7A to 7D shows "the bottom portion" of each of these groove portions 22α, 22β, 22γ, 22δ, 32α, 32 β, 32γ and 32δ, and this bottom portion X can correspond to "the bottom portion of the groove" described in claims.

Each of the groove portions 22α, 22β, 22γ, 22δ, 32α, 32β, 32γ and 32δ shown in FIGS. 7A to 7D has an angular portion or a curve portion able to concentrate stress due to external force in the bottom portion X. Accordingly, stress due to tensile force applied from the rear face 21b direction and the surface 21a direction of the semiconductor wafer 21 can be concentrated onto the bottom portions X of these groove portions 22α, 22β, 22γ, 22δ, 32α, 32β, 32γ and 32δ by forming these groove portions on the surface 21a, the rear face 21b or their both faces of the semiconductor wafer 21. Thus, similar to the above groove portions 22, 24, 32, 34, operations and effects similar to those in the above case can be obtained by forming these groove portions 22α, 22β, 22γ, 22δ, 32α, 32β, 32γ and 32δ on the surface 21a and the rear face 21b such that the bottom portion X is connected to the reforming layer K.

Further, in each of the above embodiment modes explained above, a portion formed by combining a straight line continuously extending from one end side of the semiconductor wafer 21 to the other end side in a grating shape is illustrated as an example and explained as groove portions 32, 24 formed on the divisional cutting schedule line DL. However, the present invention is not limited to this example, but the groove portion may be also set to "a groove able to surround the circumference of each semiconductor device (chip CP) lined up and arranged as in checkers". For example, variation examples shown in FIGS. 8A and 8B may be also used.

Figure 8A:
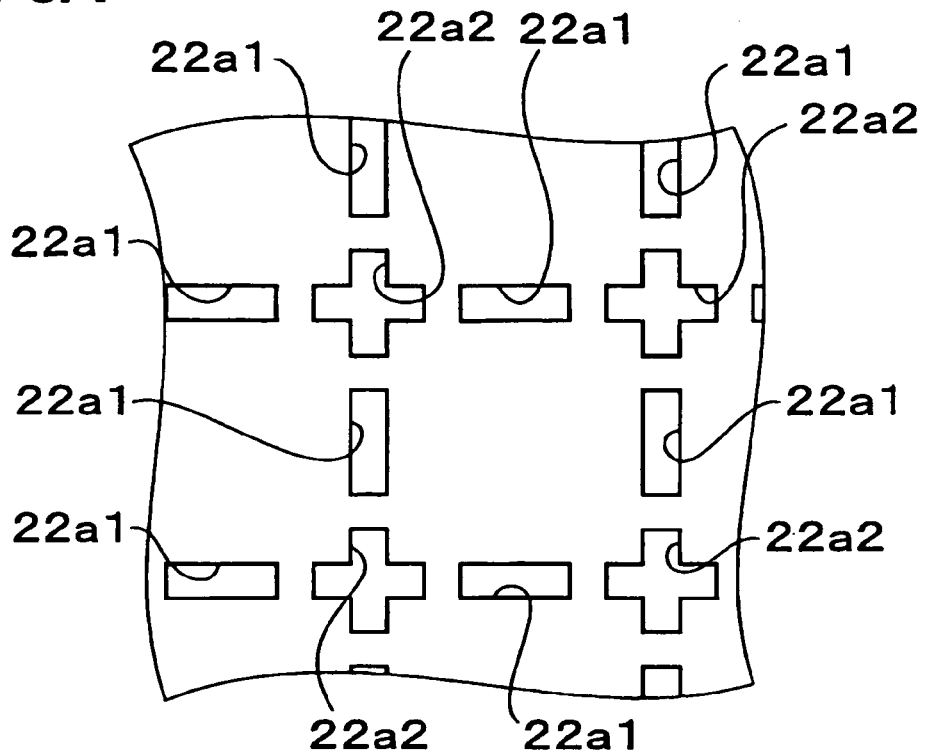
FIGS. 8A and 8B are plan views showing various grooves in the wafer.

Namely, as shown in FIG. 8A, a structure for discontinuously surrounding the circumference of the chip CP in a broken line shape by combining a groove portion 32a1 having "a – (minus)" character shape and a groove portion 32a2 having "a + (plus)" character shape may be also used.

Figure 8B:
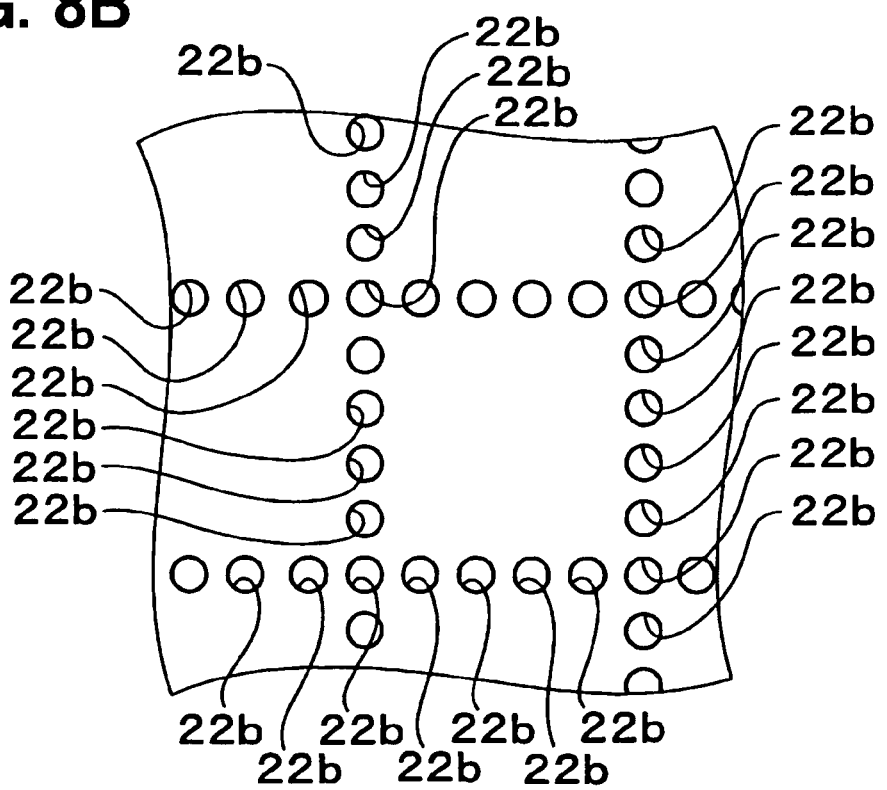

Further, as shown in FIG. 8B, a structure for discontinuously surrounding the circumference of a chip CP in a dotted line shape by arranging hole portions 22b of a circular shape in a columnar shape may be also used.

As shown in FIGS. 8A and 8B, the circumference of the chip CP is surrounded by the groove portions 32a1, 22a2 and the hole portion 22b although this surrounding is discontinuous. Thus, similar to the above groove portions 32, 24, these groove portions 32a1, 22a2 and the hole portion 22b are formed on the surface 21a and the rear face 21b of the semiconductor wafer 21 such that the bottom portion is connected to the reforming layer K. Thus, when through holes of the shape of a perforation of a sewing machine are formed in paper in a columnar shape, the paper can be broken along this column. Further, the above operations and effects can be obtained approximately similarly to formation of the continuous groove portions 32, 24.

Further, in each of the above embodiment modes, the case of the silicon wafer is illustrated as an example and explained as a processing object of the laser dicing. However, the processing object able to be divisionally cut by the laser dicing is not limited to this example. For example, various kinds of substances such as a semiconductor material, glass, crystal or a resin material of plastic, etc. except for silicon are enumerated in this processing object. With respect to these substances, it is also possible to obtain operations and effects similar to those in the case of each of the above embodiment modes.

Ninth Embodiment Mode

Figure 25A:
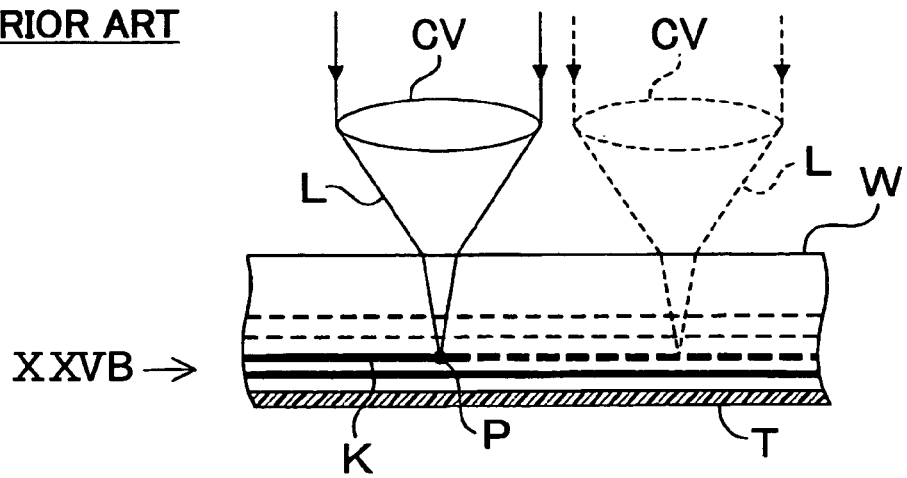
FIGS. 25A to 25C are cross sectional views explaining a laser dicing method according to a prior art.
Figure 25B:
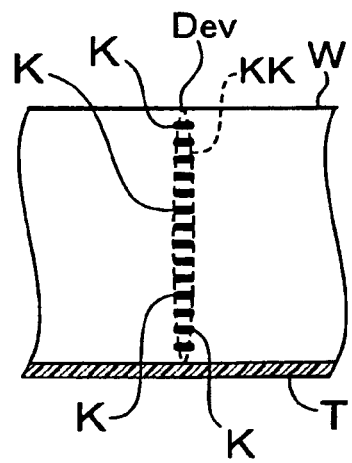

In each of the embodiment modes explained below, the following processes (1) and (2) are set in the dicing process of the wafer. (1) A laser beam L is incident from a surface Wa of the wafer W, and plural reforming layers Ka, etc. using e.g., multiphoton absorption are formed in an overlapping layer shape in the thickness direction of a divisional cutting part Dev (reforming process). Thereafter, (2) a rear face Wb of this divisional cutting part Dev is pressurized and the wafer W is divisionally cut with the reforming layer Ka, etc. as a starting point (divisional cutting process). In particular, the reforming process of (1) is described in detail. The divisional cutting process of (2) is similar to that already explained with reference to FIGS. 25A to 25C. The wafer W can correspond to "a processing object", and the divisional cutting part Dev can correspond to "a part scheduled to be divisionally cut". The rear face Wb can correspond to "a surface of this part".

Figure 17A:
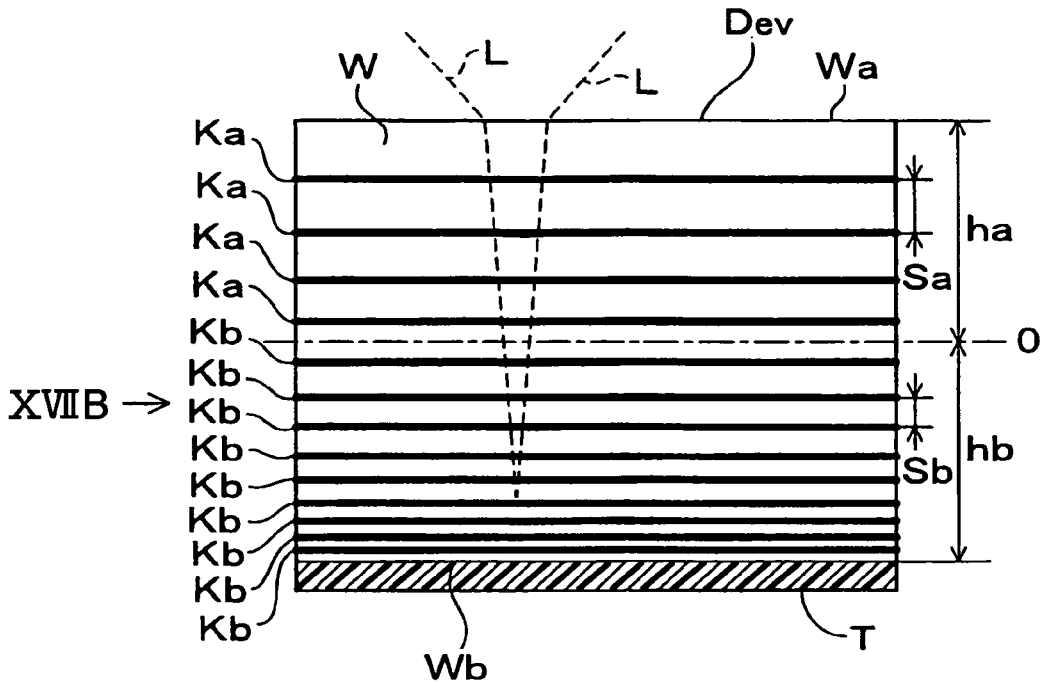
FIG. 17A is a cross sectional view explaining another dicing process of a semiconductor wafer.
Figure 17B:
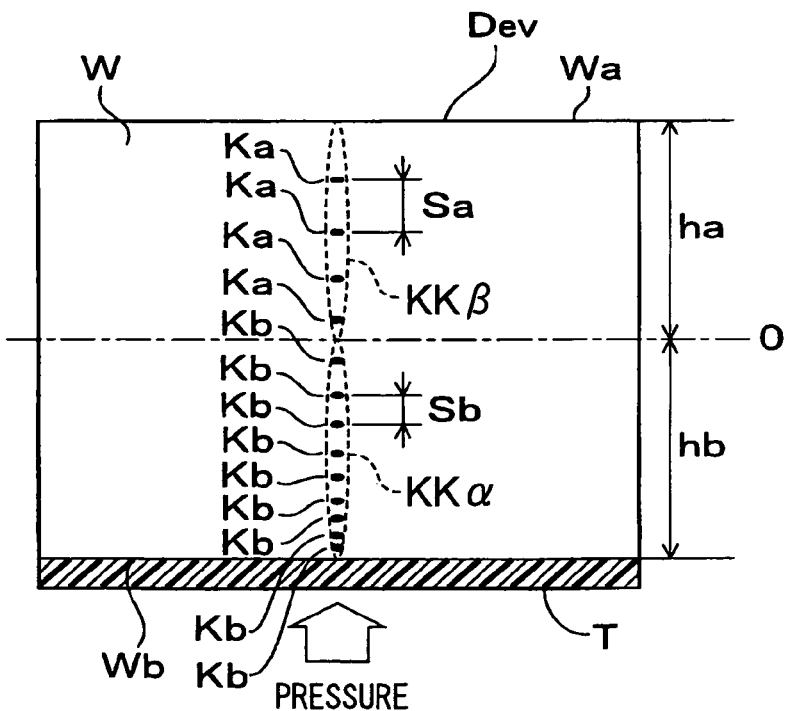
FIG. 17B is a cross sectional view seeing from an arrow XVIIB in FIG. 17A.

As shown in FIGS. 17A and 17B, in a laser dicing method in accordance with a ninth embodiment mode, reforming layers Ka, Kb are formed as follows in the thickness direction of the divisional cutting part Dev (e.g., semiconductor chip Cp) in the dicing process (reforming process) of the wafer W by the incidence of the laser beam L. FIG. 17A shows a position relation and forming intervals of the respective reforming layers Ka, Kb. FIG. 17B shows a section seen from the direction of an arrow XVIIB shown in FIG. 17A.

Namely, as shown in FIG. 17A, the reforming layer Ka is formed at an interval Sa in an incident side range ha located on the incident side of the laser beam L from a center line O of the thickness direction of the divisional cutting part Dev, i.e., on the surface Wa side. The reforming layer Kb is formed at an interval Sb in a pressurizing side range hb located on a pressurized side from the center line O of the thickness direction of the divisional cutting part Dev, i.e., on the rear face Wb side. An expand tape T is stuck to the rear face Wb of the wafer W.

These intervals Sa, Sb are set so as to satisfy with Sa>Sb. Namely, these intervals Sa, Sb are set such that the interval Sb of the reforming layer Kb formed in the pressurizing side range hb becomes narrower than the interval Sa of the reforming layer Ka formed in the incident side range ha. Further, in this embodiment mode, the interval Sb is set to gradually become narrow as the position of the reforming layer Kb formed in the pressurizing side range hb becomes close to the rear face Wb (becomes distant from the surface Wa). The interval Sa is set to gradually become narrow as the position of the reforming layer Ka formed in the incident side range ha becomes distant from the rear face Wb (becomes close to the surface Wa).

In other words, the number Nb of reforming layers Kb formed in the pressurizing side range hb is set to be larger than the number Na of reforming layers Ka formed in the incident side range ha (Na<Nb). The forming number Nb is set to gradually become large as the position of the reforming layer Kb formed in the pressurizing side range hb becomes close to the rear face Wb (becomes distant from the surface Wa). The forming number Na is set to gradually become small as the position of the reforming layer Ka formed in the incident side range ha becomes distant from the rear face Wb (becomes close to the surface Wa).

Thus, the reforming layer Kb is concentratedly formed in the pressurizing side range hb of the side close to the pressurized rear face Wb. Accordingly, as shown in FIG. 17B, it is possible to form a reforming area KKα for raising the density of a crack formed by the reforming layer Kb in the pressurizing side range hb of the rear face Wb most easily influenced by pressurizing force.

In contrast to this, the reforming layer Ka is dispersively formed in the incident side range ha of the distant side on the pressurized rear face Wb. Namely, the reforming layer Ka is dispersively formed in the incident side range ha of the surface Wa difficult to be influenced by pressurizing force even in the divisional cutting part Dev. This is based on the matter that the wafer W can be divisionally cut by a chain of divisional breaking with the reforming layer Kb of the pressurizing side range hb as a starting point even when the crack density of the incident side range ha is set to be lower than the crack density of the pressurizing side range hb (a reforming area KKβ for lowering the density of the crack).

The center line O can correspond to "about the center in the thickness direction". Further, the surface Wa can correspond to "the side opposed to the pressurized side". The incident side range ha can correspond to "a range of the side opposed to the pressurized side". The interval Sa can correspond to each of "an interval of the reforming layer" and "a forming interval of a non-pressurizing side reforming layer". Further, the rear face Wb can correspond to "the pressurized side". The pressurizing side range hb can correspond to "a range of the pressurized side". The interval Sb can correspond to each of "an interval of the reforming layer" and "a forming interval of the pressurizing side reforming layer".

Thus, in accordance with the laser dicing method in this embodiment mode, the forming interval Sb of the reforming layer Kb located in the pressurizing side range hb is set to be narrower than the forming interval Sa of the reforming layer Ka located in the incident side range ha on the side opposed to the pressurizing side range hb. Thus, the reforming layer Kb is concentratedly formed in the pressurizing side range hb of the side close to the rear face Wb pressurized in the divisional cutting. Accordingly, although the reforming layer Ka is formed in the incident side range ha of the side distant on the rear face Wb pressurized in the divisional cutting, the divisional cutting can be performed without excessively raising the density of a crack by a chain of divisional breaking in which the pressurizing side range hb of the side close to the rear face Wb is set to a starting point. Accordingly, proper divisional cutting can be performed while the number of reforming layers Ka is reduced in comparison with a case for forming the reforming layers Ka, Kb in the thickness direction of the divisional cutting part Dev as much as possible.

Tenth Embodiment Mode

Figure 18A:
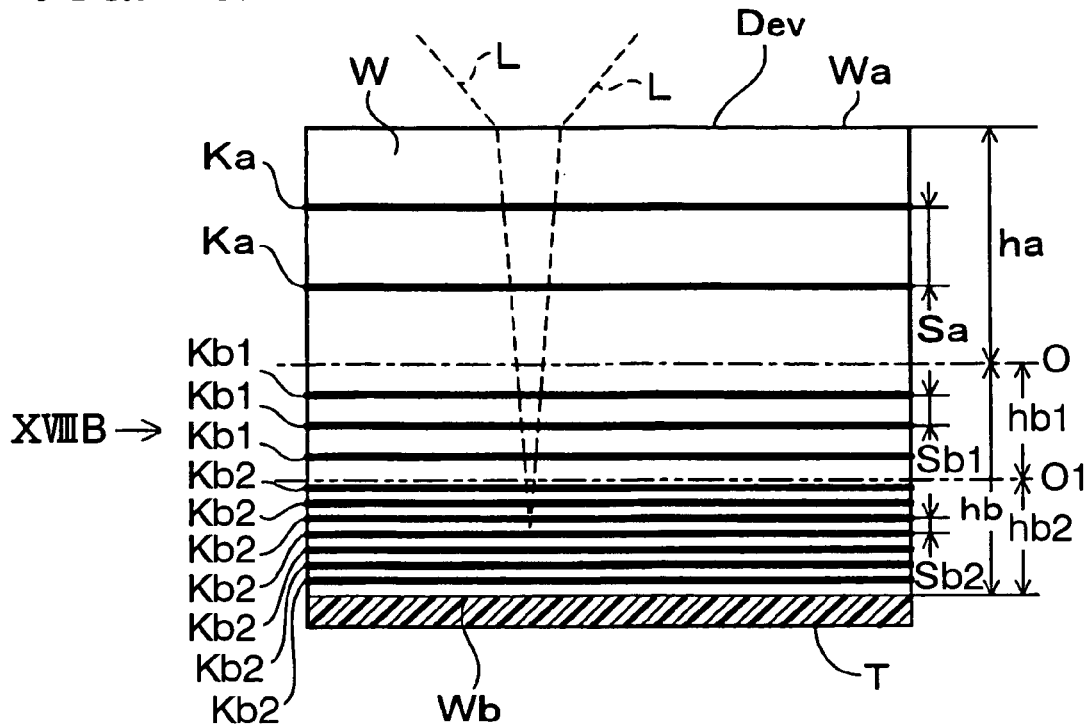
FIG. 18A is a cross sectional view explaining further another dicing process of a semiconductor wafer.
Figure 18B:
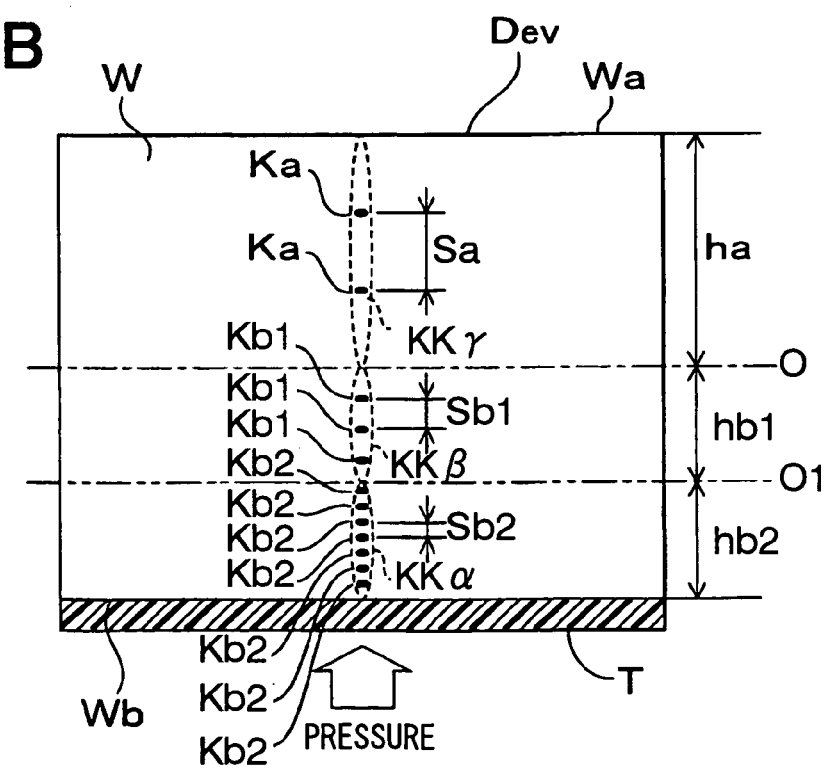
FIG. 18B is a cross sectional view seeing from an arrow XVIIIB in FIG. 18A.

Next, a laser dicing method in accordance with a tenth embodiment mode will be explained on the basis of FIGS. 18A and 18B. FIG. 18A shows a position relation and forming intervals of the respective reforming layers Ka, Kb. FIG. 18B shows a section seen from the direction of an arrow XVIIIB shown in FIG. 18A. The substantially same constructional portions as FIGS. 17A and 17B explained in the ninth embodiment mode are designated by the same reference numerals.

As shown in FIGS. 18A and 18B, in the laser dicing method in accordance with this embodiment mode, a reforming layer Ka is formed at an interval Sa in an incident side range ha, and a reforming layer Kb is formed at an interval Sb in a pressurizing side range hb. These intervals are set to satisfy with Sa>Sb. These constructions are similar to those of the above laser dicing method. However, the laser dicing method differs from the laser dicing method in that the pressurizing side range hb is divided into two ranges (divisional line O1), and reforming layers Kb1, Kb2 of different forming intervals are formed in the respective predetermined ranges hb1, hb2.

Namely, as shown in FIG. 18A, with respect to the forming interval Sb of the reforming layer Kb, when it is supposed that the pressurizing side range hb of the rear face Wb side is approximately divided into two ranges, the reforming layer Kb2 located in the predetermined range hb2 close to the rear face Wb side among these two divided ranges is set to be narrower than the reforming layer Kb1 located in the predetermined range hb1 distant on the rear face Wb side. In other words, the number Nb2 of reforming layers Kb2 formed in the predetermined range hb2 is set to be larger than the number Nb1 of reforming layers Kb' formed in the predetermined range hb1. In this embodiment mode, the pressurizing side range hb is set to be "approximately divided into two ranges", but may be also divided into three ranges, four ranges, etc. if the divisional number is two or more, i.e., plural. In this case, as the respective divided ranges become close to the rear face Wb side, the forming interval of the reforming layer Kb is set to be narrow (the forming number of the reforming layer Kb is increased). As the respective divided ranges become close to the surface Wa side, the forming interval of the reforming layer Kb is set to be wide (the forming number of the reforming layer Kb is reduced).

Thus, the reforming layer Kb2 of the predetermined range hb2 close to (distant on the surface Wa side from the divisional line O1) the rear face Wb side from the divisional line O1 is concentratedly formed in the divisional cutting part Dev. Accordingly, it is possible to limitedly raise the crack density of the predetermined range hb2 close to the rear face Wb side applied by pressurizing force (a reforming area KKα for raising the crack density). In contrast to this, the reforming layer Kb1 of the predetermined range hb1 distant (close to the surface Wa from the divisional line O1) on the rear face Wb side from the divisional line O1 is dispersively formed in comparison with the reforming layer Kb2 even in the reforming layer Kb located in the pressurizing side range hb of the rear face Wb side from the center line O of about the center of the thickness direction of the divisional cutting part Dev (a reforming area KKβ for slightly lowering the crack density). Since the incident side range ha is set to the interval Sa (>Sb), the incident side range ha is set as a reforming area KKγ for most lowering the crack density. Accordingly, proper divisional cutting can be performed while the number of reforming layers Kb is reduced in comparison with a case for forming the reforming layer Kb (kb1, kb2) of the pressurizing side range hb of the rear face Wb side as much as possible.

The predetermined range hb1 can correspond to "a range distant on the pressurized side", and the predetermined range hb2 can correspond to "a range close to the pressurized side". Further, the reforming layer Kb1 can correspond to "a pressurizing side separating reforming layer", and the reforming layer Kb2 can correspond to "a pressurizing side proximity reforming layer". Further, Sb1 can correspond to "a forming interval of the pressurizing side separating reforming layer", and Sb2 can correspond to "a forming interval of the pressurizing side proximity reforming layer".

Here, an explanation will be made on the basis of FIGS. 19A to 20D with respect to an experimental result in which it is confirmed that the wafer W can be divisionally cut by a chain of divisional breaking with the reforming layer Kb of the pressurizing side range hb as a starting point even when the crack density of the incident side range ha is set to be lower than the crack density of the pressurizing side range hb. FIGS. 19A to 20D show divisional cutting ratios (probability able to properly perform the divisional cutting) when the wafer W (silicon wafer) of 2625 μm in thickness is divisionally cut to 5 mm in square.

As shown in FIGS. 19A to 19D, when the number of reforming layers Ka, Kb formed in the wafer W is set to 20, the relation of interval Sa and number Na of the reforming layer Ka formed in the incident side range ha, and interval Sb and number Nb of the reforming layer Kb formed in the pressurizing side range hb is set to the following three combinations. Namely, this relation is set to Sa>Sb and Na<Nb as shown in (a) of FIGS. 19A to 19D, and Sa=Sb and Na=Nb as shown in (b) of FIGS. 19A to 19D, and Sa<Sb and Na>Nb as shown in (c) of FIGS. 19A to 19D. The forming interval of each of the reforming layers Ka, Kb is set so as to averagely become 30 μm.

When the wafer forming each of the reforming layers Ka, Kb in this way is pressurized from its rear face Wb and is tried so as to be divisionally cut into semiconductor chips of 5 mm in square (5 mm in four directions), it has been experimentally confirmed by the inventors that the wafer is divisionally cut in the divisional cutting ratio as shown in FIGS. 19A to 19D. In accordance with this experiment, when the respective reforming layers Ka, Kb are formed by setting Sa>Sb and Na<Nb as shown in FIG. 19B, it is understood that a divisional cutting ratio of 100% is attained. However, when the respective reforming layers Ka, Kb are formed by setting Sa=Sb and Na=Nb as in FIG. 19C, it is understood that the divisional cutting ratio is about 95% at best. Further, when the respective reforming layers Ka, Kb are formed by setting Sa<Sb and Na>Nb as shown in FIG. 19D, it is understood that no proper divisional cutting can be performed and the divisional cutting ratio is 0%. The setting example shown in FIG. 19B corresponds to the laser dicing method (FIGS. 17A and 17B) in accordance with this ninth embodiment mode.

Thus, it has been confirmed from the experimental result shown in FIGS. 19A to 19D that the divisional cutting ratio of 100% can be secured in the case of the laser dicing method in accordance with this embodiment mode (FIG. 19B). In contrast to this, when the reforming layer is approximately set to an equal interval in the thickness direction of the divisional cutting part Dev but its interval is not appropriate (FIG. 19C), it has been confirmed that the divisional cutting ratio is about 95% at best and no divisional cutting ratio of 100% can be obtained. Further, it has been confirmed that it is difficult to perform proper divisional cutting when pressurizing force applied in the divisional cutting is applied on the side (surface Wa) opposed to the wafer even when the respective reforming layers Ka, Kb are set as shown in FIGS. 17A and 17B.

Next, as shown in FIGS. 20A to 20D, when the number of reforming layers Ka, Kb formed in the wafer W is set to 18 or 20, the relation of interval Sa and number Na of the reforming layer Ka formed in the incident side range ha, interval Sb1 and number Nb1 of a reforming layer Kb1 located in a predetermined range hb1 distant on the rear face Wb among two ranges provided by dividing the pressurizing side range hb into these two ranges, and interval Sb2 and number Nb2 of a reforming layer Kb2 located in a predetermined range hb2 close to the rear face Wb is set to the following three combinations. Namely, this relation is respectively set to Sa>Sb1>Sb2 (Sb1<Sb2 in one portion hx) and Na<Nb1<Nb2 (Nb1>Nb2 in one portion hx) as shown in FIG. 20B, Sa=Sb1>Sb2 and Na=Nb1<Nb2 as shown in FIG. 20C, and Sa>Sb1>Sb2 and Na<Nb1<Nb2 as shown in FIG. 20D. The forming intervals of the respective reforming layers Ka, Kb are set so as to averagely become 30 μm.

When the wafer forming the respective reforming layers Ka, Kb in this way is pressurized from its rear face Wb and is tried so as to be divisionally cut into semiconductor chips of 5 mm in square (5 mm in four directions), it has been experimentally confirmed by the inventors of the present application that the wafer is divisionally cut in the divisional cutting ratio as shown in FIGS. 20A to 20D. In accordance with this experiment, it is understood that a divisional cutting ratio of 100% is attained when the respective reforming layers Ka, Kb, Kb1, Kb2 are formed by setting Sa>Sb1>Sb2 and Na<Nb1<Nb2 as shown in FIGS. 20A to 20D. However, it is understood that the divisional cutting ratio is about 88% at best when the respective reforming layers Ka, Kb, Kb1, Kb2 are formed by setting Sa=Sb1>Sb2 and Na=Nb1<Nb2 as shown in FIG. 20C. Further, it is understood that no proper divisional cutting can be performed and the divisional cutting ratio becomes 0% when the respective reforming layers Ka, Kb, Kb1, Kb2 are formed by setting Sa>Sb1>Sb2 (Sb1<Sb2 in one portion hx) and Na<Nb1<Nb2 (Nb1>Nb2 in one portion hx) as shown in FIG. 20B. The setting example shown in FIG. 20D corresponds to the laser dicing method (FIGS. 18A and 18B) in accordance with this tenth embodiment mode.

Thus, it has been confirmed from the experimental result shown in FIGS. 20A to 20D that the divisional cutting ratio of 100% can be secured in the case of the laser dicing method in accordance with this embodiment mode (FIG. 20D). In contrast to this, when a narrow reforming layer Kb2 of interval Sb2 is formed in the predetermined range hb2 of the rear face Wb pressurized to the divisional cutting part Dev in the divisional cutting, but no forming interval of another range (predetermined range hb1) is appropriate (FIG. 20C), it has been confirmed that the divisional cutting ratio is about 88% at best and no divisional cutting ratio of 100% can be obtained. Further, it has been confirmed that it is difficult to perform proper divisional cutting when the respective reforming layers Ka, Kb, Kb1, Kb2 are set as shown in FIGS. 18A and 18B but the range of a wide forming interval exists in one portion hx of a range (predetermined range hb2) near the rear face Wb able to have a most influence of pressurizing force applied in the divisional cutting.

Eleventh Embodiment Mode

Figure 21A:
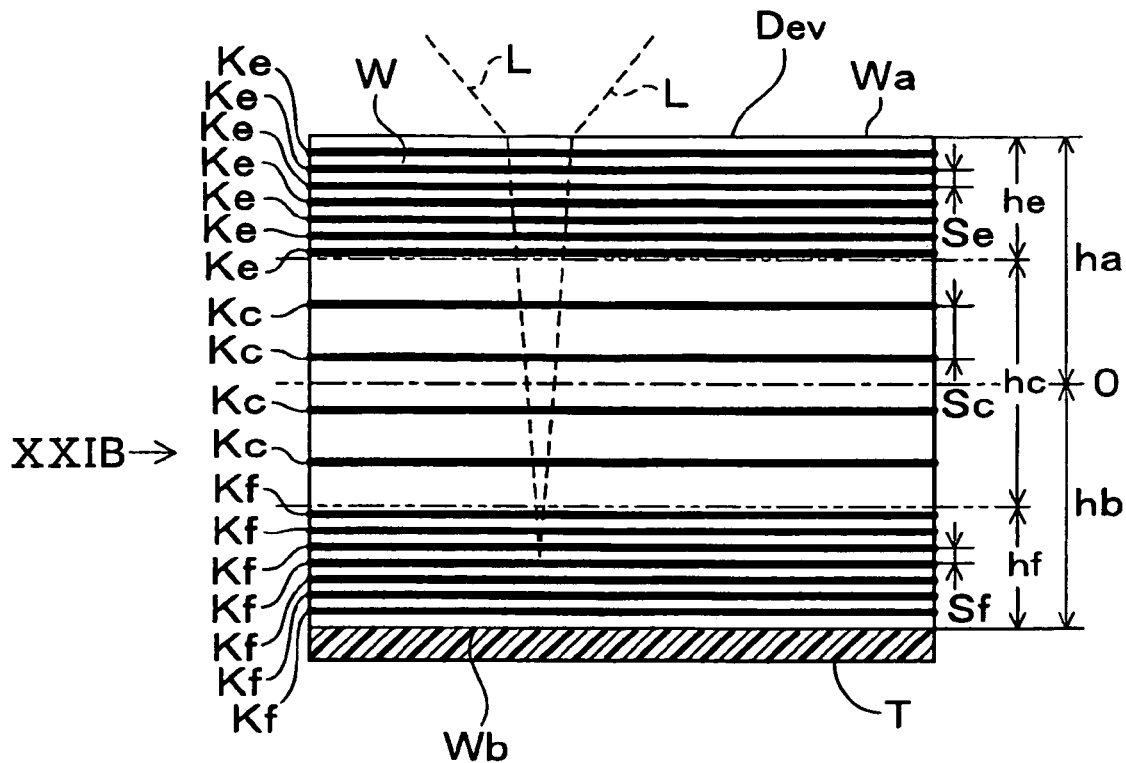
FIG. 21A is a cross sectional view explaining another dicing process of a semiconductor wafer.
Figure 21B:
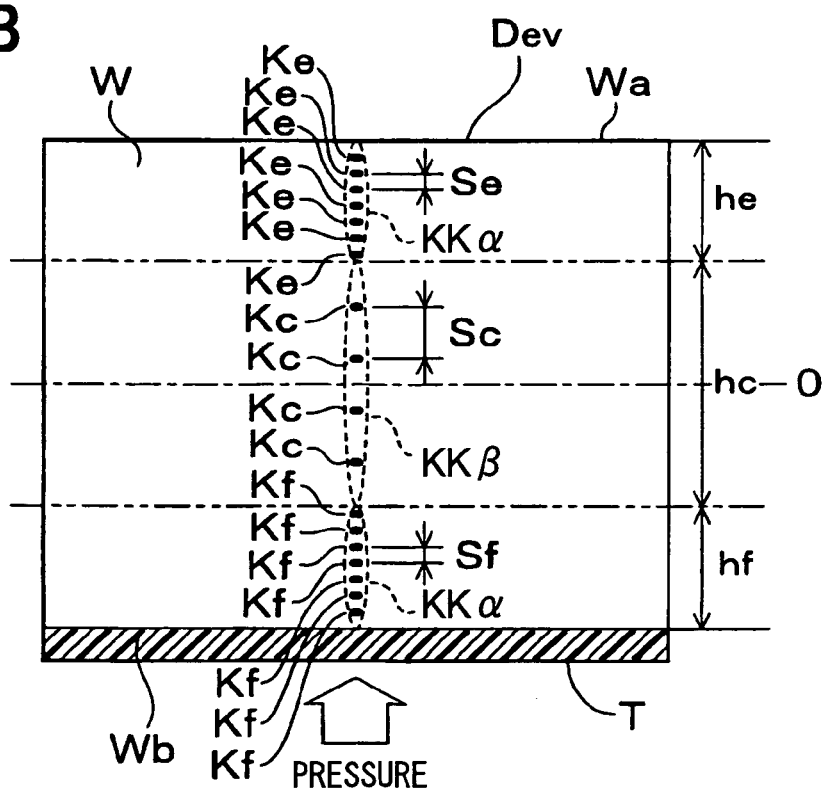
FIG. 21B is a cross sectional view seeing from an arrow XXIB in FIG. 21A.

Subsequently, a laser dicing method in accordance with an eleventh embodiment mode will be explained on the basis of FIGS. 21A and 21B. FIG. 21A shows a position relation and forming intervals of respective reforming layers Kc, Ke, Kf. FIG. 21B shows a section seen from the direction of an arrow XXIB shown in FIG. 21A. The substantially same constructional portions as FIGS. 17A and 17B explained in the ninth embodiment mode are designated by the same reference numerals.

As shown in FIGS. 21A and 21B, in the laser dicing method in accordance with this embodiment mode, the forming interval Sc of the reforming layer Kc located in a predetermined range hc from a center line O of about the center of the thickness direction of the divisional cutting part Dev is set to be wider than the reforming layer Kf located on the rear face Wb side from this predetermined range hc, and the reforming layer Ke located on the surface Wa side on the side opposed to the rear face Wb side from this predetermined range hc. In other words, the number Nc of reforming layers Kc formed in the predetermined range hc is set to be smaller than the number Nf of reforming layers Kf formed in a predetermined range hf and the number Ne of reforming layers Ke formed in a predetermined range he. In this embodiment mode, forming interval Sf of reforming layer Kf=forming interval Se of reforming layer Ke (about the same interval) is set, but forming interval Sf<forming interval Se may be also set. Namely, forming interval Sf of reforming layer Kf forming interval Se of reforming layer Ke, or the number Nf of reforming layers Kf≧the number Ne of reforming layers Ke is set.

Thus, in the divisional cutting part Dev, in comparison with the reforming layer Kc located in the predetermined range hc from the center line O and lying in a low range of possibility applied by pressurizing force, it is possible to concentrate the reforming layer Kf and the reforming layer Ke located in predetermined ranges hf, he except for the predetermined range hc and lying in a high range (the rear face Wb and the surface Wa of the divisional cutting part Dev) of possibility applied by pressurizing force (a reforming area KKα for raising the crack density). Since the forming interval of the predetermined range hc is Sc (>Sf, Se), it is set as a reforming area KKβ for lowering the crack density. Accordingly, in comparison with a case for forming the reforming layers Kc, Kf, Ke in the thickness direction of the divisional cutting part Dev as much as possible, proper divisional cutting can be performed while the number of reforming layers Kc is reduced. Further, the proper divisional cutting can be also performed when pressurizing force is applied from both faces (surface Wa and rear face Wb) of the divisional cutting part Dev in different timing, and it is impossible to set that pressurizing force is applied from any one of faces (surface Wa and rear face Wb) of the divisional cutting part Dev in the divisional cutting, etc.

The predetermined range hc can correspond to "a predetermined range from about the center in the thickness direction". Further, the reforming layer Kc can correspond to "a central side reforming layer". The reforming layer Kf can correspond to "a center exterior pressurizing side reforming layer". Further, the reforming layer Ke can correspond to "a center exterior non-pressurizing side reforming layer". Further, Sc can correspond to "a forming interval of the central side reforming layer". Sf can correspond to "a forming interval of the center exterior pressurizing side reforming layer". Se can correspond to "a forming interval of the center exterior non-pressurizing side reforming layer".

Figure 25C:
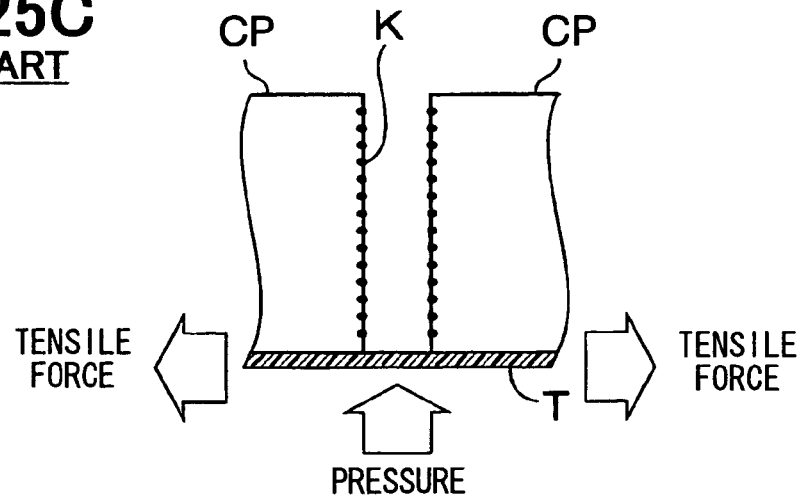

In the ninth to eleventh embodiment modes explained above, as mentioned above, the divisional cutting process of (2) is set similarly to that shown in FIG. 25C. However, the present invention is not limited to this case if "the surface of a part scheduled to be divisionally cut is pressurized". For example, the divisional cutting process may be also set to that shown in FIGS. 23A and 23B.

Figure 23A:
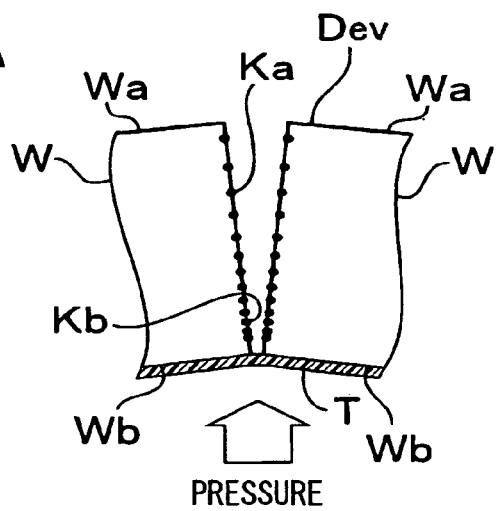
FIGS. 23A and 23B are cross sectional views of the wafer explaining various separating processes of a semiconductor wafer.
Figure 23B:
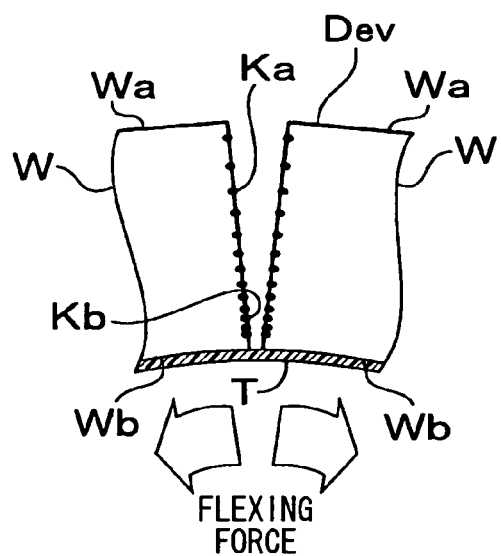

FIGS. 23A and 23B illustrate a structure in which reforming layers Ka, Kb are formed as the wafer W divisionally cut by the divisional cutting process by the laser dicing method in accordance with the ninth embodiment mode. Alternatively, the divisional cutting process shown in FIGS. 23A and 23B can be also applied with respect to a structure for forming reforming layers Ka, Kb1, Kb2 by the laser dicing method in accordance with the tenth embodiment mode, and a structure for forming reforming layers Ke, Kc, Kf, etc. by the laser dicing method in accordance with the eleventh embodiment mode.

Namely, as shown in FIG. 23A, with respect to an expand tape T stuck to the rear face Wb of the wafer W, pressurizing force generated by an unillustrated pressurizing device is applied so as to project the vicinity of the divisional cutting part Dev upward from a non-sticking side of this expand tape T. Thus, the divisional cutting part Dev is concentratedly pressurized even when no expand tape T is pulled in an outside direction of the wafer W. Hence, a crack can be efficiently generated in the reforming layer. Accordingly, the wafer W is easily divisionally cut in the divisional cutting part Dev.

Further, as shown in FIG. 23B, flexing force is applied to a circumferential edge portion of the expand tape T or the wafer W so as to project the vicinity of the divisional cutting part Dev on a sticking side of the expand tape T stuck to the rear face Wb of the wafer W, and the wafer W stuck to the expand tape T is flexed. Thus, the divisional cutting part Dev is approximately uniformly pressurized by such flexure even when no expand tape T is pulled in the outside direction of the wafer W. Accordingly, stable divisional cutting of the wafer W can be performed.

Figure 24:
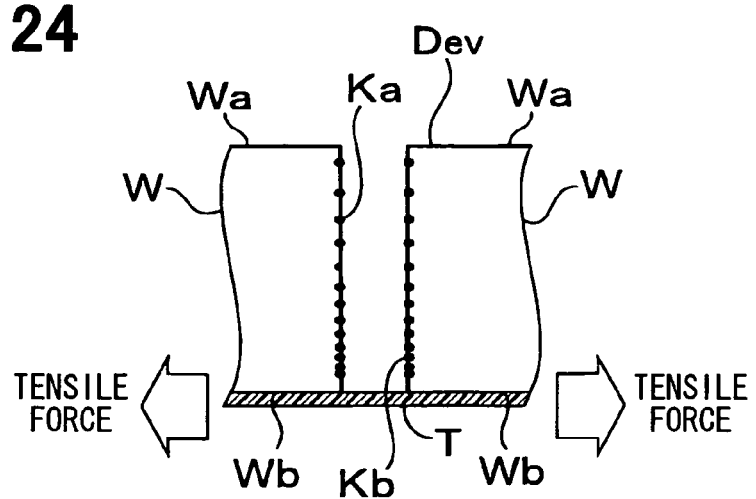
FIG. 24 is a cross sectional views of the wafer explaining another separating process of a semiconductor wafer.

As shown in FIG. 24, the wafer W can be also divisionally cut by merely pulling the expand tape T stuck to the rear face Wb of the wafer W in the outside direction of the wafer W. Namely, the expand tape T sticking the wafer W thereto is pulled by tensile force directed to the outside direction so that external force directed to the diametrical outside of the wafer W is also applied to the wafer W stuck to the expand tape T. Therefore, since force for separating the reforming layers of the divisional cutting part Dev at the boundary in directions opposed to each other is applied, the wafer W can be also divisionally cut by such tension of the expand tape T.

In the ninth to eleventh embodiment modes explained above, as can be respectively seen from FIGS. 17B, 18B and 21B, examples for forming the reforming areas KKα, KKβ, etc. by only one stripe in a line stripe in a planar direction of the wafer W have been explained. However, as shown in FIGS. 22A and 22B, the reforming areas KKα, KKβ, etc. may be also constructed so as to be formed in plural stripes, e.g., three stripes in a line stripe in the planar direction of the wafer W as each of modified examples of these examples.

Figure 22A:
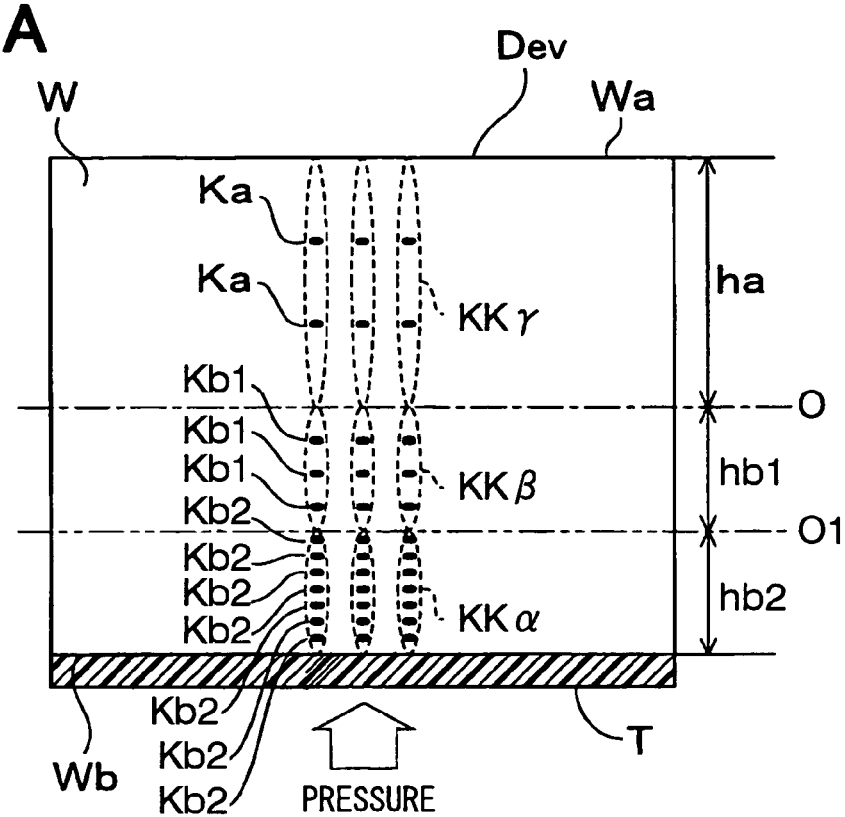
FIGS. 22A and 22B are cross sectional views of the wafer explaining various dicing processes of a semiconductor wafer.
Figure 22B:
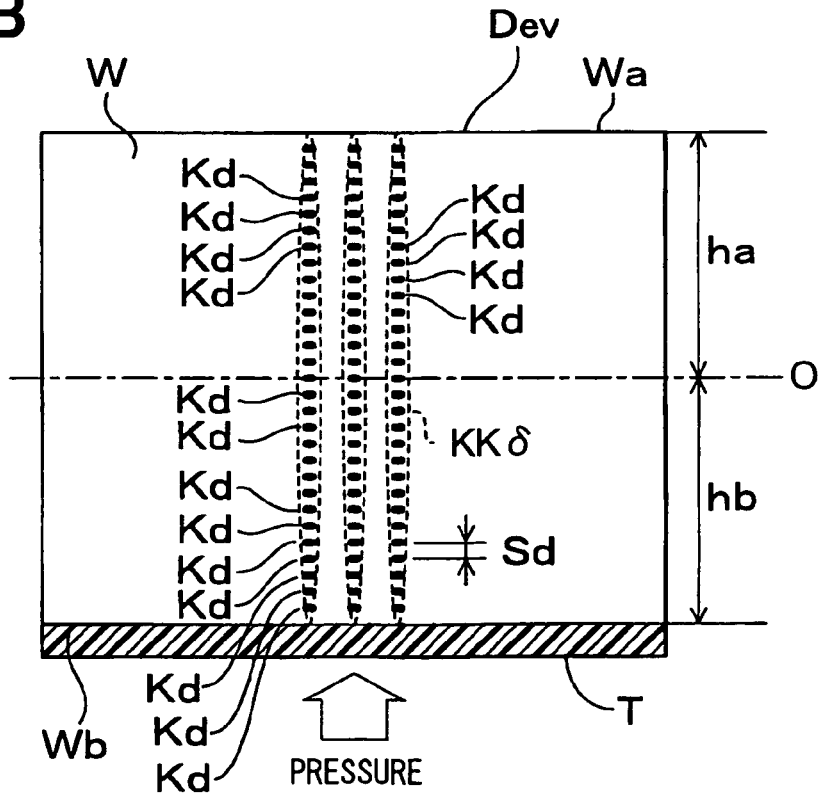

FIG. 22A shows an example for forming the reforming areas KKα, KKβ, KKγ of three stripes by the laser dicing method in accordance with the tenth embodiment mode. Further, FIG. 22B shows an example in which a reforming area KKδ constructed by forming a reforming layer Kd located at an interval Sd at an equal interval in the thickness direction of the divisional cutting part Dev is arranged in three stripes.

Thus, the reforming areas KKα, KKβ, KKγ, KKδ are also widely formed in the planar direction of the wafer W by forming the reforming areas KKα, KKβ, KKγ, KKδ in plural stripes in this way. Accordingly, proper divisional cutting can be more reliably performed. Namely, the divisional cutting ratio can be improved.

Further, in the ninth to eleventh embodiment modes explained above, no laser power of the laser beam L irradiated to the divisional cutting part Dev is referred. However, for example, laser power required to form the reforming layer Kb in the pressurizing side range hb may be also set to be greater than laser power required to form the reforming layer Ka in the incident side range ha. Thus, even when incident depth of the laser beam L in the pressurizing side range hb becomes deeper than that in the incident side range ha, laser power is correspondingly increased. Accordingly, it is possible to easily form the reforming layer Kb of the pressurizing side range hb.

In each of the above embodiment modes, the case of the silicon wafer is illustrated as an example and explained as a processing object of the laser dicing. However, the processing object able to be divisionally cut by the laser dicing method is not limited to this example. For example, various kinds of substances such as a semiconductor material, glass, crystal or a resin material of plastic, etc. except for silicon are enumerated in this processing object. With respect to these substances, it is also possible to obtain operations and effects similar to those in the case of each of the above embodiment modes.

Further, in each of the embodiment modes, the case for forming the reforming layer by multiphoton absorption has been illustrated as an example and explained. However, the present invention is not limited to this example, but can be also similarly applied to a case in which the reforming layer is formed by one photon absorption.

Twelfth Embodiment Mode

Figure 26A:
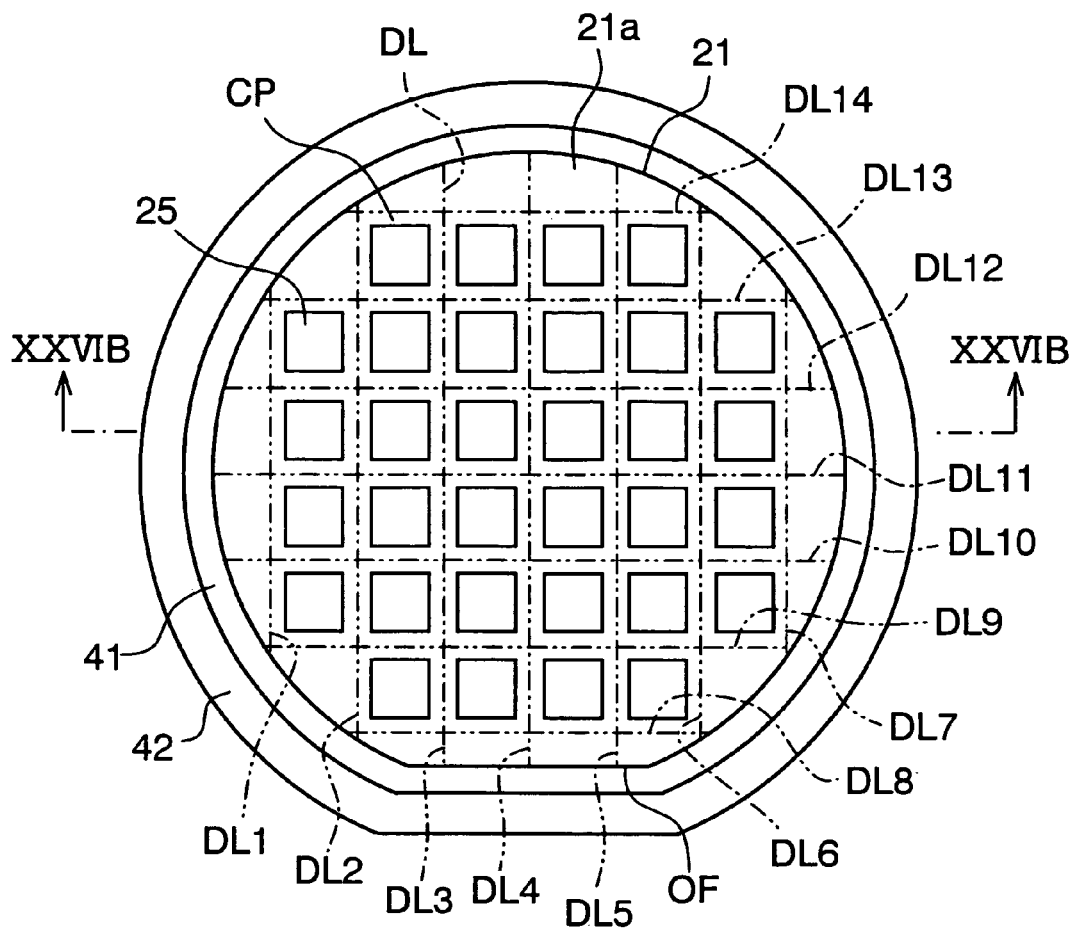
FIG. 26A is a plan view showing a semiconductor wafer.
Figure 26B:
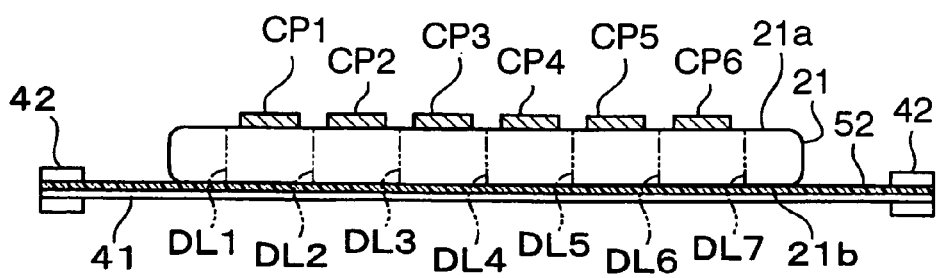
FIG. 26B is a cross sectional view showing the wafer taken along line XXVIB-XXVIB in FIG. 26A.
Figure 27:
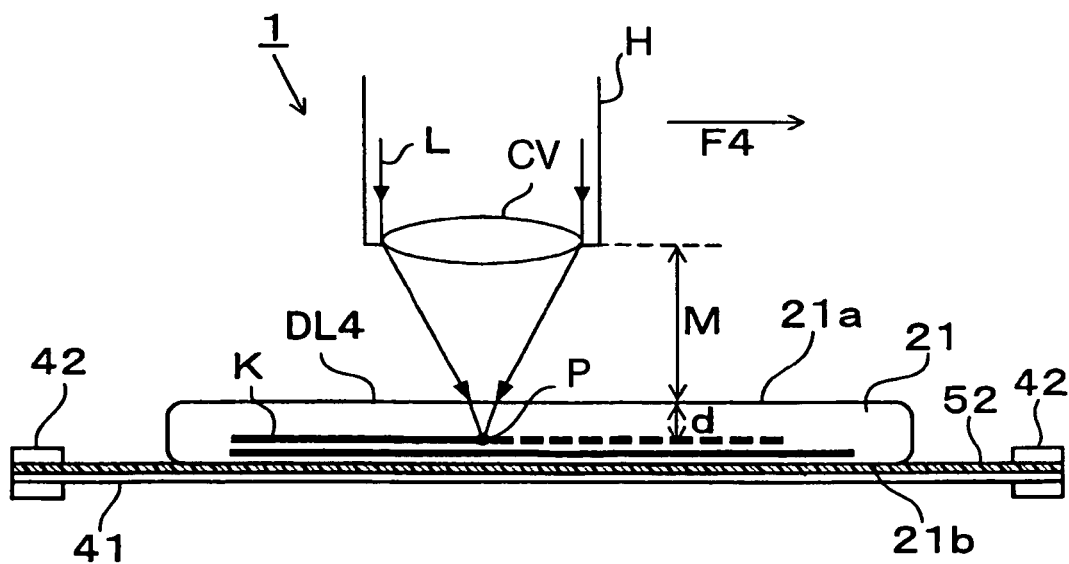
FIG. 27 is a cross sectional view explaining a laser irradiation step.
Figure 29:
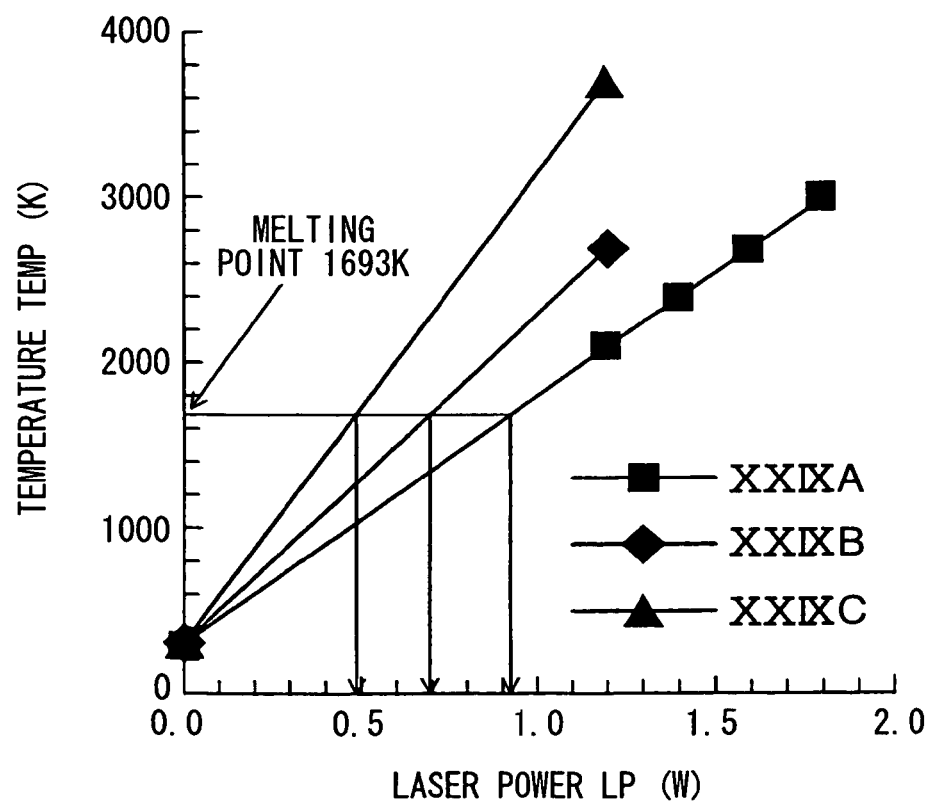
FIG. 29 is a graph showing a relationship between a laser power and a temperature at a focus point in the wafer.
Figure 28:
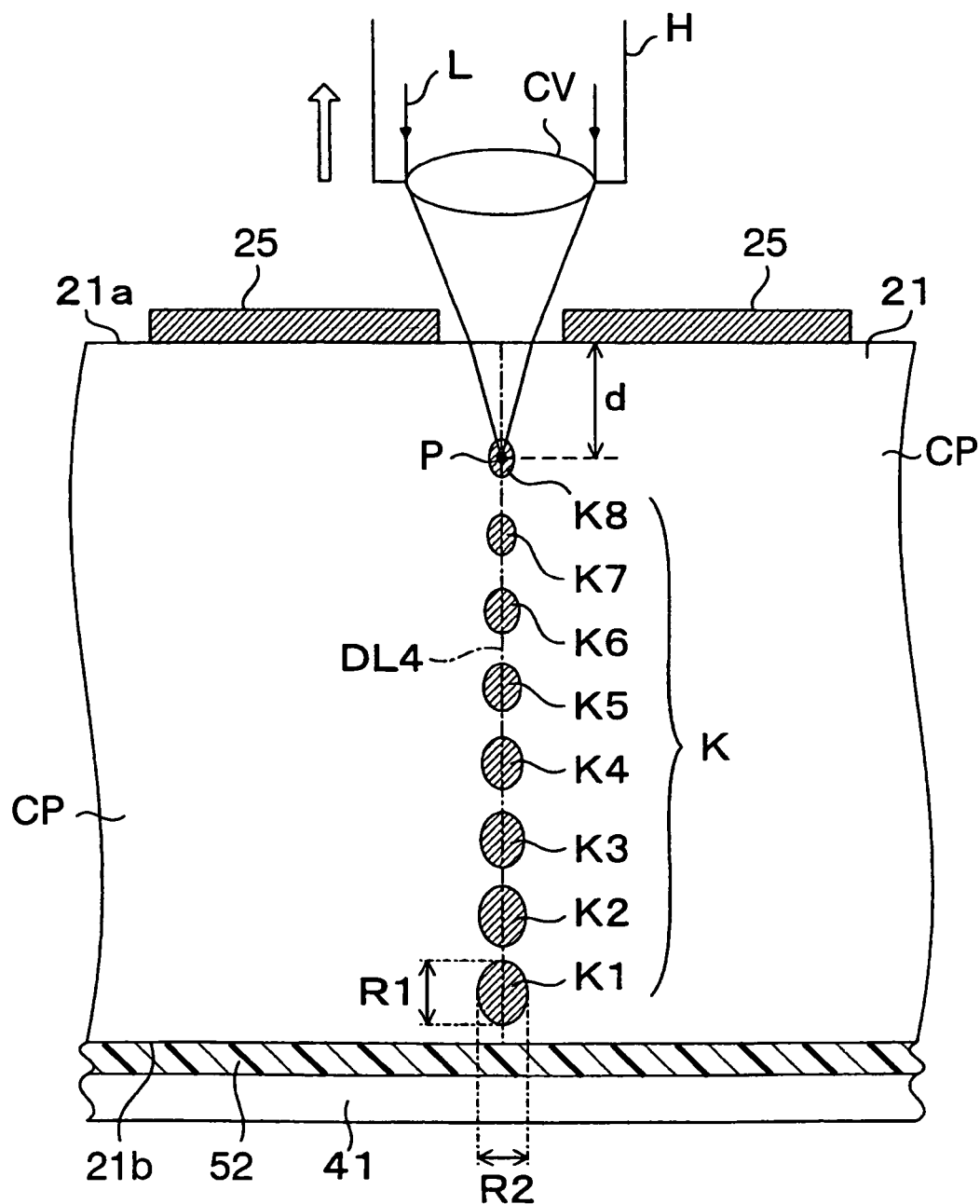
FIG. 28 is a cross sectional view showing a reforming area in the wafer.

A twelfth embodiment mode of a manufacturing method of a semiconductor chip in accordance with this invention will be explained with reference to the drawings. FIGS. 26A and 26B are explanatory views showing the construction of a semiconductor substrate. FIG. 26A is a plan explanatory view of the semiconductor substrate. FIG. 26B is a cross-sectional view seen from an arrow XXVIB-XXVIB of FIG. 26A. FIG. 27 is an explanatory view showing a method for irradiating a laser beam to the semiconductor substrate. FIG. 28 is a typical view of a reforming area formed by the manufacturing method of the semiconductor chip in accordance with the twelfth embodiment mode. FIG. 29 is an explanatory view of the relation of laser power calculated by a simulation, a depth for forming the reforming area, and temperature at a convergent point. In FIG. 29, XXIXA represents a case of the depth of 620 µm, XXIXB represents a case of the depth of 410 µm, and XXIXC represents a case of the depth of 140 µm.

In each of these figures, one portion is enlargedly and exaggeratedly shown for the explanation.

A semiconductor substrate 21 of a thin disk shape constructed by silicon is prepared as shown in FIG. 26A. As shown in FIG. 26B, a rear face 21b of the semiconductor substrate 21 is adhered to a sheet 41 manufactured by resin through an adhering layer 52. The sheet 41 has an extending property, and the adhering layer 52 is formed on an entire face of the sheet 41 by an adhesive, etc. An outer circumferential portion of the sheet 41 is held by a frame 42 of an annular shape such that the sheet 41 attains a spreading state.

An orientation flat OF showing a crystal orientation is formed in one portion of the outer circumference of the semiconductor substrate 21. Semiconductor elements 25 formed via a diffusion process, etc. are lined up and arranged as in checkers on a substrate face 21a of the semiconductor substrate 21.

Divisional schedule lines DL1 to DL14 as lines scheduled to divide the semiconductor substrate 21 in the thickness direction are set toward the rear face 21b in the thickness direction of the semiconductor substrate 21 on the substrate face 21a between the respective semiconductor elements 25. Divisional schedule lines DL1 to DL7 are arranged in a direction approximately perpendicular to the orientation flat OF, and are set such that these respective divisional schedule lines mutually become parallel. Divisional schedule lines DL8 to DL14 are arranged in a direction approximately parallel to the orientation flat OF, and are set such that these respective divisional schedule lines mutually become parallel. Namely, divisional schedule lines DL1 to DL7 and divisional schedule lines DL8 to DL14 mutually cross perpendicularly.

Each semiconductor element 25 is surrounded by the divisional schedule line DL on four sides of its circumference. The semiconductor substrate 21 is divided in the thickness direction along the divisional schedule line DL so that plural semiconductor chips Cp each having the semiconductor element 25 are obtained.

In the following explanation, a portion not divided from the semiconductor substrate 21 and originally becoming a semiconductor chip after the division is also called the semiconductor chip. These semiconductor chips Cp are respectively divided in the thickness direction along the divisional schedule line DL by a dicing process, and are then completed as IC and LSI packaged via respective processes such as a mount process, a bonding process, an enclosing process, etc.

As shown in FIG. 26B, six semiconductor chips Cp1 to Cp6 are formed on line XXVIB-XXVIB of the semiconductor substrate 21. Seven divisional schedule lines DL1 to DL7 and divisional schedule lines DL11, DL12 (FIG. 26A) unillustrated in FIG. 26B are set to divide these semiconductor chips Cp1 to Cp6. A reforming area K (FIG. 28) as a starting point of the division is formed in the thickness direction of the semiconductor substrate 21 by a method described later on divisional schedule lines DL1 to DL7, DL11, DL12.

Formation of reforming area using irradiation of laser beam is explained as follows.

As shown in FIG. 27, a laser head H for irradiating a laser beam L is arranged in a manufacturing device 1 of the semiconductor chip. The laser head H has a condenser lens CV for converging the laser beam L, and can converge the laser beam L at a predetermined focal distance. Here, the convergent point P of the laser beam L is set so as to be formed in a position of depth d from the substrate face 21a of the semiconductor substrate 21.

Here, appropriate laser kind and wavelength can be selected as the laser beam L to be irradiated in conformity with the structure and the material of the semiconductor substrate 21. For example, a YAG laser, a carbon dioxide gas laser, a semiconductor laser, etc. can be used.

One of divisional schedule lines DL shown in FIG. 26A is first scanned by the laser beam for detecting the semiconductor substrate to form the reforming area K within the semiconductor substrate 21, and an irradiating range of the laser beam L is set. Here, a case for forming the reforming area K on divisional schedule line DL4 will be explained.

Subsequently, as shown in FIG. 27, the laser head H is scanned along divisional schedule line DL4 (the direction of F4 in this figure). The reforming area K using multiphoton absorption is properly formed by irradiating the laser beam L from the substrate face 21a in a path of depth d in which the convergent point P of the laser beam L is scanned.

Next, as shown in FIG. 28, the convergent point P is moved in the thickness direction of the semiconductor substrate 21 by adjusting the depth d of the convergent point P of the laser beam L, and the reforming area K is formed in plural positions on the divisional schedule line DL4. The reforming areas K of about 30 positions are normally formed in the thickness direction to divide the semiconductor substrate 21 of about 600 µm in thickness. However, in FIG. 28, a case for forming reforming areas K1 to K8 of eight positions will be explained to easily make the explanation.

Energy of the irradiated laser beam L is absorbed at the convergent point P, and the reforming area K spread in the thickness direction and the planar direction of the semiconductor substrate 21 is formed with the convergent point P as a center. The reforming area K is formed such that the spread in the thickness direction of the semiconductor substrate 21 is greater than the spread in the planar direction, and a longitudinal section of the reforming area K is formed in a rotating body shape of a longitudinal ellipse.

In the following description, the spread of the reforming area K in the thickness direction of the semiconductor substrate 21 is used as "longitudinal spread R1" and the spread of the reforming area K in the planar direction is used as "transversal spread R2" in the explanation. Further, when the size of the reforming area K is shown, the longitudinal spread R1 and the transversal spread R2 are generally called and used as "spread R" in the explanation.

Here, when the reforming area K of plural layers is introduced in the thickness direction of the semiconductor substrate 21 and is formed from a direction close to the substrate face 21a, the laser beam L is scattered in passing the reforming area K previously formed so that no convergent point P is easily focused. Therefore, there is a case in which no reforming area K of a sufficient size is formed. Therefore, it is preferable to sequentially form the reforming area K from a direction distant from the substrate face 21a.

Accordingly, the laser beam L is irradiated by controlling the distance M (FIG. 27) from an emitting face of the laser beam L of the laser head H to the substrate face 21a so as to form the reforming area K in an order from K1 to K8.

Intensity of the laser beam L irradiated to the semiconductor substrate 21 is controlled on the basis of the relation of laser power LP as an input value of a device for setting the intensity of the laser beam L calculated by a simulation by the inventors of the present application, depth d for forming the reforming area K, and temperature Temp of the convergent point P. FIG. 29 shows results of the simulation. "Focal point" in this figure has the same meaning as depth d (FIG. 28). In the simulation, it is supposed that the intensities of the laser power LP and the laser beam L are proportional, and all energy of the laser beam L irradiated at the convergent point P is consumed for heat generation.

Temperature T at the convergent point P rises in proportion to the laser power LP, and its inclination is gentle as the focal point (depth d) is large. Namely, as the focal point (depth d) is large, large laser power LP is required to raise temperature Temp.

The reforming area K is formed when temperature Temp exceeds a melting point (1693 K) of silicon for forming the semiconductor substrate 21. Longitudinal spread R1 of the reforming area K formed when temperature Temp reaches just above the melting point is about 18 µm, and transversal spread R2 is about 2 to 3 µm.

When the focal point (depth d) is 620 µm, laser power LP of about 0.9 W is required to make temperature Temp reach the melting point of silicon. Similarly, when the focal point (depth d) is 410 µm, laser power LP of about 0.7 W is required. When the focal point (depth d) is 140 µm, laser power LP of about 0.5 W is required.

The relation of the following formula calculated by the least squares method between laser power LP and depth d when temperature Temp reaches the melting point is obtained from these contents.

$$LP = 0.001 \times d + 0.355 \quad (F1)$$

Here, LP represents a laser power (W), and d represents a depth of convergent point P (µm).

Laser power LP required to form the reforming area K is increased in proportion to depth d from the above formula No. 1. In other words, the intensity of the laser beam L irradiated to the convergent point P is attenuated in proportion to depth d, and temperature Temp is also lowered.

The spread R of the reforming area K is changed in accordance with temperature Temp. Therefore, when laser power LP is constantly set and the laser beam is irradiated, the spread R of the reforming area K becomes small as depth d becomes large.

For example, when laser power LP is set to 1.2 W and the laser beam L is irradiated, the reforming area K8 near the substrate face 21a is formed such that longitudinal spread R1 is about 40 µm and transversal spread R2 is about 4 to 6 µm. In contrast to this, the reforming area K1 near the rear face 21b is formed such that longitudinal spread R1 is about 20 µm and transversal spread R2 is about 2 to 3 µm. Namely, in this condition, the reforming area K1 has a similar shape of ½ times the size of the reforming area K8.

Thus, temperature Temp rises in proportion to laser power LP, and the spread R of the reforming area K is increased as temperature Temp rises. Therefore, the reforming area K having the predetermined desirable spread R can be formed at predetermined depth d by controlling laser power LP by using the relation of the relation of the above formula No. 1, temperature Temp and the spread R of the reforming area K.

In this embodiment mode, as shown in FIG. 28, the reforming area K is formed such that the spread R from the convergent point P becomes large as it is close to the rear face 21b of the semiconductor substrate 21 by using a method for controlling the intensity of the above laser beam L. Namely, the intensity of the laser beam L is controlled so as to be strengthened such that the size of the spread R becomes large as the reforming area K is close to the rear face 21b.

First, reforming area K1 closest to the rear face 21b is formed, and reforming areas K2 to K8 are subsequently formed toward the substrate face 21a. Reforming areas K1 to K8 are formed such that the spread R becomes small in this order.

For example, the intensity of the irradiated laser beam L is set such that the longitudinal spread R1 of the reforming area K1 is formed so as to be 40 µm and the longitudinal spread R1 of the reforming area K8 is formed so as to be 20 µm. The intensity of the laser beam L is controlled such that the spreads R of the reforming areas K1 to K8 are proportional to depth d. At this time, the reforming area K1 is formed in a largest position of depth d, and is formed so as to maximize the spread R. Therefore, the intensity of the irradiated laser beam L is maximized.

Similar to the divisional schedule line DL4, reforming areas K1 to K8 are also formed with respect to other divisional schedule lines DL.

Here, reforming areas K1 to K8 are formed so as to reduce the spread R in this order. Therefore, since the intensity of the laser beam L irradiated to the reforming area K near the substrate face 21a is low, a temperature rise near the substrate face 21a is small, and there is no fear having an influence on the semiconductor element 25.

Further, a micro crack is introduced within the reforming area K by induction of phase transformation of silicon. The amount of the micro crack is increased in accordance with the intensity of the laser beam L, and the micro crack is introduced in the reforming area K1 at a density higher than that of the reforming area K8. Namely, the amount of the micro crack introduced into the reforming area K can be also controlled by controlling the intensity of the laser beam L.

Subsequently, stress is loaded to the semiconductor substrate 21 by extending the sheet 41 in the planar direction, and the crack is developed with the reforming area K as a starting point, and the semiconductor substrate 21 is divided in the thickness direction along the divisional schedule line DL.

For example, the following publicly known method can be used as a method for extending the sheet 41. Namely, in this method, the semiconductor substrate 21 is pressed so as to be pushed up from the rear side of the sheet 41 by using an unillustrated pressing device having a flat face of about the same size as the rear face 21b of the semiconductor substrate 21 in a fixing state of the frame 42. Thus, the sheet 41 is extended in the planar direction, and stress is loaded in the in-plane direction of the semiconductor substrate 21.

Here, the reforming area K1 formed nearest to the rear face 21b is formed so as to maximize the spread R among reforming areas K1 to K8. Accordingly, it effectively acts as a starting point of crack generation when the sheet 41 is extended and the semiconductor substrate 21 is divided. Further, the micro crack is introduced into the reforming area K1 at high density. Therefore, the crack is developed by small force, and the semiconductor substrate 21 is reliably divided.

In addition, reforming areas K1 to K8 are formed such that the spread R is large as it is close to the rear face 21b. Therefore, force required in the division in the order of reforming areas K1 to K8 is small. The crack is sequentially developed from the reforming area K1 of the rear face 21b side to the reforming area K8, and no crack is deflected.

The twelfth embodiment mode has the following effects.

(1) The intensity of the laser beam L is controlled in accordance with the spread R from the convergent point P of the reforming area K and the depth d of the semiconductor substrate 21 for forming the reforming area K. Therefore, it is possible to form the reforming area K having a predetermined desirable spread R suitable to reliably divide the semiconductor substrate 21 at the predetermined depth d.

Namely, the reforming area K effectively operated to divide the semiconductor substrate 21 can be formed. Therefore, it is possible to realize a manufacturing method of the semiconductor chip Cp able to improve yield of the semiconductor chip Cp.

(2) The intensity of the laser beam L is controlled such that the spread R from the convergent point P of the reforming area K formed near the rear face 21b of the semiconductor substrate 21 becomes greater than the spread R from the convergent point P of the reforming area K formed near the substrate face 21a. Therefore, the reforming area K of a large size is formed on the rear face 21b side of the semiconductor substrate 21 set to a starting point of crack development. Accordingly, the crack can be developed by small force, and the semiconductor substrate 21 can be reliably divided.

Namely, since the reforming area K effectively operated to divide the semiconductor substrate 21 can be formed, it is possible to realize a manufacturing method of the semiconductor chip Cp able to improve yield of the semiconductor chip Cp.

(3) The intensity of the laser beam L is controlled such that the spread R from the convergent point P becomes large as the reforming area K is close to the rear face 21b. Therefore, the spread R becomes large and force required in the division becomes small as the reforming area K is close to the rear face 21b set to a starting point of the crack development. Therefore, it is possible to sequentially develop and divide the crack from the reforming area K1 formed near the rear face 21b set to a starting point of the crack development to the reforming area K8 formed near the substrate face 21a. Accordingly, there is no fear that a divisional defect of the semiconductor substrate 21 due to deflection of the crack, etc. is caused.

Thirteenth Embodiment Mode

Figure 30A:
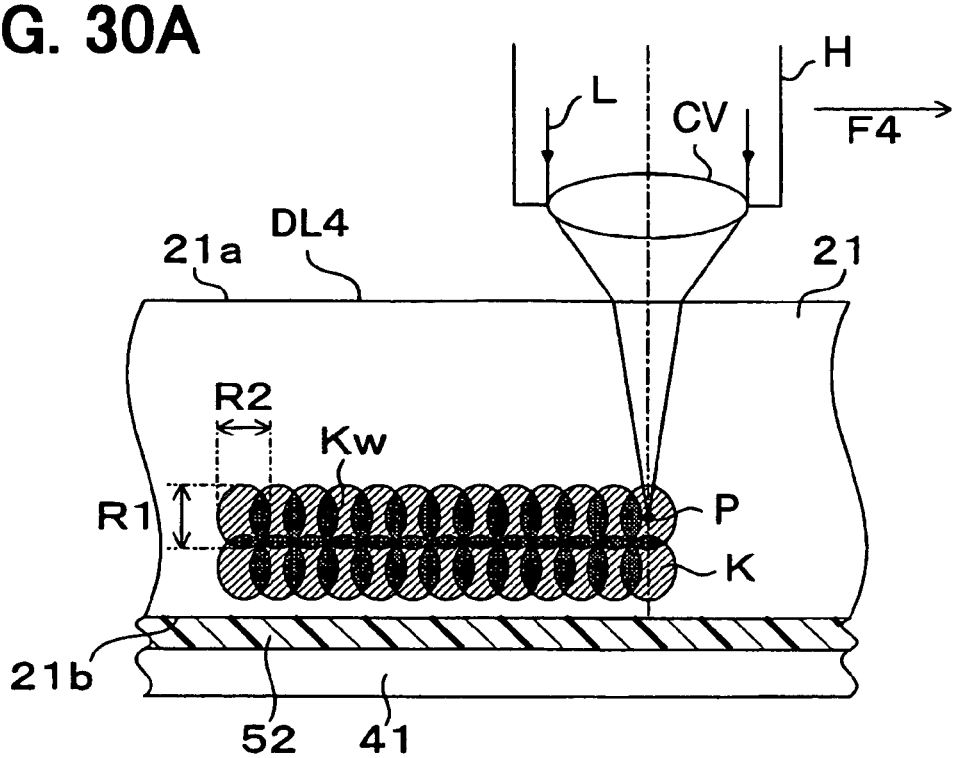
FIGS. 30A and 30B are cross sectional views showing a reforming area in the wafer formed by another laser dicing method.
Figure 30B:
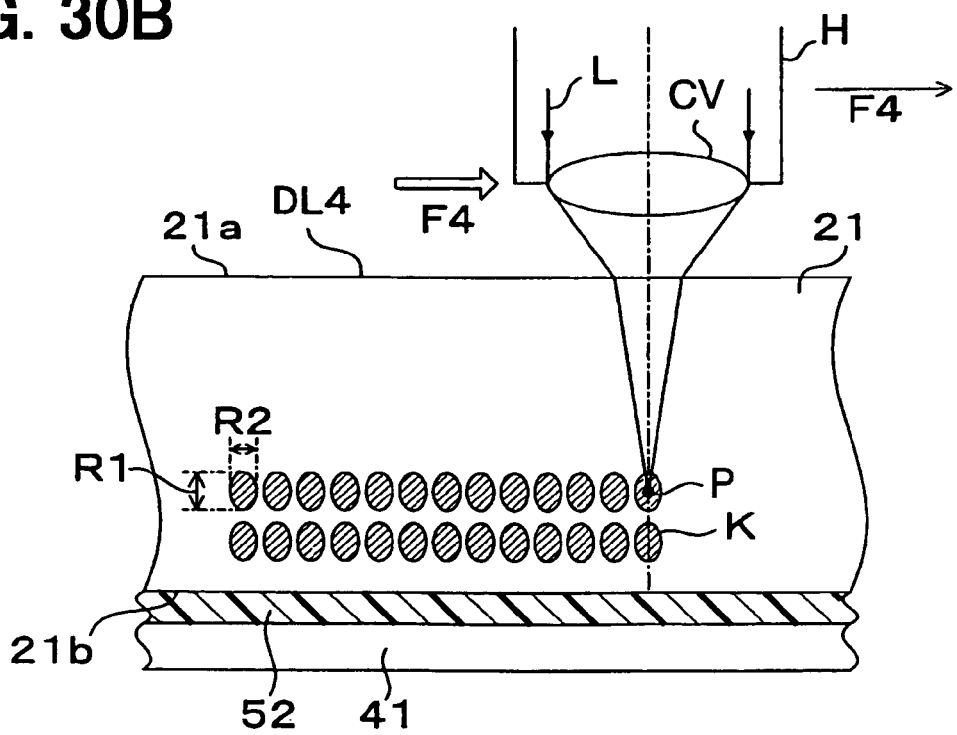

A thirteenth embodiment mode of the manufacturing method of the semiconductor chip will be explained with reference to the drawings. FIG. 30A is a typical view of a reforming area when adjacent reforming areas communizes one portion. FIG. 30B is a typical view of the reforming area formed by the manufacturing method of the semiconductor chip in accordance with the thirteenth embodiment mode.

As shown in FIG. 27, when the spread of the reforming area K is excessively large in a case for continuously forming the reforming area K at the same depth in the planar direction of the semiconductor substrate 21 along a divisional schedule line DL4, there is a case in which the reforming areas K communize one portion in the thickness direction and the planar direction of the semiconductor substrate 21 and are overlapped as shown in FIG. 30A. In this case, re-crystallization, there is a case in which re-crystallization, re-melting, etc. are caused and strong coupling is performed in an overlapping portion Kw, and large force is required to divide the semiconductor substrate 21.

Longitudinal spread R1 and transversal spread R2 able to be allowed so as to make no reforming areas K communize this one portion are set to avoid the above phenomenon. As shown in FIG. 30B, the adjacent reforming areas K are set so as not to be overlapped, and the spread R of the reforming area K effectively operated to divide the semiconductor substrate 21 can be secured by controlling the intensity of the laser beam L.

Here, in FIG. 30B, a case for setting the spreads R of the reforming areas K to about the same has been illustrated as an example. However, a construction for largely forming the spread R as the reforming area K is close to the rear face 21b may be also used.

The thirteenth embodiment mode has the following effects.

(1) The intensity of the laser beam L is controlled such that no adjacent reforming areas K communize one portion. Therefore, it is possible to prevent that the overlapping portion Kw of the adjacent reforming areas K is strongly connected by re-crystallization, re-melting, etc., and no semiconductor substrate 21 is easily divided. Further, the adjacent reforming area K can be also set so as not to overlap each other by controlling the irradiating time (speed and frequency) of the laser beam L.

(Modifications)

Figure 31:
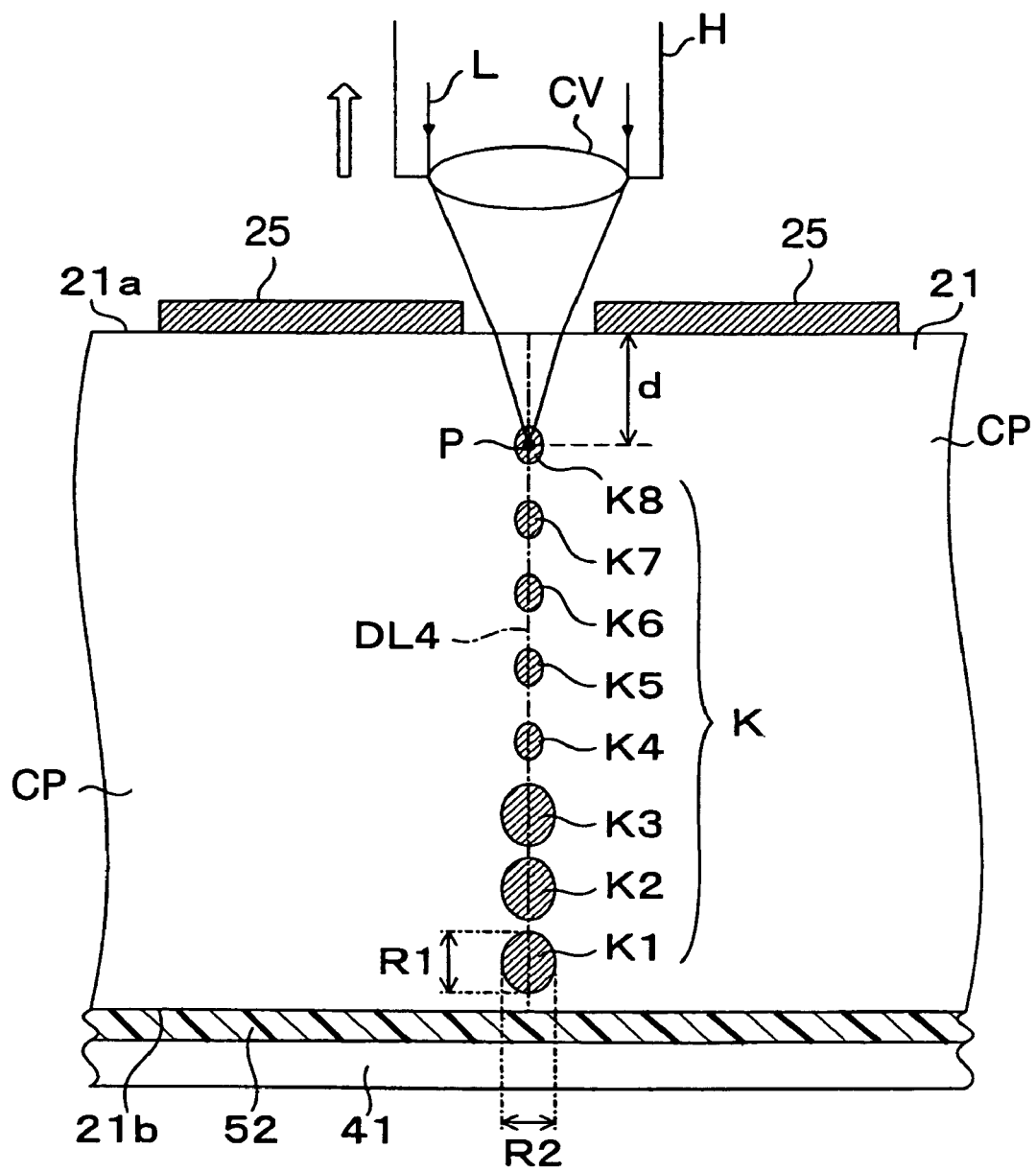
FIG. 31 is a cross sectional view showing a reforming area in the wafer formed by further another laser dicing method.

The reforming areas K1 to K8 may be also formed by controlling the intensity of the laser beam L such that the spread R from the convergent point P of the reforming area K formed near the rear face 21b of the semiconductor substrate 21 becomes larger than the spread R from the convergent point P of the reforming area K formed near the substrate face 21a. In the twelfth embodiment mode, the intensity of the laser beam L is controlled such that the spread R from the convergent point P becomes large as the reforming area K is close to the rear face 21b. In contrast to this, for example, as shown in FIG. 31, the intensity of the laser beam L may be also controlled such that the longitudinal spreads R1 of reforming areas K1 to K3 formed near the rear face 21b become 40 μm and the longitudinal spreads R1 of reforming areas K4 to K8 become 20 μm.

Further, the spreads R of reforming areas K4 to K8 may be also set to become large in the order of K4 to K8 by forming reforming areas K4 to K8 by the laser beam L of the same intensity.

When this construction is used, the reforming area K effectively operated in the division is also formed near the rear face 21b of the semiconductor substrate 21. Therefore, the effects of (1) and (2) of the twelfth embodiment mode can be obtained.

Figure 32:
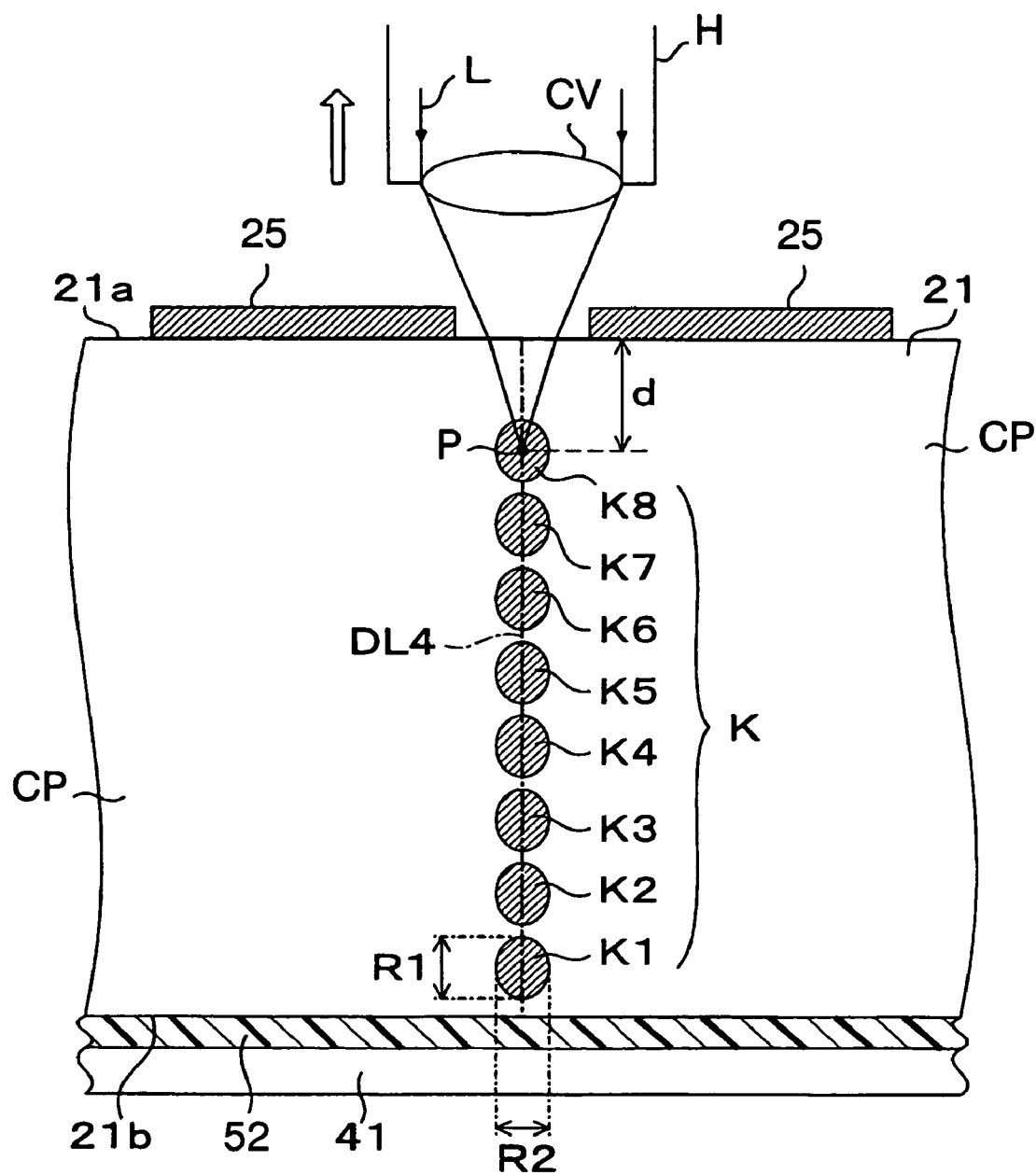
FIG. 32 is a cross sectional view showing a reforming area in the wafer formed by another laser dicing method.

Alternatively, reforming areas K1 to K8 may be also formed by controlling the intensity of the laser beam L such that the spreads R from the respective convergent points F become about the same. Namely, as shown in FIG. 32, the intensity of the laser beam L may be also controlled such that reforming areas K1 to K8 approximately have the same spread R, e.g., 40 μm in longitudinal spread R1.

When this construction is used, the reforming area K effectively operated in the division is also formed near the rear face 21b of the semiconductor substrate 21. Therefore, the effect of (1) of the twelfth embodiment mode can be obtained.

Alternatively, the reforming area K can be also formed by irradiating the laser beam L from the sheet 41 side.

Figure 33:
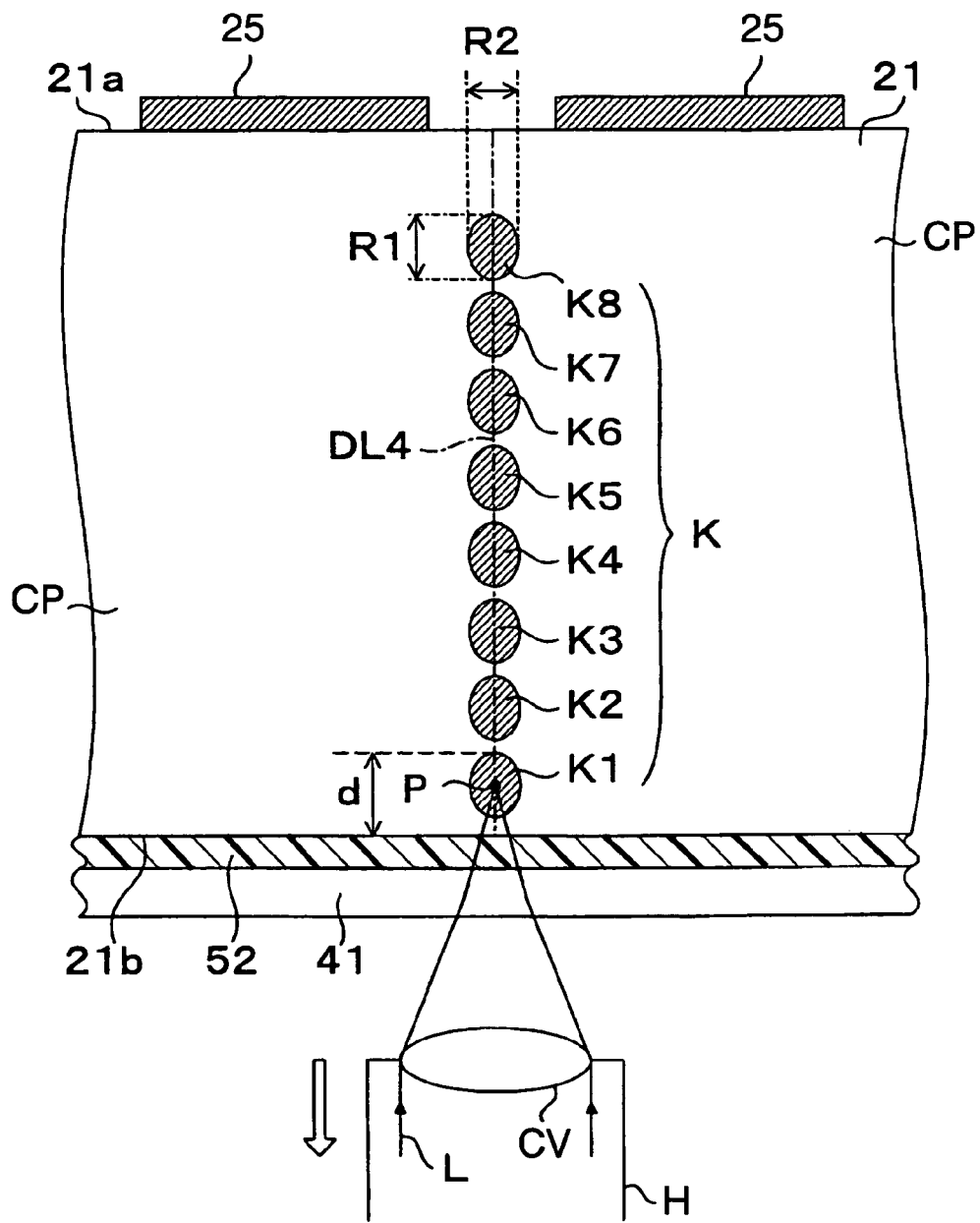
FIG. 33 is a cross sectional view showing a reforming area in the wafer formed by further another laser dicing method.

For example, as shown in FIG. 33, the semiconductor substrate 21 is adhered by using the sheet 41 formed by a material able to transmit the laser beam L, and the laser beam L is irradiated from the rear face 21b side of the semiconductor substrate 21 through the sheet 41. Here, the laser beam L is irradiated by controlling the position of the laser head H so as to be away from the rear face 21b such that the reforming area K is formed in the order from K8 to K1 to avoid an influence of scattering in the reforming area K of the laser beam L. The reforming area K having a predetermined spread R can be formed at a predetermined depth d by controlling the laser power LP. In FIG. 33, the reforming areas K1 to K8 are formed such that the spread R from each convergent point P becomes about the same. However, the reforming area K may be also formed such that the spread R from the convergent point P becomes larger as it is closer to the rear face 21b of the semiconductor substrate 21.

Further, the reforming areas K1 to K8 may be also formed by combining the irradiation of the laser beam L from the substrate face 21a side of the semiconductor substrate 21, and the irradiation of the laser beam L from the rear face 21b side.

Figure 34A:
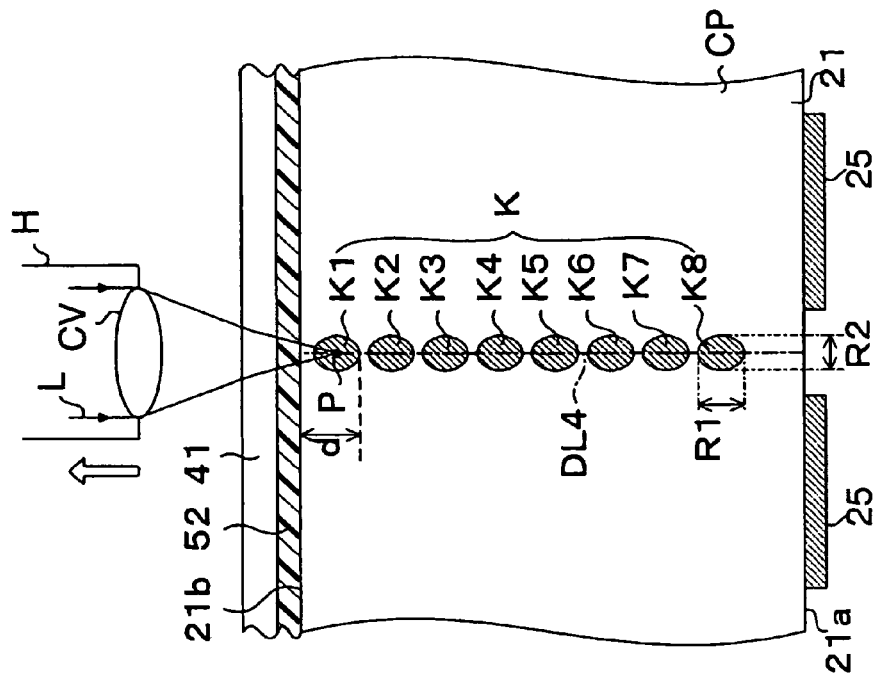
FIGS. 34A and 34B are cross sectional views showing a reforming area in the wafer formed by further another laser dicing method.
Figure 34B:
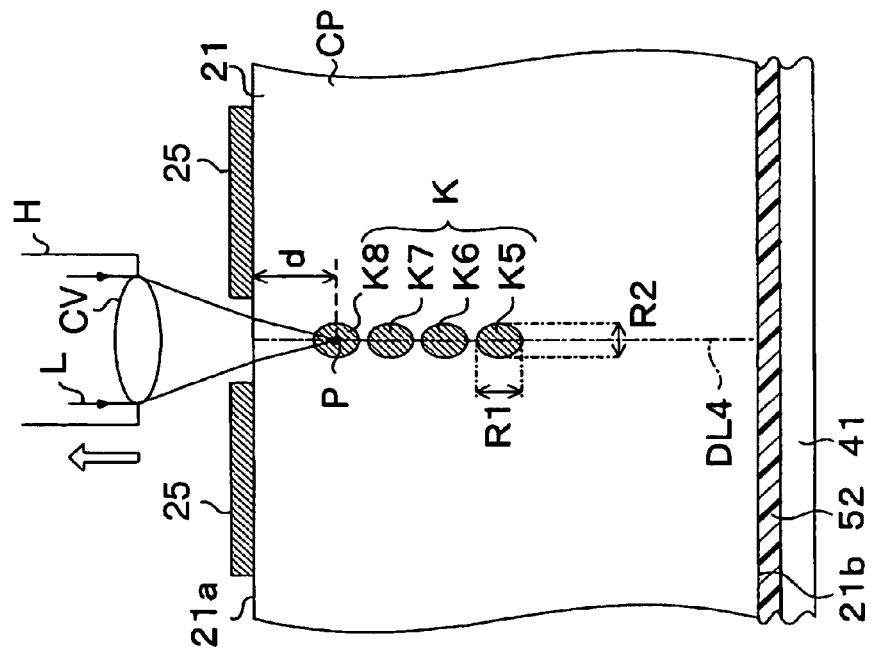
Figure 35A:
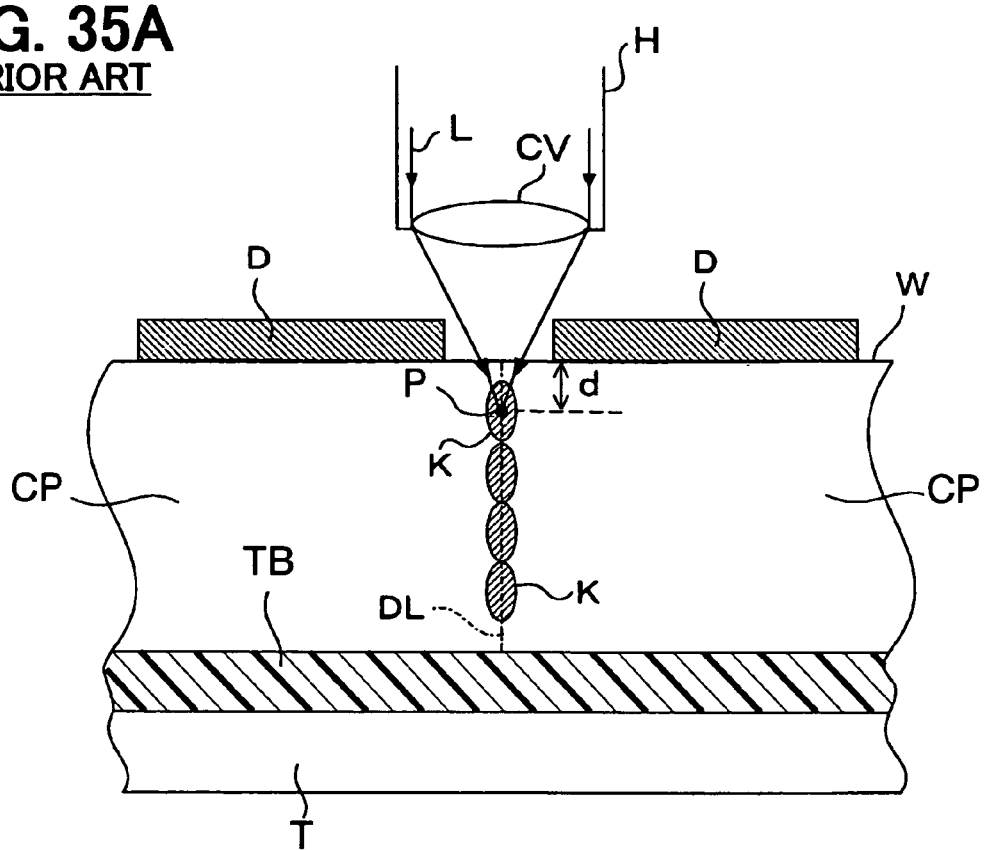
FIGS. 35A and 35B are cross sectional views explaining a laser dicing method according to a prior art.
Figure 35B:
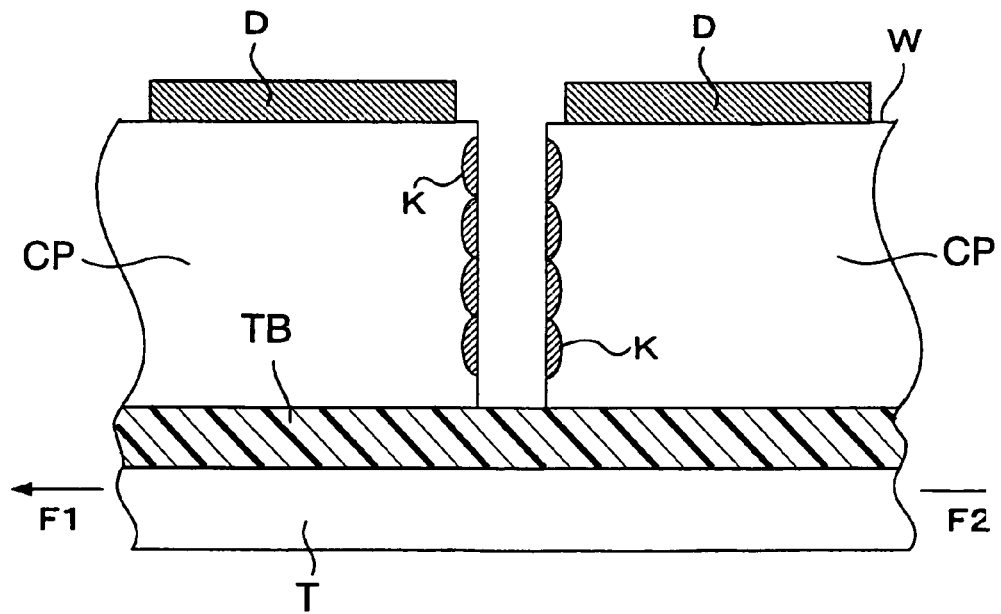

For example, as shown in FIG. 34A, the laser beam L is irradiated from the substrate face 21a side and reforming areas K5 to K8 are formed in this order such that the spread R from each convergent point P becomes about the same. Next, as shown in FIG. 34B, while the semiconductor substrate 21 is adhered to the sheet 41, the semiconductor substrate 21 is inverted with respect to the laser head H, the laser beam L is irradiated from the rear face 21b side and reforming areas K4 to K1 may be also formed in this order such that the spread R from each convergent point P becomes about the same.

When this construction is used, the depth d for irradiating the laser beam L can be reduced. Accordingly, it is not necessary to control the laser power LP in a wide range.

The reforming areas K1 to K4 or the reforming areas K5 to K8 may be early formed. Further, the reforming area K may be also formed such that the spread R from the convergent point P becomes larger as it is closer to the rear face 21b of the semiconductor substrate 21.

Further, the laser beam L is attenuated dependently on impurity concentration within the semiconductor substrate 21. An attenuation ratio becomes large as an impurity amount is increased. Therefore, when the impurity concentration is changed in the thickness direction of the semiconductor substrate 21, there is a fear that no reforming area K having the predetermined spread R is formed in an area of high impurity concentration.

Therefore, a reforming layer of a predetermined size can be formed by controlling the laser power LP in accordance with an impurity concentration profile with respect to the depth d on the divisional schedule line DL. For example, in an area in which the impurity concentration is high and the attenuation of the laser beam L becomes large, the laser power LP is controlled so as to strengthen the intensity of the irradiated laser beam L.

When this construction is used, the reforming area K having the predetermined spread R can be formed at the predetermined depth d with respect to the semiconductor substrate 21 which has the impurity concentration changing in the thickness direction.

Further, the reforming area K can be also properly formed by controlling the laser power LP in accordance with an impurity concentration profile in a gettering layer as an impurity layer.

The present disclosure has the following aspects.

According to a first aspect of the present disclosure, a method for dicing a semiconductor substrate includes: forming a reforming layer in the substrate by irradiating a laser beam on the substrate; forming a groove on the substrate along with a cutting line and applying a force to the substrate in order to cutting the substrate at the reforming layer as a starting point of cutting. The groove has a predetermined depth so that the groove is disposed near the reforming layer, and the force provides a stress at the groove.

The above method includes a process for forming a groove able to concentrate stress due to external force in a part to be divisionally cut until the groove is disposed near a reforming layer. On the other hand, when external force is applied in the divisional cutting, stress concentrated on the groove is directly applied to the reforming layer near the groove. Accordingly, growth of a crack with the reforming layer as a starting point can be promoted. Therefore, stable divisional cutting can be performed, and the quality reduction of a divided wafer piece can be prevented.

Alternatively, the groove may reach the reforming layer. The above method includes a process for forming a groove able to concentrate stress due to external force in a part to be divisionally cut until a depth able to reach a reforming layer. Thus, a surface layer is removed from the part to be divisionally cut forming this groove therein by forming this groove. Therefore, no range for forming no reforming layer exists on a surface of the part to be divisionally cut. Accordingly, the possibility that the growth of the crack is developed in an unscheduled direction becomes extremely low in comparison with a case in which the range for forming no reforming layer exists in the surface layer of the part to be divisionally cut. Therefore, stable divisional cutting can be performed, and the quality reduction of a divided wafer piece can be prevented.

Alternatively, the substrate may be a semiconductor wafer, and the substrate is cut into a plurality of chips. This method includes a process for forming a groove able to concentrate stress due to external force in a part able to be divisionally cut in the semiconductor wafer until the groove is disposed near a reforming layer.

Alternatively, a distance between the groove and the reforming layer may be equal to or smaller than 30 μm. This method includes a process for forming a groove able to concentrate stress due to external force in a part to be divisionally cut in a semiconductor wafer until a depth at which the separating distance between a reforming layer closest to this groove and a bottom portion of this groove becomes 30 μm or less. Thus, a surface layer is removed from the part to be divisionally cut forming this groove therein by forming this groove. Therefore, no range for forming no reforming layer exists on a surface of the part to be divisionally cut. On the other hand, when external force is applied to the semiconductor wafer in the divisional cutting, a crack generated with the bottom portion as a starting point can be communicated with the reforming layer of a separating distance of 30 μm or less by stress concentrated on the bottom portion of the groove if the separating distance between the reforming layer closest to this groove and the bottom portion of this groove is 30 μm or less even when no reforming layer is directly connected to this groove. Therefore, growth of the crack with the bottom portion as a starting point can be promoted. Accordingly, the possibility that the growth of the crack is developed in an unscheduled direction becomes extremely low in comparison with a case in which the range for forming no reforming layer exists in the surface layer of the part to be divisionally cut. Therefore, stable divisional cutting can be performed, and the quality reduction of a separated semiconductor device can be prevented.

Alternatively, the groove may be disposed on a first side of the substrate, and the force is applied to the first side of the substrate toward an outer periphery of the substrate in a radial direction of the substrate. In this method, when external force is applied toward the diametrical outside on one face of the semiconductor wafer, a groove able to concentrate stress due to external force thereon is formed on at least this one face. Thus, the growth of a crack in which the reforming layer of one face side easily applied by this external force and the bottom portion of the groove are set to a starting point, is promoted in comparison with the other face difficult to be applied by this external force. Accordingly, it particularly effectively acts when the range for forming no reforming layer is gathered on this one face side. Accordingly, stable divisional cutting can be performed, and the quality reduction of a separated semiconductor device can be prevented even in the semiconductor wafer in which the range for forming no reforming layer is gathered in the surface layer of one face applied by external force.

Alternatively, the groove may be disposed on a first side of the substrate, and the force is applied to a second side of the substrate toward an outer periphery of the substrate in a radial direction of the substrate. In this method, when external force is applied toward the diametrical outside on one face of the semiconductor wafer, a groove able to concentrate stress due to external force thereon is formed on the other face on the side opposed to at least one face. Thus, the growth of a crack in which the reforming layer of the other face side difficult to be applied by this external force and the bottom portion of the groove are set to a starting point, is promoted in comparison with one face easily be applied by this external force. Accordingly, it particularly effectively acts when the range for forming no reforming layer is gathered on the other face side. Accordingly, stable divisional cutting can be performed, and the quality reduction of a separated semiconductor device can be prevented even in the semiconductor wafer in which the range for forming no reforming layer is gathered in the surface layer of the other face on the side opposed to one face applied by external force.

Alternatively, the forming the groove may be performed before the forming a reforming layer. In this method, the process for forming the groove able to concentrate stress due to external force thereon exists before the process for forming the reforming layer in the semiconductor wafer. Accordingly, in the process for forming such a groove, no reforming layer is formed yet in the semiconductor wafer. Therefore, for example, when this groove is formed by physical processing such as mechanical processing, etc., the reforming layer tending to become a cause of a crack by a mechanical vibration is not formed yet. Hence, crack generation at a processing time can be restrained. Accordingly, it is possible to prevent the quality reduction of a semiconductor device with generation of such an unscheduled crack as a cause.

Alternatively, the forming the groove may be performed after the forming a reforming layer. In this method, the process for forming the groove able to concentrate stress due to external force thereon exists after the process for forming the reforming layer in the semiconductor wafer. Accordingly, in the process for forming the reforming layer, such a groove is not formed yet in the semiconductor wafer. Therefore, for example, when this reforming layer is formed by irradiating a laser beam, a wall face of such a groove tending to become a cause of ablation is not formed yet. Hence, generation of ablation can be restrained at an irradiating time of the laser beam. Accordingly, it is possible to prevent the quality reduction of a semiconductor device in which attachment of a particle due to such ablation is set to a cause.

According to a second aspect of the present disclosure, a semiconductor device includes: a semiconductor substrate capable of being cut into a plurality of chips; a reforming layer disposed in the substrate, wherein the reforming layer is a starting point of cutting; and a groove disposed on the substrate along with a cutting line. The groove is disposed near the reforming layer so that a stress is concentrated at the groove when the substrate is cut.

In the above device, a groove near the reforming layer and able to concentrate stress due to external force applied in the divisional cutting is arranged in a part to be separated by the divisional cutting. On the other hand, when external force is applied to the semiconductor wafer in the divisional cutting, stress concentrated on the groove is directly applied to the reforming layer near the groove. Accordingly, growth of a crack with the reforming layer as a starting point can be promoted. Therefore, stable divisional cutting can be performed, and the quality reduction of a separated semiconductor device can be prevented.

Alternatively, the groove may reach the reforming layer. In this device, a groove of a depth able to reach the reforming layer and able to concentrate stress due to external force applied in the divisional cutting is arranged in a part to be separated by the divisional cutting. Thus, a surface layer is removed from the part to be divisionally cut forming this groove therein by forming this groove. Therefore, no range for forming no reforming layer exists on a surface of the part to be divisionally cut. On the other hand, when external force is applied to the semiconductor wafer in the divisional cutting, stress concentrated on the groove is directly applied to the reforming layer connected to the groove. Accordingly, growth of a crack with the reforming layer as a starting point can be promoted. Accordingly, the possibility that the growth of the crack is developed in an unscheduled direction becomes extremely low in comparison with a case in which the range for forming no reforming layer exists in the surface layer of the part to be divisionally cut. Therefore, stable divisional cutting can be performed, and the quality reduction of a separated semiconductor device can be prevented.

Alternatively, a distance between the groove and the reforming layer may be equal to or smaller than 30 μm. In this device, a groove able to concentrate stress due to external force and having a depth for setting the separating distance between the reforming layer closest to this groove and the bottom portion of this groove to 30 μm or less is arranged in a part to be separated by the divisional cutting. Thus, a surface layer is removed from the part to be divisionally cut forming this groove therein by forming this groove. Therefore, no range for forming no reforming layer exists on a surface of the part to be divisionally cut. On the other hand, when external force is applied to the semiconductor wafer in the divisional cutting, a crack generated with the bottom portion as a starting point can be communicated with the reforming layer of a separating distance of 30 μm or less by stress concentrated on the bottom portion of the groove if the separating distance between the reforming layer closest to this groove and the bottom portion this groove is 30 μm or less even when no reforming layer is directly connected to this groove. Therefore, growth of the crack with the bottom portion as a starting point can be promoted. Accordingly, the possibility that the growth of the crack is developed in an unscheduled direction becomes extremely low in comparison with a case in which the range for forming no reforming layer exists in the surface layer of the part to be divisionally cut. Therefore, stable divisional cutting can be performed, and the quality reduction of a separated semiconductor device can be prevented.

According to a third aspect of the present disclosure, a method for cutting an object includes: irradiating a laser beam on the object in order to form a plurality of reforming layers in the object along with a cutting line by multi-photon absorption effect, wherein the reforming layers are formed in a multi-layered structure manner in a thickness direction of the object; and applying a force on a first side of the object in order to cut the object from the reforming layers as a starting point of cutting. The reforming layers are disposed in a first reforming region and a second reforming region. The first reforming region is disposed in the first side of the object, and the second reforming region is disposed in a second side of the object. The reforming layers in the first reforming region have a first distance between two neighboring reforming layers, and the reforming layers in the second reforming region have a second distance between two neighboring reforming layers. The first distance of the first reforming region is smaller than the second distance of the second reforming region.

In the above method, with respect to the interval of a reforming layer formed in the thickness direction of a part scheduled to be divisionally cut, the interval of a pressurizing side reforming layer located in the range of a pressurized side is set to be narrower than the interval of a non-pressurizing side reforming layer located in a range of the side opposed to this pressurized side. Thus, with respect to the part scheduled to be divisionally cut, the reforming layer is concentratedly formed in the range of a side close to a pressurized surface. Accordingly, it is possible to raise the density of a crack formed by reformation in a portion most easily influenced by pressurizing force. In contrast to this, the reforming layer [ka, etc.] is formed in the range of the side opposed to the pressurized side, i.e., the side distant on the pressurized surface even in the part scheduled to be divisionally cut. However, divisional cutting can be performed without excessively raising the density of the crack by a chain of divisional breaking in which the range of the side close to the pressurized surface is set to a starting point. Accordingly, in comparison with a case for forming the reforming layer in the thickness direction of the part scheduled to be divisionally cut as much as possible, proper divisional cutting can be performed while the number of reforming layers is reduced (a forming range of the reforming layer is reduced).

Alternatively, the first distance of the first reforming region may become narrower as it approaches a surface of the first side of the object. In this method, the forming interval of the pressurizing side reforming layer is set so as to become narrow as its forming position becomes close to the pressurized side. The forming interval of the pressurizing side reforming layer is also set so as to become wide as its forming position becomes distant from the pressurized side. Thus, in the part scheduled to be divisionally cut, the pressurizing side reforming layer is concentratedly formed as it becomes close to the pressurized surface. Accordingly, it is possible to most raise the crack density near the surface applied by pressurizing force. In contrast to this, the pressurizing side reforming layer is also dispersively formed as it becomes distant with respect to the pressurized surface (as it becomes close to about the center in the thickness direction even in the pressurizing side reforming layer located in the range of the pressurized side from about the center in the thickness direction of the part scheduled to be divisionally cut. Accordingly, in comparison with a case for forming the pressurizing side reforming layer of the range of the pressurized side as much as possible, proper divisional cutting can be performed while the number of pressurizing side reforming layers is reduced (a forming range of the reforming layer is reduced).

Alternatively, the first reforming region may include a surface side first reforming region and an inner side first reforming region. The surface side first reforming region is disposed on a surface side of the first side of the object, and the inner side first reforming region is disposed on an inner side of the first side of the object. The reforming layers in the surface side first reforming region have a surface side first distance between two neighboring reforming layers, and the reforming layers in the inner side first reforming region have an inner side first distance between two neighboring reforming layers, and the surface side first distance of the surface side first reforming region is smaller than the inner side first distance of the inner side first reforming region. In this method, with respect to the forming interval of the pressurizing side reforming layer, when the range of the pressurized side is divided into plural ranges, the forming interval of a pressurizing side proximity reforming layer located in a range close to the pressurized side among the divided ranges is set to be narrower than the forming interval of a pressurizing side separating reforming layer located in a range distant on the pressurized side. Thus, the pressurizing side proximity reforming layer of the range close to the pressurized side is concentratedly formed in the part scheduled to be divisionally cut. Accordingly, it is possible to limitedly raise the crack density of the range close to the surface applied by pressurizing force. In contrast to this, the pressurizing side non-proximity reforming layer of the range distant on the pressurized side is dispersively formed in comparison with the pressurizing side proximity reforming layer even in the pressurizing side reforming layer located in the range of the pressurized side from about the center in the thickness direction of the part scheduled to be divisionally cut. Accordingly, in comparison with a case for forming the pressurizing side reforming layer of the range of the pressurized side as much as possible, proper divisional cutting can be performed while the number of pressurizing side reforming layers is reduced (a forming range of the reforming layer is reduced).

According to a fourth aspect of the present disclosure, a method for cutting an object includes: irradiating a laser beam on the object in order to form a plurality of reforming layers in the object along with a cutting line by multi-photon absorption effect, wherein the reforming layers are formed in a multi-layered structure manner in a thickness direction of the object; and applying a force on a first side of the object in order to cut the object from the reforming layers as a starting point of cutting. The reforming layers are disposed in a first reforming region and a second reforming region. The first reforming region is disposed in the first side of the object, and the second reforming region is disposed in a second side of the object. The first reforming region includes a first number of the reforming layers, and the second reforming region includes a second number of the reforming layers, and the first number is larger than the second number.

In the above method, with respect to the number of reforming layers formed in the thickness direction of the part, the number of pressurizing side reforming layers located on the pressurized side is set to be larger than the number of non-pressurizing side reforming layers located on the side opposed to this pressurized side. Thus, with respect to the part scheduled to be divisionally cut, the reforming layer is concentratedly formed in the range of a side close to a pressurized surface. Accordingly, it is possible to raise the density of a crack formed by reformation in a portion most easily influenced by pressurizing force. In contrast to this, the reforming layer [ka, etc.] is formed in the range of the side opposed to the pressurized side, i.e., the side distant on the pressurized surface even in the part scheduled to be divisionally cut. However, divisional cutting can be performed without excessively raising the density of the crack by a chain of divisional breaking in which the range of the side close to the pressurized surface is set to a starting point. Accordingly, in comparison with a case for forming the reforming layer in the thickness direction of the part scheduled to be divisionally cut as much as possible, proper divisional cutting can be performed while the number of reforming layers is reduced (a forming range of the reforming layer is reduced).

Alternatively, the reforming layers in the first reforming region may become dense as it approaches a surface of the first side of the object. In this method, the forming number of pressurizing side reforming layers is set so as to become large as its forming position becomes close to the pressurized side. The forming number of pressurizing side reforming layers is also set so as to become small as its forming position becomes distant from the pressurized side. Thus, in the part scheduled to be divisionally cut, the pressurizing side reforming layer is concentratedly formed as it becomes close to the pressurized surface. Accordingly, it is possible to most raise the crack density near the surface applied by pressurizing force. In contrast to this, the pressurizing side reforming layer is also dispersively formed as it becomes distant with respect to the pressurized surface (as it becomes close to about the center in the thickness direction even in the pressurizing side reforming layer located in the range of the pressurized side from about the center in the thickness direction of the part scheduled to be divisionally cut. Accordingly, in comparison with a case for forming the pressurizing side reforming layer of the range of the pressurized side as much as possible, proper divisional cutting can be performed while the number of pressurizing side reforming layers is reduced (a forming range of the reforming layer is reduced).

Alternatively, the first reforming region may include a surface side first reforming region and an inner side first reforming region. The surface side first reforming region (is disposed on a surface side of the first side of the object, and the inner side first reforming region is disposed on an inner side of the first side of the object. The surface side first reforming region has a surface side density of the reforming layers, and the inner side first reforming region has an inner side density of the reforming layers. The surface side density is larger than the inner side density. In this method, with respect to the forming number of pressurizing side reforming layers, when the range of the pressurized side is divided into plural ranges, the forming number of pressurizing side proximity reforming layers located in a range close to the pressurized side among these divided ranges is set to be larger than the forming number of pressurizing side separating reforming layers located in a range distant on the pressurized side. Thus, the pressurizing side proximity reforming layer of the range close to the pressurized side is concentratedly formed in the part scheduled to be divisionally cut. Accordingly, it is possible to limitedly raise the crack density of the range close to the surface applied by pressurizing force. In contrast to this, the pressurizing side non-proximity reforming layer of the range distant on the pressurized side is dispersively formed in comparison with the pressurizing side proximity reforming layer even in the pressurizing side reforming layer located in the range of the pressurized side from about the center in the thickness direction of the part scheduled to be divisionally cut. Accordingly, in comparison with a case for forming the pressurizing side reforming layer of the range of the pressurized side as much as possible, proper divisional cutting can be performed while the number of pressurizing side reforming layers is reduced (a forming range of the reforming layer is reduced).

According to a fifth aspect of the present disclosure, a method for cutting an object includes: irradiating a laser beam on the object in order to form a plurality of reforming layers in the object along with a cutting line by multi-photon absorption effect, wherein the reforming layers are formed in a multi-layered structure manner in a thickness direction of the object; and applying a force on a first side of the object in order to cut the object from the reforming layers as a starting point of cutting. The reforming layers are disposed in a surface side reforming region and an inner side reforming region. The surface side reforming region is disposed in a surface side the object, and the inner side reforming region is disposed in an inner side of the object. The reforming layers in the surface side reforming region have a surface side distance between two neighboring reforming layers, and the reforming layers in the inner side reforming region have an inner side distance between two neighboring reforming layers, and the surface side distance of the surface side reforming region is smaller than the inner side distance (of the inner side reforming region.

In the above method, with respect to the intervals of reforming layers formed in the thickness direction of the part, the interval of a central side reforming layer located in a predetermined range from about the center in this thickness direction is set to be wider than the interval of a center exterior pressurizing side reforming layer located on the pressurized side from the predetermined range, and the interval of a center exterior non-pressurizing side reforming layer located on the side opposed to the pressurized side from the predetermined range. Thus, in comparison with the central side reforming layer located in the predetermined range of about the center in the thickness direction and lying in a low range of possibility applied by pressurizing force, it is possible to concentrate the center exterior pressurizing side reforming layer and the center exterior non-pressurizing side reforming layer located in predetermined ranges except for the predetermined range and lying in a high range (both faces of the part scheduled to be divisionally cut of possibility applied by pressurizing force. Accordingly, in comparison with a case for forming the reforming layer in the thickness direction of the part scheduled to be divisionally cut as much as possible, proper divisional cutting can be performed while the number of reforming layers is reduced (a forming range of the reforming layer is reduced). Further, the proper divisional cutting can be also performed when pressurizing force is applied in different timing from both faces (the surface and the rear face) of the part scheduled to be divisionally cut and it is impossible to set that pressurizing force is applied from any one of the faces (the surface and the rear face) of the part in the divisional cutting, etc.

Alternatively, the surface side reforming region may include a first surface side reforming region and a second surface side reforming region. The first surface side reforming region is disposed on the first side of the object, and the second surface side reforming region is disposed on a second side of the object. The reforming layers in the first surface side reforming region have a first surface side distance between two neighboring reforming layers, and the reforming layers in the second surface side reforming region have a second surface side distance between two neighboring reforming layers. The first surface side distance is equal to or smaller than the second surface side distance. In this method, the forming interval of the center exterior pressurizing side reforming layer and the forming interval of the center exterior non-pressurizing side reforming layer are set to the forming interval of the center exterior pressurizing side reforming layer≦the forming interval of the center exterior non-pressurizing side reforming layer. Thus, the center exterior pressurizing side reforming layer and the center exterior non-pressurizing side reforming layer are symmetrically formed with respect to both the faces with the predetermined range of about the center in the thickness direction as a center. Accordingly, when pressurization is performed from both the faces as in a case for applying pressurizing force in different timing from both the faces (the surface and the rear face) of the part scheduled to be divisionally cut in the divisional cutting, etc., proper divisional cutting can be performed by setting this pressurizing force to the same degree. Further, the center exterior pressurizing side reforming layer is formed so as to be narrower or larger than the center exterior non-pressurizing side reforming layer with the predetermined range of about the center in the thickness direction as a center. Accordingly, the crack density of the center exterior pressurizing side reforming layer can be set to be higher than the crack density of the center exterior non-pressurizing side reforming layer. While the forming range of the reforming layer is correspondingly reduced, the proper divisional cutting can be performed.

Here, the forming interval and the forming number of the reforming layer may be also symmetrically constructed with respect to the surface and the rear face from the center to the surface by setting the forming interval of the reforming layer to gradually become narrow and setting the forming number of the reforming layer to gradually become large as it becomes distant from about the center in the thickness direction, i.e., it approaches the surface of the part. Thus, the crack density using the formation of the reforming layer can be raised as it approaches the surface or the rear face of the part scheduled to be divisionally cut. Accordingly, the proper divisional cutting can be further performed when pressurization is performed from both the faces as in a case for applying pressurizing force in different timing from both the faces (the surface and the rear face) of the part scheduled to be divisionally cut in the divisional cutting, etc.

According to sixth aspect of the present disclosure, a method for cutting an object includes: irradiating a laser beam on the object in order to form a plurality of reforming layers in the object along with a cutting line by multi-photon absorption effect, wherein the reforming layers are formed in a multi-layered structure manner in a thickness direction of the object; and applying a force on a first side of the object in order to cut the object from the reforming layers as a starting point of cutting. The reforming layers are disposed in a surface side reforming region and an inner side reforming region. The surface side reforming region is disposed in a surface side the object, and the inner side reforming region is disposed in an inner side of the object. The surface side reforming region has a surface side density of the reforming layers, and the inner side reforming region has an inner side density of the reforming layers, and the surface side density is larger than the inner side density.

In the above method, with respect to the number of reforming layers formed in the thickness direction of the part, the number of central side reforming layers located in the predetermined range from about the center in this thickness direction is set to be smaller than the number of center exterior pressurizing side reforming layers located on the pressurized side from the predetermined range, and the number of center exterior non-pressurizing side reforming layers located on the side opposed to the pressurized side from the predetermined range. Thus, in comparison with the central side reforming layer located in the predetermined range of about the center in the thickness direction and lying in a low range of possibility applied by pressurizing force, it is possible to concentrate the center exterior pressurizing side reforming layer and the center exterior non-pressurizing side reforming layer located in predetermined ranges except for the predetermined range and lying in a high range (both faces of the part scheduled to be divisionally cut of possibility applied by pressurizing force. Accordingly, in comparison with a case for forming the reforming layer in the thickness direction of the part scheduled to be divisionally cut as much as possible, proper divisional cutting can be performed while the number of reforming layers is reduced (a forming range of the reforming layer is reduced). Further, the proper divisional cutting can be also performed when pressurizing force is applied in different timing from both faces (the surface and the rear face) of the part scheduled to be divisionally cut and it is impossible to set that pressurizing force is applied from any one of the faces (the surface and the rear face) of the part in the divisional cutting, etc.

Alternatively, the surface side reforming region may include a first surface side reforming region and a second surface side reforming region. The first surface side reforming region is disposed on the first side of the object, and the second surface side reforming region is disposed on a second side of the object. The first surface side reforming region has a first surface side density of the reforming layers, and the second surface side reforming region has a second surface side density of the reforming layers, and the first surface side density is larger than the second surface side density. In this method, the forming number of center exterior pressurizing side reforming layers and the forming number of center exterior non-pressurizing side reforming layers are set to the forming number of center exterior pressurizing side reforming layers≧the forming number of center exterior non-pressurizing side reforming layers. Thus, the center exterior pressurizing side reforming layer and the center exterior non-pressurizing side reforming layer are symmetrically formed with respect to both the faces with the predetermined range of about the center in the thickness direction as a center. Accordingly, when pressurization is performed from both the faces as in a case for applying pressurizing force in different timing from both the faces (the surface and the rear face) of the part scheduled to be divisionally cut in the divisional cutting, etc., proper divisional cutting can be performed by setting this pressurizing force to the same degree. Further, the center exterior pressurizing side reforming layer is formed so as to be narrower or larger than the center exterior non-pressurizing side reforming layer with the predetermined range of about the center in the thickness direction as a center. Accordingly, the crack density of the center exterior pressurizing side reforming layer can be set to be higher than the crack density of the center exterior non-pressurizing side reforming layer. While the forming range of the reforming layer is correspondingly reduced, the proper divisional cutting can be performed.

According to a seventh aspect of the present disclosure, a method for dicing a semiconductor substrate includes: irradiating a laser beam on the semiconductor substrate along with a cutting line in order to form a reforming area in the substrate by multi-photon absorption effect, wherein the reforming area is formed at a focus point of the laser beam in the substrate; bonding a first side of the substrate on a sheet;

expanding the sheet with the substrate in order to cutting the substrate from the reforming area as a starting point of cutting; and controlling a strength of the laser beam in accordance with dimensions of the reforming area at the focus point and a depth of the focus point from a surface of the substrate.

In accordance with the above method, the intensity of a laser beam for forming a reforming area is controlled in accordance with the a spread from a convergent point of the reforming area and the position of a thickness direction for forming the reforming area of a semiconductor substrate. Therefore, the reforming area having a predetermined desirable spread suitable to reliably divide the semiconductor substrate can be formed at a predetermined depth in the thickness direction. Namely, the reforming area able to reliably develop a crack by small force can be formed. Therefore, it is possible to realize a manufacturing method of a semiconductor chip in which the semiconductor substrate can be reliably divided and yield of the semiconductor chip can be improved.

Alternatively, the laser beam may be controlled in such a manner that the dimensions of the reforming area disposed near the first side of the substrate are larger than the dimensions of the reforming area disposed near a second side of the substrate. The reforming area is formed at a plurality of positions in a thickness direction of the substrate. In accordance with this method, the intensity of the laser beam is controlled such that the spread from the convergent point of the reforming area formed near one substrate face becomes greater than the spread from the convergent point of the reforming area formed near the other substrate face. Therefore, the reforming area of a large spread is formed on the substrate face side set to a starting point of crack development at a dividing time of the semiconductor substrate. Accordingly, the crack can be developed by small force, and the semiconductor substrate can be reliably divided. Namely, it is possible to realize a manufacturing method of the semiconductor chip in which the semiconductor substrate can be reliably divided and yield of the semiconductor chip can be improved.

Alternatively, the laser beam may be controlled in such a manner that the dimensions of the reforming area disposed near the first side of the substrate becomes larger as it goes to a surface of the first side of the substrate, and the reforming area is formed at a plurality of positions in a thickness direction of the substrate. In this method, the intensity of the laser beam is controlled such that the spread from the convergent point of the reforming area becomes large as it is close to one substrate face. Therefore, the spread becomes large as the reforming area becomes close to the substrate face set to a starting point of the crack development. Force required in the division becomes small as the reforming area becomes close to one substrate face. Therefore, the crack can be sequentially developed and divided from the reforming area near the substrate face set to a starting point of the crack development at a dividing time of the semiconductor substrate to the reforming area near the other substrate face. Accordingly, there is no fear that a divisional defect due to deflection of the crack, etc. is caused.

Alternatively, the reforming area may be formed at a plurality of positions in a thickness direction of the substrate, and the laser beam is controlled in such a manner that the dimensions of the reforming area at each position are substantially the same. In this method, the intensity of the laser beam is controlled such that the spread from the convergent point of each reforming area becomes about the same. Therefore, the spread of the reforming area on the substrate face side set to a starting point of the crack development at the dividing time of the semiconductor substrate can be formed so as to be about the same as the spread of the reforming area near the other substrate face. Therefore, no force required to divide the semiconductor substrate is increased. Namely, the reforming area able to reliably develop the crack by small force can be formed. Therefore, it is possible to realize a manufacturing method of the semiconductor chip able to reliably divide the semiconductor substrate and improve yield of the semiconductor chip.

Alternatively, the reforming area may be formed at a plurality of positions in a thickness direction of the substrate, and the reforming area at one position does not overlap the reforming area at another position. In this method, the intensity of the laser beam is controlled such that no adjacent reforming areas communize one portion. Therefore, it is possible to prevent that a communizing portion of the adjacent reforming areas is strongly connected by re-crystallization, re-melting, etc., and no semiconductor substrate is easily divided.

Alternatively, the laser beam may have a laser power defined as LP in watt unit. The depth of the focus point is defined as D in micrometer unit. The laser beam is controlled based on a formula of LP=0.001×D+0.355. Further, the reforming area may be formed at a plurality of positions in a thickness direction of the substrate, and the reforming area disposed near the first side of the substrate is formed faster than the reforming area disposed near a second side of the substrate.

According to an eighth aspect of the present disclosure, a semiconductor chip separated from the substrate by the above method.

In the above device, when the reforming area appearing on a divisional face of the semiconductor chip is formed in a mode of the reforming area described in the above method, for example, it is possible to presume that this semiconductor chip is a semiconductor chip manufactured by the manufacturing method of the semiconductor chip when the spread from the convergent point of the reforming area is formed so as to become large as it is close to one substrate face.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method for dicing a semiconductor substrate comprising:
    forming a reforming layer in the substrate by irradiating a laser beam on a first side of the substrate;
    forming a groove on a second side of the substrate along with a dicing line; and
    applying a force to the substrate in order to dice the substrate at the reforming layer as a starting point of dicing, wherein
    the groove has a predetermined depth so that the groove is disposed near the reforming layer
    the force provides a stress at the groove,
    a distance between the groove and the reforming layer is equal to or smaller than 30 μm, and
    the groove is separated from the reforming layer,
    wherein the second side is different from the first side.

2. The method according to claim 1, wherein
    the substrate is a semiconductor wafer, and
    the substrate is diced into a plurality of chips.

3. The method according to claim 1, wherein
the groove is disposed on a first side of the substrate, and
the force is applied to the first side of the substrate toward an outer periphery of the substrate in a radial direction of the substrate.

4. The method according to claim 1, wherein
the groove is disposed on a first side of the substrate, and
the force is applied to a second side of the substrate toward an outer periphery of the substrate in a radial direction of the substrate.

5. The method according to claim 1, wherein
the forming the groove is performed before the forming a reforming layer.

6. The method according to claim 1, wherein
the forming the groove is performed after the forming a reforming layer.

7. A method for dicing an object comprising:
irradiating a laser beam on the object in order to form a plurality of reforming layers in the object along with a dicing line by multi-photon absorption effect, wherein the reforming layers are formed in a multi-layered structure manner in a thickness direction of the object; and
applying a force on a first side of the object in order to dice the object from the reforming layers as a starting point of dicing, wherein
the reforming layers are disposed in a first reforming region and a second reforming region,
the first reforming region is disposed in the first side of the object, and the second reforming region is disposed in a second side of the object,
the reforming layers in the first reforming region have a first distance between two neighboring reforming layers, and the reforming layers in the second reforming region have a second distance (Sa) between two neighboring reforming layers, and
the first distance of the first reforming region is smaller than the second distance of the second reforming region so that the reforming layers are concentratedly arranged in a range of the first side of the object.

8. The method according to claim 7, wherein
the first distance of the first reforming region becomes narrower as it approaches a surface of the first side of the object.

9. The method according to claim 7, wherein
the first reforming region includes a surface side first reforming region and an inner side first reforming region,
the surface side first reforming region is disposed on a surface side of the first side of the object, and the inner side first reforming region is disposed on an inner side of the first side of the object,
the reforming layers in the surface side first reforming region have a surface side first distance between two neighboring reforming layers, and the reforming layers in the inner side first reforming region have an inner side first distance between two neighboring reforming layers, and
the surface side first distance of the surface side first reforming region is smaller than the inner side first distance of the inner side first reforming region.

10. A method for dicing an object comprising:
irradiating a laser beam on the object in order to form a plurality of reforming layers in the object along with a dicing line by multi-photon absorption effect, wherein the reforming layers are formed in a multi-layered structure manner in a thickness direction of the object; and
applying a force on a first side of the object in order to dice the object from the reforming layers as a starting point of dicing, wherein
the reforming layers are disposed in a first reforming region and a second reforming region,
the first reforming region is disposed in the first side of the object, and the second reforming region is disposed in a second side of the object,
the first reforming region includes a first number of the reforming layers, and the second reforming region includes a second number of the reforming layers, and
the first number is larger than the second number so that the reforming layers are concentratedly arranged in a range of the first side of the object.

11. The method according to claim 10, wherein
the reforming layers in the first reforming region becomes dense as it approaches a surface of the first side of the object.

12. The method according to claim 10, wherein
the first reforming region includes a surface side first reforming region and an inner side first reforming region,
the surface side first reforming region is disposed on a surface side of the first side of the object, and the inner side first reforming region is disposed on an inner side of the first side of the object,
the surface side first reforming region has a surface side density of the reforming layers, and the inner side first reforming region has an inner side density of the reforming layers, and
the surface side density is larger than the inner side density.

13. A method for dicing an object comprising:
irradiating a laser beam on the object in order to form a plurality of reforming layers in the object along with a dicing line by multi-photon absorption effect, wherein the reforming layers are formed in a multi-layered structure manner in a thickness direction of the object; and
applying a force on a first side of the object in order to dice the object from the reforming layers as a starting point of dicing, wherein
the reforming layers are disposed in a surface side reforming region and an inner side reforming region,
the surface side reforming region is disposed in a surface side of the object, and the inner side reforming region is disposed in an inner side of the object,
the reforming layers in the surface side reforming region have a surface side distance between two neighboring reforming layers, and the reforming layers in the inner side reforming region have an inner side distance between two neighboring reforming layers, and
the surface side distance of the surface side reforming region is smaller than the inner side distance of the inner side reforming region so that the reforming layers are concentratedly arranged in the surface side reforming region of the object.

14. The method according to claim 13, wherein
the surface side reforming region includes a first surface side reforming region and a second surface side reforming region,
the first surface side reforming region is disposed on the first side of the object, and the second surface side reforming region is disposed on a second side of the object,
the reforming layers in the first surface side reforming region have a first surface side distance between two neighboring reforming layers, and the reforming layers in the second surface side reforming region have a second surface side distance between two neighboring reforming layers, and the first surface side distance is equal to or smaller than the second surface side distance.

15. A method for dicing an object comprising:

irradiating a laser beam on the object in order to form a plurality of reforming layers in the object along with a dicing line by multi-photon absorption effect, wherein the reforming layers are formed in a multi-layered structure manner in a thickness direction of the object; and applying a force on a first side of the object in order to dice the object from the reforming layers as a starting point of dicing, wherein the reforming layers are disposed in a surface side reforming region and an inner side reforming region, the surface side reforming region is disposed in a surface side the object, and the inner side reforming region is disposed in an inner side of the object, the surface side reforming region has a surface side density of the reforming layers, and the inner side reforming region has an inner side density of the reforming layers, and the surface side density is larger than the inner side density so that the reforming layers are concentratedly arranged in the surface side reforming region of the object.

16. The method according to claim 15, wherein the surface side reforming region includes a first surface side reforming region and a second surface side reforming region, the first surface side reforming region is disposed on the first side of the object, and the second surface side reforming region is disposed on a second side of the object, the first surface side reforming region has a first surface side density of the reforming layers, and the second surface side reforming region has a second surface side density of the reforming layers, and the first surface side density is larger than the second surface side density.

17. A method for dicing a semiconductor substrate comprising:

irradiating a laser beam on the semiconductor substrate along with a dicing line in order to form a reforming area in the substrate by multi-photon absorption effect, wherein the reforming area is formed at a focus point of the laser beam in the substrate;

bonding a first side of the substrate on a sheet;

expanding the sheet with the substrate in order to dicing the substrate from the reforming area as a starting point of dicing; and controlling a strength of the laser beam in accordance with dimensions of the reforming area at the focus point and a depth of the focus point from a surface of the substrate, wherein the laser beam is controlled in such a manner that the dimensions of the reforming area disposed near the first side of the substrate are larger than the dimensions of the reforming area disposed near a second side of the substrate so that the reforming layer having the large dimensions is formed near the first side of the substrate, the reforming area is formed at a plurality of positions in a thickness direction of the substrate, the laser beam has a laser power defined as LP in watt unit, the depth of the focus point is defined as D in micrometer unit, and the laser beam is controlled based on a formula of $LP=0.001 \times D+0.355$.

18. The method according to claim 17, wherein the laser beam is controlled in such a manner that the dimensions of the reforming area disposed near the first side of the substrate becomes larger as it goes to a surface of the first side of the substrate, and the reforming area is formed at a plurality of positions in a thickness direction of the substrate.

19. The method according to claim 17, wherein the reforming area is formed at a plurality of positions in a thickness direction of the substrate, and the laser beam is controlled in such a manner that the dimensions of the reforming area at each position are substantially the same.

20. The method according to claim 17, wherein the reforming area is formed at a plurality of positions in a thickness direction of the substrate, and the reforming area at one position does not overlap the reforming area at another position.

21. The method according to claim 17, wherein the reforming area is formed at a plurality of positions in a thickness direction of the substrate, and the reforming area disposed near the first side of the substrate is formed faster than the reforming area disposed near a second side of the substrate.

* * * * *